(12) United States Patent
Sakamoto et al.

(10) Patent No.: US 6,498,368 B2
(45) Date of Patent: Dec. 24, 2002

(54) POWER SEMICONDUCTOR DEVICE

(75) Inventors: Kozo Sakamoto, Hitachinaka (JP); Yosuke Inoue, Tokai-mura (JP); Akihiro Miyauchi, Hitachi (JP); Masaki Shiraishi, Hitachi (JP); Mutsuhiro Mori, Mito (JP); Atsuo Watanabe, Hitachiota (JP); Takasumi Ohyanagi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 17 days.

(21) Appl. No.: 09/733,098

(22) Filed: Dec. 11, 2000

(65) Prior Publication Data
US 2001/0005031 A1 Jun. 28, 2001

(30) Foreign Application Priority Data
Dec. 9, 1999 (JP) ............................................. 11-349785

(51) Int. Cl.[7] ...................... H01L 31/119; H01L 29/76; H01L 29/94; H01L 31/062; H01L 31/113
(52) U.S. Cl. ........................ 257/341; 257/345; 257/401
(58) Field of Search ................................ 257/341, 345, 257/401, 404

(56) References Cited

U.S. PATENT DOCUMENTS

| | | |
|---|---|---|
| 4,065,742 A | 12/1977 | Kendall et al. |
| 4,268,848 A | 5/1981 | Casey et al. |
| 5,216,275 A | 6/1993 | Chen |
| 5,438,215 A | 8/1995 | Tihanyi |
| 6,326,656 B1 * | 12/2001 | Tihanyi ...................... 257/288 |
| 6,344,379 B1 * | 2/2002 | Venkatraman et al. ...... 438/192 |

FOREIGN PATENT DOCUMENTS

| | | |
|---|---|---|
| EP | 0354449 | 8/1989 |
| GB | 2309336 | 7/1997 |

* cited by examiner

*Primary Examiner*—Ngân V. Ngô
(74) *Attorney, Agent, or Firm*—Antonelli, Terry, Stout & Kraus, LLP

(57) ABSTRACT

In a semiconductor device having a first terminal 101 (source terminal) and a second terminal 102 (drain terminal), the substrate main surface of a semiconductor chip is on the (110) face, the main contact face of an n-type region 2 and a p-type region 4 is the {111} face perpendicular to the (110) face, elongated n-type regions 2 and elongated p-type regions 4, which are arranged alternately, form a voltage holding area. The first terminal 101 is connected to the p-type regions through wiring, and the second terminal 102 is connected to the n-type regions 2. Also, the p-type region is formed to cover the bottom comers of a gate polycrystalline silicon layer 8.

9 Claims, 40 Drawing Sheets

FIG. 3(a)
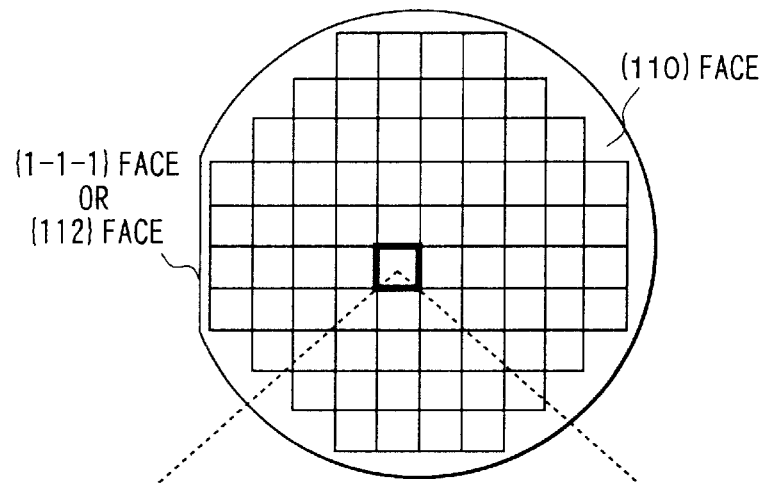
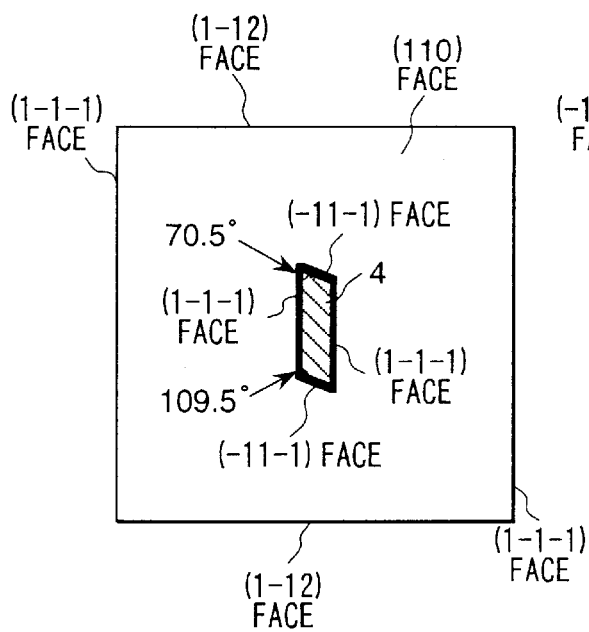
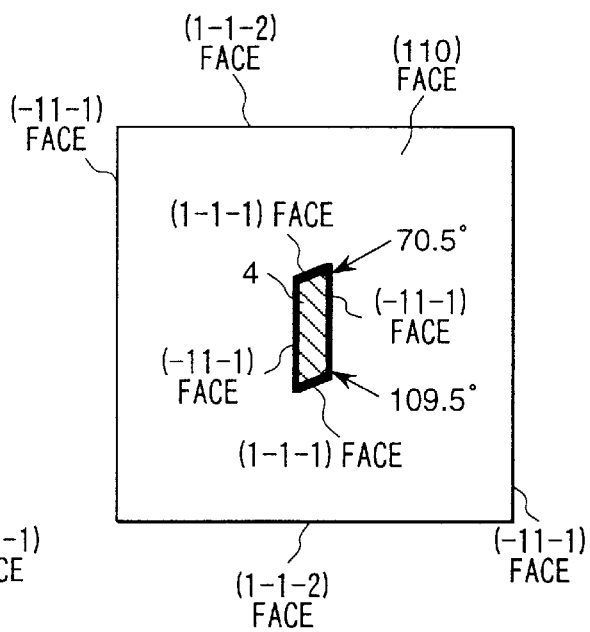

POWER SEMICONDUCTOR DEVICE

BACKGROUND OF THE INVENTION

In known semiconductor devices, in cases where the terminals of the main current path are used as first and second terminals to give the semiconductor devices a high withstanding-voltage, it is necessary to form a depletion layer so that the strength of an electric field generated inside of the semiconductor element, when a voltage is impressed between the first terminal and the second terminal, becomes lower than the critical strength, resulting in avalanche breakdown. To this end, it is necessary to make the specific resistance of a drift layer area high and to form the drift layer area so that the length thereof in the voltage drop direction is large, so that the depletion layer can easily spread when a voltage is applied between the first and second terminals. Therefore, there is a problem that the resistance between the first terminal and the second terminal raises rapidly as the withstanding-voltage between the first terminal and the second terminal is made higher.

Japanese Patent Prepublication No. 54661/1990 discloses a semiconductor device in which the semiconductor main body has a plurality of n-type first regions, between which a p-type second region is sandwiched. The length of these first and second regions in the direction perpendicular to their thickness is made to have a value sufficient to carry a voltage over 100V along the semiconductor main body when a free charge carrier was eliminated, and an electrically parallel current path is formed which extends through the semiconductor main body. The values of the thickness and doping density of each of the first and second regions are selected so that the space-charge per unit area of each of positive and negative alternately arranged space-charge regions formed by the first and second regions becomes lower than the critical strength, resulting in avalanche breakdown.

Further, in the above-mentioned Japanese Patent Prepublication No. 54661/1990, a semiconductor device is also disclosed in which, in order to form said first and second regions, a high resistance p-type epitaxial layer is grown on a low ohmic n-type substrate having a main surface axial direction of [110], and etching is performed until reaching the substrate by using anisotropic etching. A groove is formed having sheer side faces in the epitaxial layer, and then an n-type epitaxial layer is formed, and this n-type epitaxial layer is used as said first regions and said high resistance p-type epitaxial layer is used as said second regions. Although in the above-mentioned Japanese Patent Prepublication No. 54661/1990 there is a description indicating that anisotropic etching is applied to the (110) face, and thereby the repeated pattern of n-type and p-type regions can be formed, no planar structure suitable for low loss is discussed. Also, in the case of the semiconductor elements in the above-mentioned Japanese Patent Prepublication No. 54661/1990, since it is impossible to make the repeated pattern of the n-type and p-type regions narrow, there is the problem that it is impossible to make the electric power consumed in the semiconductor element; and, further, because of the existence of said repeated pattern, there is the problem that the inter-drain/source capacitance of a power MOS FET, for example, becomes large.

In U.S. Pat. No. 5,438,215 and U.S. Pat. No. 5,216,275, there is disclosed a planer structure suitable to provide a semiconductor device best suited to a high withstanding-voltage and low loss. However, in U.S. Pat. No. 5,438,215 and U.S. Pat. No. 5,216,275, there is no description relating to the planer structure suitable for the case where the (110) face is used as the semiconductor substrate.

Japanese Patent Prepublication No. 223896/1998 proposes a method for ion implantation into the side faces of etched silicon grooves, as a method of manufacture of a semiconductor device simultaneously achieving low loss and a high withstanding-voltage. However, although Japanese Patent Prepublication No. 54661/1998 describes an approach for making the pitch of the repeated pattern of the n-type and p-type regions narrow, this structure is in effect unsuitable for production.

German Patent No. 19730759 discloses a structure in which said p-type second regions are separated from the body diffusion layer of a MOS FET. In the technique disclosed in this German Patent No. 19730759, in order to obtain a device structure suitable for a high withstanding-voltage and a low loss, there is a need for an improvement.

SUMMARY OF THE INVENTION

The semiconductor device according to this invention comprises a voltage holding area in which, within the semiconductor chip, first regions of a first conduction type having an elongated shape and second regions of a second conduction type having a similar shape are arranged alternately and adjacently. The first regions are connected to a second terminal and the second regions are connected to a first terminal. When a voltage is applied between the first and second terminals and current flow is obstructed, positive and negative space-charge regions are alternately arranged in the voltage holding area formed by the first and second regions. In this case, the first and second conduction are the p-type or the n-type, respectively, which are opposite conduction types. Furthermore, the semiconductor device according to this invention can have one construction selected from the following descriptions A to E:

A. A device in which the substrate main surface of the semiconductor chip is positioned on the (110) face and a couple of opposed side edges of four side edges of the semiconductor chip are positioned on the {111 } face, which is perpendicular to the (110) face, and the first and second regions extend in an elongated fashion in the [110] axis direction.

B. A device in which the substrate main surface of the semiconductor chip is positioned on the (110) face, and the first and second regions extend in an elongated fashion in the [110] axis direction, with the main contact face positioned on the {111 } face perpendicular to (110) face.

C. A device in which a third regions of the first conduction type are formed at the periphery of the voltage holding area, said third regions having a higher mean impurity concentration than that of the first regions.

D. The semiconductor device is an insulated gate type semiconductor device of which channel region is separated from the second regions.

E. The semiconductor device is an insulated gate type semiconductor device of a trench gate type, which the spacing between the trench gates is shorter than the spacing between the second regions.

A method of manufacturing a semiconductor device having the construction A or B, according to this invention includes the following steps F or G:

F. A step of forming a groove in the silicon semiconductor chip with an anisotropic etching liquid by using as a mask a polygon pattern composed of four main sides intersecting at the angle of 70.5°±5° or 109.5°±5°, and a step of filling the formed groove with a silicon layer.

G. A step of forming a groove in said silicon semiconductor chip with an isotropic etching liquid by using a photo mask formed along the (-11-1) face or the (-11-1) face on which a couple of opposed side edges out of four side edges of said semiconductor chip are positioned, and a step of filling the formed groove with a silicon layer.

In accordance with this invention, the voltage holding area can be formed with high precision, or it is possible to improve the voltage holding function of the voltage holding area at the time when current flow is obstructed. Therefore, it is possible to achieve a semiconductor device with a high withstanding-voltage and/or a low loss function.

BRIEF DESCRIPTION OF THE DRAWINGS

FIG. 3(a) is a plan diagram of the semiconductor wafer on which the power MOS FET of Embodiment 1 is formed;

FIG. 3(b) is an explanatory diagram of the case where the main flat surface of the semiconductor wafer is on the (1-1-1) face or (1-12) face in Embodiment 1;

FIG. 3(c) is an explanatory view of the case where the main flat surface of the semiconductor wafer is on the (-11-1) face or (1-1-2) face in Embodiment 1;

PREFERRED EMBODIMENTS

Hereinafter, embodiments of the semiconductor devices according to this invention will be explained in detail with reference to the attached drawings.

Incidentally, in this specification, crystalline faces are written with Miller indices, and a bar code for expressing the index in the negative direction is replaced by a minus code. Also, {} shows faces which have an equivalent symmetric property as usually expressed; for example, {111} shows all of the faces, (111), (-1-1-1), (11-1), (1-11), (-111), (1-1-1), (-11-1), and (-1-11). [] shows an intra-crystalline direction;

for example, the [11-0] axis represents the axis perpendicular to the (110) face. Also, for the sake of easy understanding for explanation, there is no distinction in notation in a case where the same face is seen from the top and from the back, like the (1-1-1) and (-111) faces.

Embodiment 1

Figure 1:
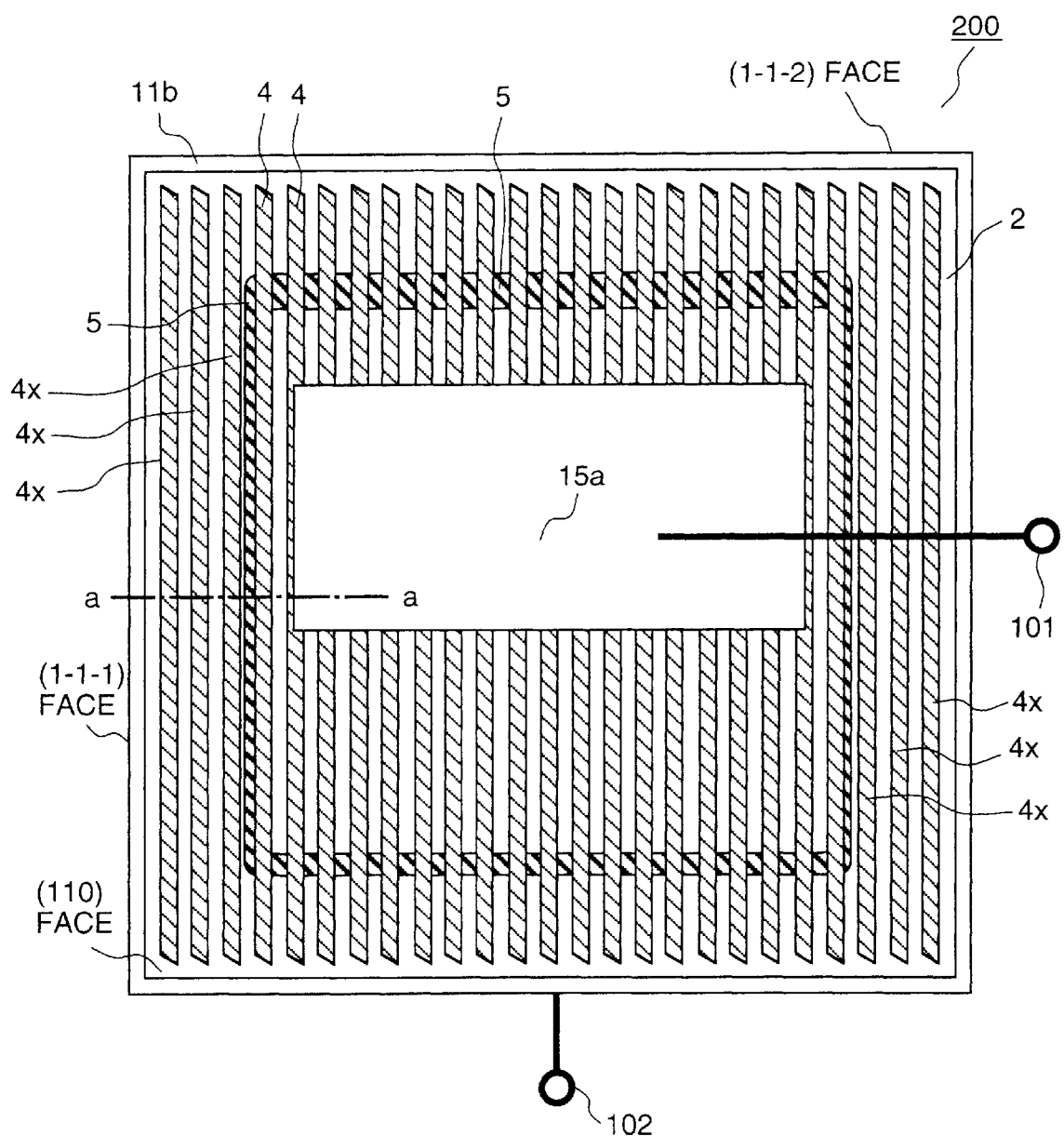
FIG. 1 is a plan view of the semiconductor device of Embodiment 1.
Figure 2:
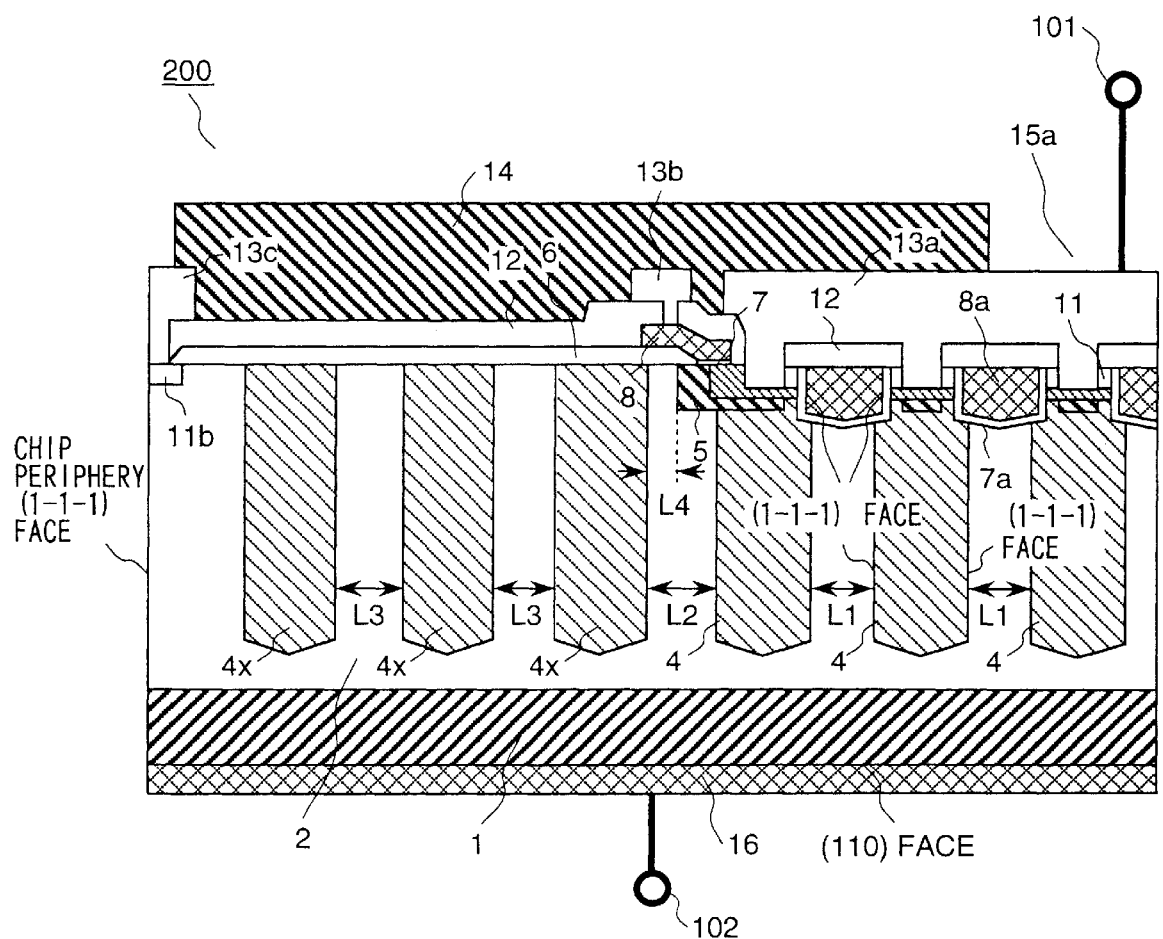
FIG. 2 shows an example in which Embodiment 1 is applied to a power MOS FET, and is a sectional view taken along line a—a in FIG. 1.

FIG. 1 is a plan view of the semiconductor device according to an embodiment of this invention; FIG. 2 is a longitudinal sectional view taken the along a—a line in FIG. 1, in a case where the semiconductor device according to the first embodiment of this invention is a power MOS FET; and FIGS. 3(a) to 3(c) and FIGS. 4(a) to 4(i) show one example of a method of manufacture of the present semiconductor device.

In FIG. 1, the present semiconductor device is provided as by a semiconductor device having means for obstructing current flow between a first terminal (in FIG. 2, a source terminal) 101 and a second terminal (in FIG. 2, a drain terminal) 102 by forming a depletion layer extending through a part of a silicon semiconductor chip 200, when a voltage is applied between the first terminal 101 and the second terminal 102. The substrate main surface of the silicon semiconductor chip 200 is formed with the (110) crystalline face, and at the central portion of the silicon semiconductor chip 200, a voltage holding area is provided comprising elongated n-type regions 2 electrically connected to the second terminal 102 and elongated p-type regions 4 electrically connected to the first terminal 101 which are disposed alternately with respect to the n-type regions 2, said n-type and p-type regions 2 and 4 extending in the [110] axis direction forming as the main contact face the {111} crystalline face perpendicular to the (110) crystalline face. The first terminal 101 is connected to an electrode taking-out region 15a of aluminum or the like positioned on the semiconductor main surface, through conductive wiring such as a bonding wire, etc., and further the electrode taking-out region 15a is connected to the p-type regions 4 via wiring. On the other hand, the second terminal 102 is connected to the n-type regions 2 by the connection to a back face electrode 16, through a conductive region of a header or the like.

When current flow between the first terminal 101 and the second terminal 102 is obstructed, positive and negative alternately arranged space-charge regions are formed in the voltage holding area comprised of the n-type areas 2 and the p-type areas 4, and more than half of the voltage applied between the first terminal 101 and the second terminal 102 is carried by the positive and negative space-charge regions formed in the voltage holding area, whereby the current flow between the first terminal 101 and the second terminal 102 is obstructed. On the other hand, during the conductive mode in which current flows between the first terminal 101 and the second terminal 102, the main current flow is through the p-type regions 2 constituting the voltage holding area in the direction perpendicular to the semiconductor main face.

Also, in FIG. 1, by extending the p-type regions 4 which are in an active area in the vertical direction in the figure at the peripheral portions of the voltage holding area, the prevention of degradation of the withstanding voltage relative to the peripheral portions in the vertical direction on the basis of the same principal as in the active area is intended. Also, field limiting regions 4x are formed at the left and right peripheral positions of the figure, extending in parallel with respect to the p-type regions 4 and which are formed by the same manufacturing processes as in the p-type regions 4. This prevents the withstanding voltage between the first terminal 101 and the second terminal 102 from considerably decreasing due to the electric field concentration on the semiconductor surface at the peripheral portions of the semiconductor chip 200.

Therefore, in accordance with this embodiment, by forming the repeated strip pattern of the pn junction comprising the p-type regions 4, 4x and the n-type regions 2 so that they extend in the same direction in the plain and elongated manner, a high withstanding-voltage arrangement of the elements including the peripheral portions is achieved as a characteristic feature. In this embodiment, the distance between the p-type regions 4, 4x and the peripheral portions of the semiconductor chip is selected to have a value of not more than 50 micro-meter. Incidentally, although in this embodiment the case where the p-type regions 4, 4x are arranged as stripe regions having their length equal to the plane size of the semiconductor chip, it may be a planar structure in which division is performed by the n-type regions at various positions. In this case, it is possible to forefend a tendency for the n-type regions 2 to be damaged when grooves 3 are formed in regions becoming the p-type regions 4, 4x (refer to after-mentioned Process in FIG. 4(a)). In other words, the total of the plain areas of the stripe-like pn junctions comprising the n-type regions 2 and the p-type regions 4, 4x constituting the voltage holding area is formed so that it occupies over 95% of the semiconductor chip area.

In view of the limitation of available space in the drawing, the field limiting areas are each shown as comprising 3 p-type regions 4x, but the number thereof may be increased or decreased depending upon the withstanding voltage, as needed. Further, an n-type region 11b is provided around the periphery of the semiconductor chip to suppress the elongation of the depletion layers which form the p-type regions 4, 4x.

In order to explain the construction of this invention in detail, a sample of a power MOS FET as an embodiment of the semiconductor element according to this invention will be explained. FIG. 2 shows a longitudinal sectional view taken along a—a line in FIG. 1. The power MOS FET of this embodiment has a strip geometry in which elongated polycrystalline silicon gates 8a are formed on the n-type diffusion layers 2 between the adjacent p-type diffusion layers 4 in FIG. 1. When a voltage of 0 volt is applied to the gates 8a of the polycrystalline silicon and the source terminal 101, and a positive voltage is applied to the drain terminal, which is the second terminal 102, with respect to the source terminal, which is the first terminal 101, positive and negative alternately arranged space charge regions are formed in the voltage holding area in which the n-type regions 2 and the p-type regions 4 are alternately and adjacently arranged, whereby the current flow is obstructed. At that time, the p-type regions 2, each sandwiched between adjacent p-type regions 4 of the voltage holding area, have a higher impurity concentration than that in the drift area of the conventional power MOS FET. However, since the pitches between the p-type regions 4 and the n-type regions sandwiched by the adjacent p-type regions are made so small that the p-type regions 4 and the sandwiched n-type regions 2 are entirely depleted before the electric field between the p-type regions 4 and the n-type regions 2 reaches the critical electric field of silicon, the withstanding-voltage degradation between the drain and the source is avoided even though the impurity concentration is high. On the other hand, when a positive voltage is applied to the gates 8a, it provides a conductive mode in which a current flows from the drain terminal 102 to the source terminal 101. However, in this case, since the current flows through the n-type regions 2 in which the impurity concentration is high as compared to the conventional power MOS FET, it is possible to make the ON resistance low as compared to the prior art device. The net impurity amount obtained by integration in the perpendicular direction to the junctions of the repeated pattern of n-type regions 2 and p-type regions 4 constituting the voltage holding area, so as to provide both characteristic features of a high withstanding voltage and a low loss, is preferably set to a value between $5\times10^{11}/cm^2$ and $2\times10^{13}/cm^2$ or below this value. Incidentally, the depth of the voltage holding area constituted by the alternate and adjacent arrangement of the p-type regions 2 and the n-type regions 4 can be made large since it is formed substantially perpendicularly to the silicon substrate in accordance with the manufacturing method of this invention, which will be explained in detail hereinafter. Thus, it is possible to easily manufacture a high withstanding-voltage element. Also, the main bottom plane of the p-type regions 4 constituting the voltage holding area has a downwardly convex shape by the appearance of a face rather than the (110) face.

Next, an example of the method of manufacturing the semiconductor device according to this invention will be explained by using as a sample a power MOS FET having a drain withstanding voltage on the order of 600V, with reference to FIGS. 3(*a*) to 3(*c*) and FIGS. 4(*a*) to 4(*c*).

As shown in the sectional view in FIG. 4(*a*), the semiconductor main surface is formed on the (110) face. Then, on a high density n-type silicon substrate 1 of about 5 mΩcm, formed by doping an n-type impurity, such as arsenic, antimony or the like, an n-type epitaxial layer 2 is formed having a thickness of approximately 45 µm and a resistance value on the order of 0.5 Ωcm to 15 Ωcm. Thereafter, surface oxide films 20*a* and 20*b* are formed, and then patterning on the oxide film 20*a* is performed by using as a photo resist a parallelogram having its main sides on the (1-1-1) and (-11-1) faces, as shown in FIG. 1.

Now, the layout design of the semiconductor chip of the present semiconductor device becomes easy if the semiconductor main surface is on the (110) face, as shown in the plan view of FIG. 3(*a*), and at least one set of opposite sides of the boundary of the voltage holding area is parallel with the side edges of the silicon chip. For this purpose, one set of side edges, which are opposite among four side edges of the semiconductor chip, is provided on the {111} face, which is perpendicular to the (110) face. That is, the side edges are provided on the (1-1-1) and (1-12) faces as shown in FIG. 3(*b*) or the (-11-1) and (1-1-2) as shown in FIG. 3(*c*). Therefore, it is preferable that the main flat face, which is the matching angular measure of a wafer in a case where semiconductor devices are manufactured is on the {111} or {112} face which is orthogonal to the (110) face. In case where the (1-1-1) or (1-12) face is made the main flat face, it is preferable to layout the boundary of the voltage holding area so that one of the main boundary lines of the mask pattern for the voltage holding area is parallel to the side face of the (-11-1) face of the semiconductor chip. Further, in order to form a silicon etching groove having four main side faces perpendicular to the (110) face, a closed loop having as the other set of main sides the lines intersecting at 70.5° or 109.5° with said main boundary lines and having these two sets of boundaries, as the main boundaries is designed as a reference mask defining the p-type regions 4 and the n-type regions 2 which constitute the voltage holding area. As a result, the junctions of the n-type regions 2 and the p-type regions 4 are formed in a closed loop, including the {111} face perpendicular to the (110) face.

Incidentally, although in FIG. 1, FIG. 2 and FIGS. 4(*a*) to 4(*i*) show an embodiment in which the main flat face of the semiconductor wafer is located the (1-1-1) face and the side edges of the semiconductor chip are located at the (1-1-1) face and the (1-12) face, in a case where the main flat face is located at the (-11-1) face, the (1-12) face or the (1-1-2) face, the characteristic by which the sectional structure can be obtained is the same, although the directions of the four plane patterns of which the height becomes the main face are changed as shown in FIGS. 3(*a*) to 3(*c*).

Next, by masking the oxide film 20*a* and using a solution having a high isotropic etching property, such as potassium hydrate or the like, the silicon etching grooves 3 are formed. In this way, the etching in the [110] axis is carried out with minimum side etching for the oxide film 20*a* used as the mask. As a result, the (1-1-1)face or the (-11-1) face, which is substantially perpendicular to the (110) substrate, are provided as the main side edges of the silicon etching grooves 3.

Now, the patterning of the oxide film 20*a* is performed by dry etching or wet etching with the condition that the resist is attached also to the back, so that the oxide film 20*b* of the back, which is formed at the same time in the forming process of the oxide film 20*a*, and the oxide film at the side faces of the silicon wafer are not etched. By this, in said silicon etching process, any echoing of places against which it must be prohibited, such as the peripheral portions and back of the silicon wafer, can be avoided so as not to create etching damage which would cause the silicon wafer to be harmed.

Also, the amount of the side etching increases depending upon the magnitude of the shift of the intersection angle between the photo-mask pattern and the silicon face, and so, if it is large, it will not be possible to obtain a deep silicon etching groove. So, the error in the angle of the mask and main flat, etc. as explained in this application is hopefully below 0.2°, and realistically an accuracy is needed which is sufficiently higher than ±5°.

However, in case as shown in FIG. 1, where the p-type regions 4 and the n-type regions 2 are provided in the form of an elongated stripe repeated pattern, although the mask for the silicon etching grooves 3 must especially provide a high-precision long side which is parallel with the (1-1-1) face as mentioned above among the main four sides, the short side may be in a right-angle direction to provide an easy layout. In this case, on the side face of this short, side the {111 } face which is not perpendicular to the substrate appears and the silicon groove which is in the vicinity of this short side becomes shallow; however, if the area in which this silicon groove becomes shallow is sufficiently short compared to the length in the long side direction, a deep silicon groove is formed in the main portion of the stripe.

Next, as shown in the sectional view in FIG. 4(*b*), the oxide films 20*a* and 20*b* are removed, and then a P-type epitaxial layer 4 having a resistivity of approximately 0.5 °cm to 15 °cm is deposited to about 3 µm; and, at that time, the etching grooves 3 are filled up.

Next, as shown in the sectional view of FIG. 4(*c*), the p-type epitaxial layer 4 is etched until the n-type epitaxial layer 2 is exposed. In this case, the control of the amount of etching for flattening is performed as follows. A portion or the entire surface of the oxide film 20*a* shown in FIG. 4(*a*) is saved by patterning to be used as a mask for the silicon etching, and, thereafter, the p-type epitaxial layer is silicon-etched using said oxide film pattern as a reference. Incidentally, it is preferable that the amount of flow of hydrogen chloride (HCl) is optimized during the growth process of the p-type epitaxial layer 4 shown in FIG. 4(b) and selective epitaxial growth from the bottom of the etching groove 3 is carried out. It is because it becomes hard that cavities are formed within the p-type epitaxial layer 4, whereby no withstanding-voltage deterioration occurs in the p-type epitaxial layer 4. Also, it is possible to eliminate an etchback process in which the p-type epitaxial layer 4 is etched until the n-type epitaxial layer 2 appears.

The resistance value and pitch repetition are selected so that the amount of net impurity provided by integration in the vertical direction with respect to the junction face of the n-type region and p-type region for the voltage holding area is together approximately in the order of $1 \times 10^{12}/cm^2$ or below it, thereby forming complete depletion in the current blocking mode. This achieves a high withstanding-voltage and a low ON resistance.

Figure 4A:
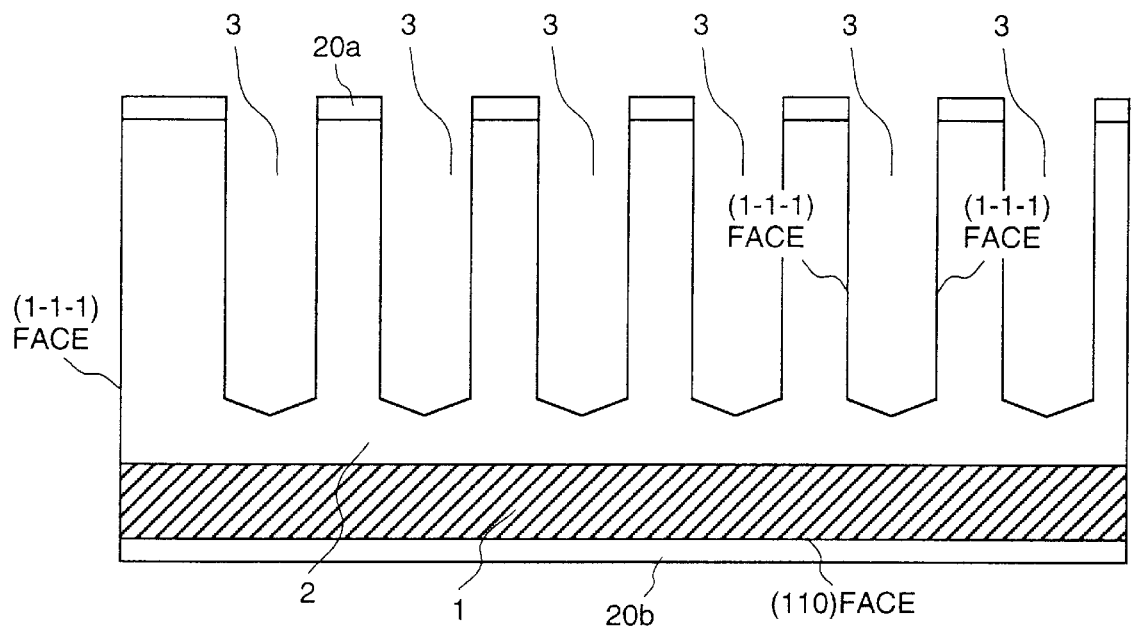
FIG. 4(a) and FIG. 4(b) are sectional views illustrating a method of manufacture of the semiconductor device of Embodiment 1.
Figure 4B:
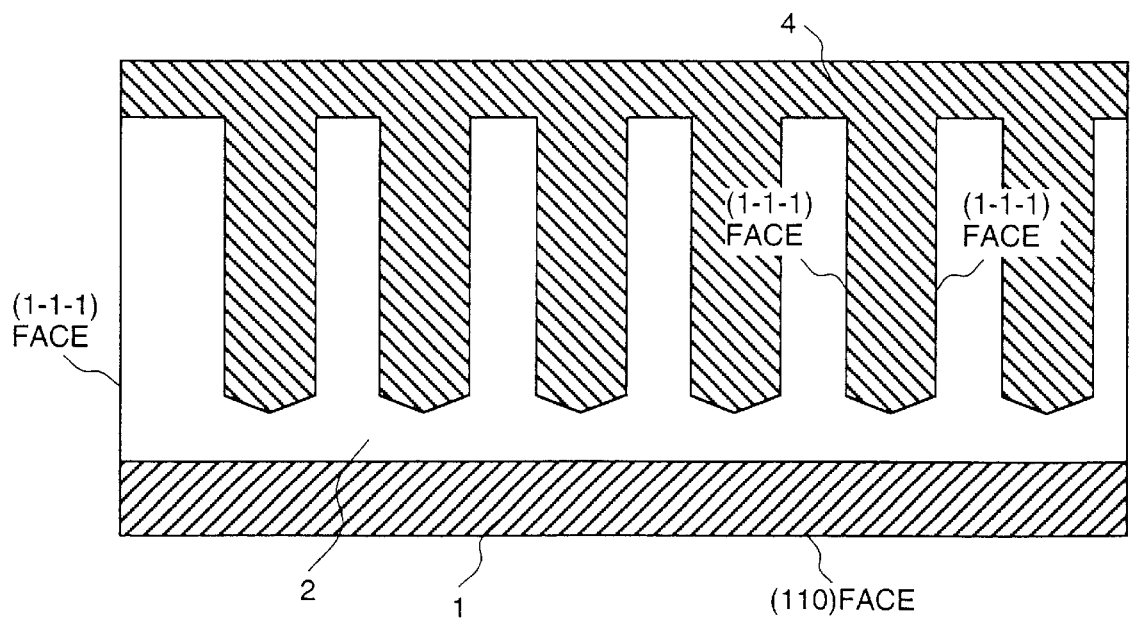
Figure 4C:
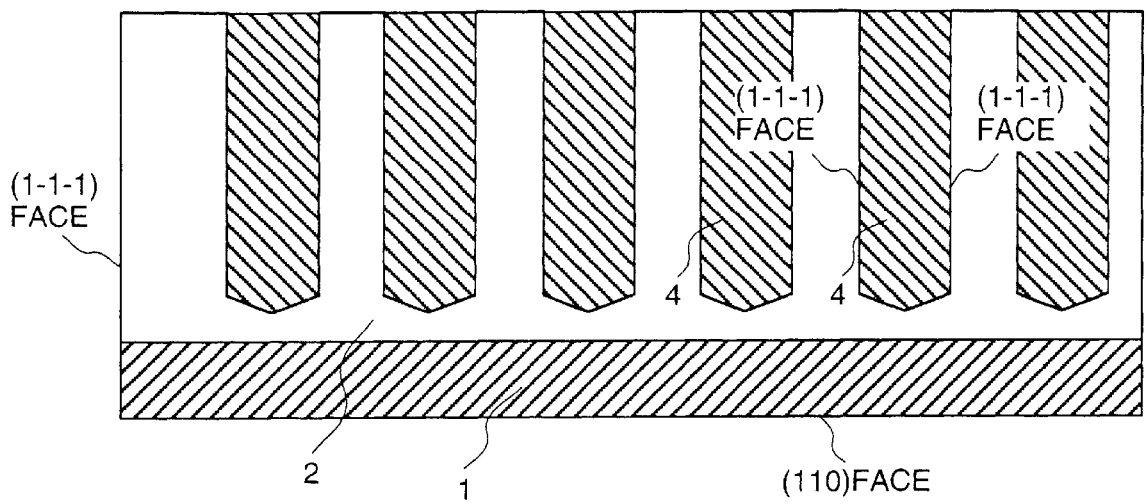
FIG. 4(c) and FIG.(d) are sectional views illustrating a method of manufacture the semiconductor device of Embodiment 1.
Figure 4D:
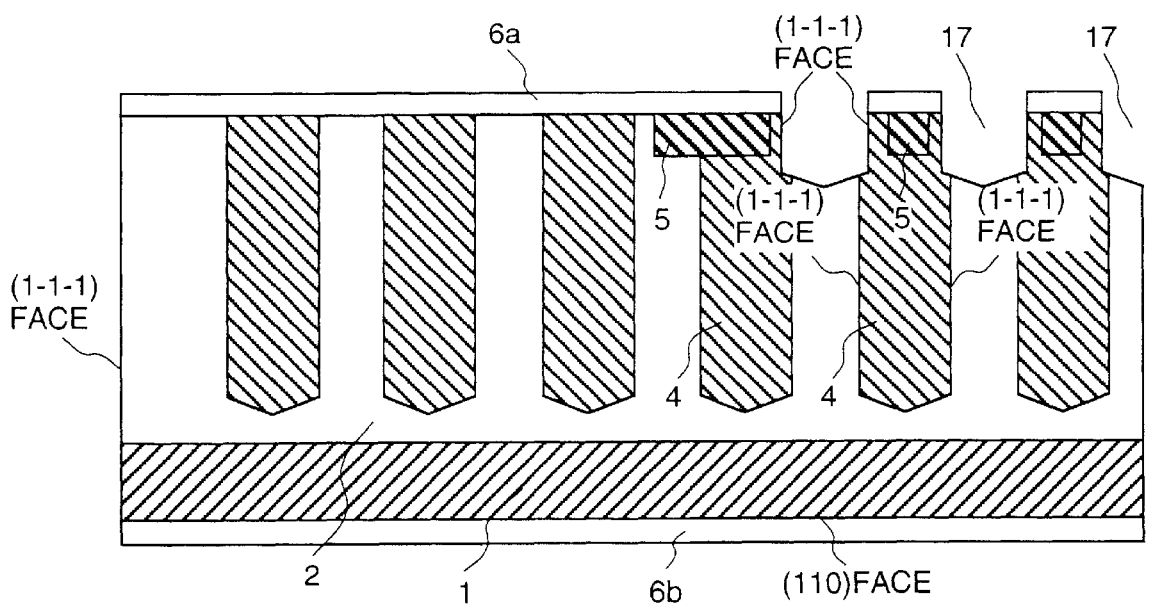
FIG. 4(e) and FIG.(f) are sectional views illustrating a method of manufacture of the semiconductor device of Embodiment 1.
FIG. 4(g) and FIG.(h) are sectional views illustrating a method of manufacture of the semiconductor device of Embodiment 1.
FIG. 4(i) is a sectional view illustrating a method of manufacture of the semiconductor device of Embodiment 1.

Next, as shown in FIG. 4(d), boron of about $2 \times 10^{13}/cm^2$ is ion-implanted to form a p-type diffusion layer 5 having a depth of about 2 $\mu$m, and, thereafter, second silicon etching grooves 17 are formed using the oxide films 6a and 6b as masks, and again using an isotropic etching solution, such as potassium hydroxide (KOH), etc. Like the formation of said silicon etching grooves 3, the etching is carried out using a mask laid out so that the main boundary line of the mask pattern is positioned on the {111} face perpendicular to the (110) face, that is, the (1-1-1) face or (-11-1) face. Thus, in the case of silicon, a polygonal pattern having four main sides intersecting at 70.5°±5° or 109.5°±5° is used as the mask. The reason why the etching grooves 17 are formed while leaving the rear oxide film 6b is the same as in the case where the etching grooves 3 were formed.

Figure 4E:
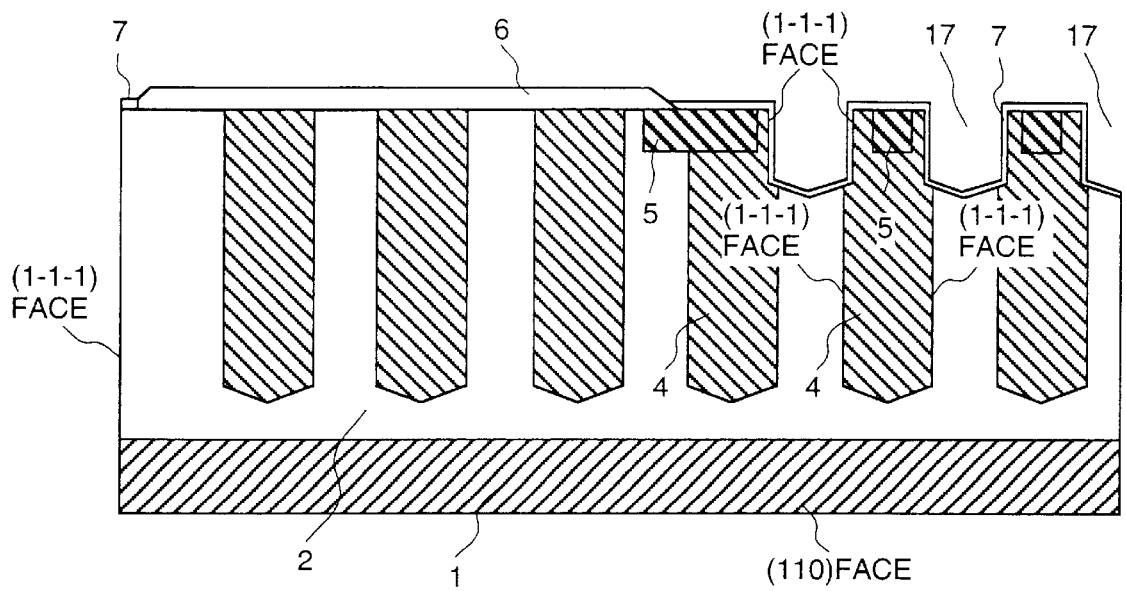

Next, as shown in FIG. 4(e), the oxide film 6 is etched, leaving an area which becomes a field oxide film, and by performing gate oxidation, an oxide film 7 of about 50 nm is formed.

Figure 4F:
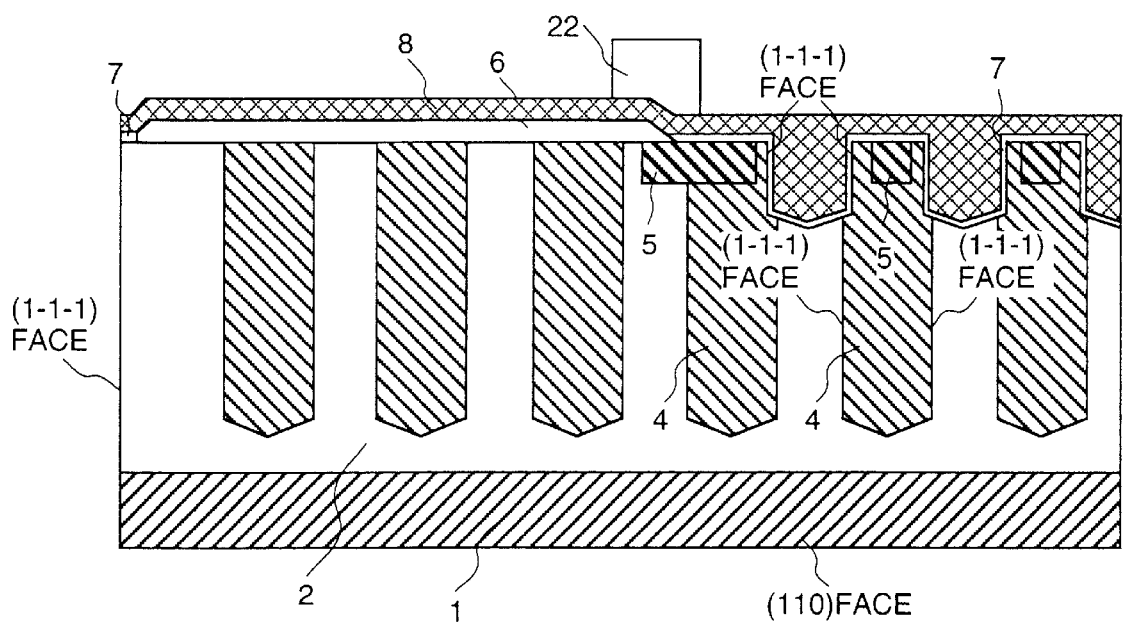
Figure 4G:
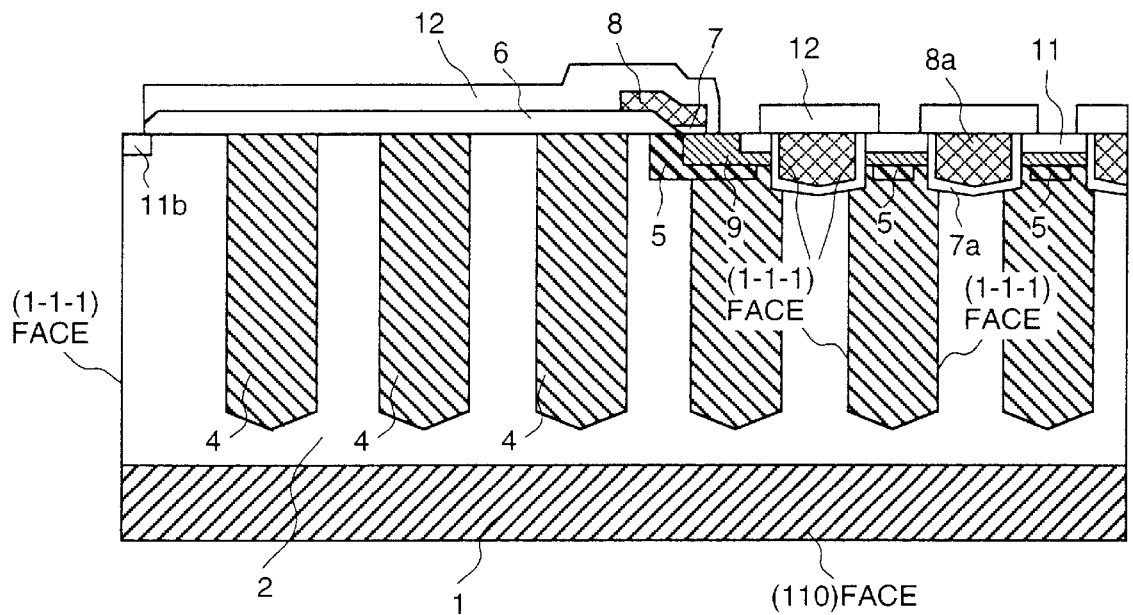

Next, as shown in FIG. 4(f), a polycrystalline silicon layer 8 having a thickness of about 500 nm and a resistance of about 10 Ω is formed, and then the polycrystalline silicon layer 8 is etched using the resist 22 as a mask. Thus, as shown in FIG. 4(g), a gate electrode 8a for a MOS FET is formed due to the patterning of the polycrystalline silicon layer 8. Incidentally, gate oxide film parts of said oxide film 7 are indicated by 7a. Thereafter, a p-type diffusion layer having a depth of about 1.5 $\mu$m for the body and an n-type diffusion 11 having a depth of about 0.2 $\mu$m for the source are formed. Thereafter, the oxide film 12 is made thick, up to about 600 nm, and a contact for the source electrode is opened.

Figure 4H:
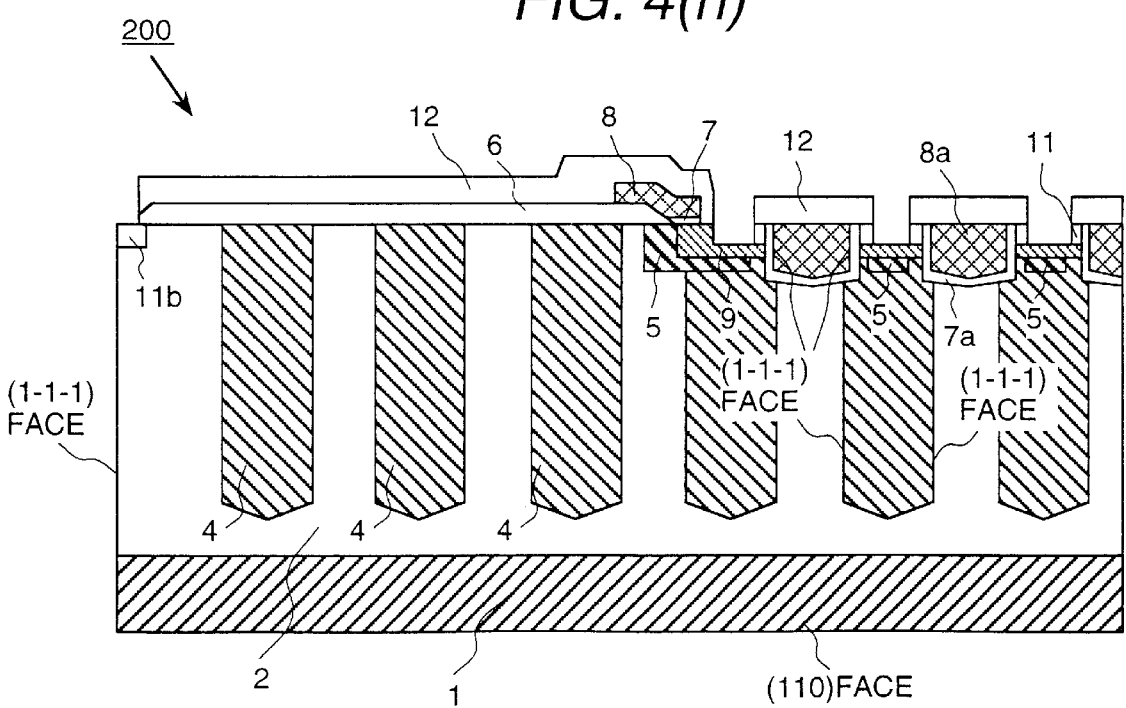

Next, as shown in FIG. 4(h), etching is carried out using the oxide film 12 as a mask until a source contact hole reaches the p-type diffusion layer for the body. In this case, the ion implantation of boron may be carried out as needed to take ohmic contact to the p-type diffusion layer 9. Incidentally, since a contact for the p-type diffusion layer is formed by a different process from said process, the silicon etching is not carried out.

Thereafter, an aluminum electrode layer having a thickness of about 3 $\mu$m is formed. The patterning of an aluminum electrode 13a, acting as the source area of the Power MOS FET, gate electrodes 13b and 13c, which acts as the chip edge side electrode, is carried out; and, further, a protection film 14 is formed other than in the area of a source electrode pad 15a, which is the electrode lead part of the first terminal, a gate electrode pad (not shown) and the scribe area of the semiconductor chip.

Next, a backetch is carried out so that the thickness of silicon becomes about 250 $\mu$m, and the rear electrode 16 is formed, thereby to provide the sectional structure of FIG. 2. Incidentally, the face at the time when the silicon etching grooves were formed would be shifted by carrying out a heating process on the PN junction boundary of the p-type region 4 and the n-type region 2, but even after it is shifted by diffusion, the face direction of the main face of the junction does not change.

Figure 4I:
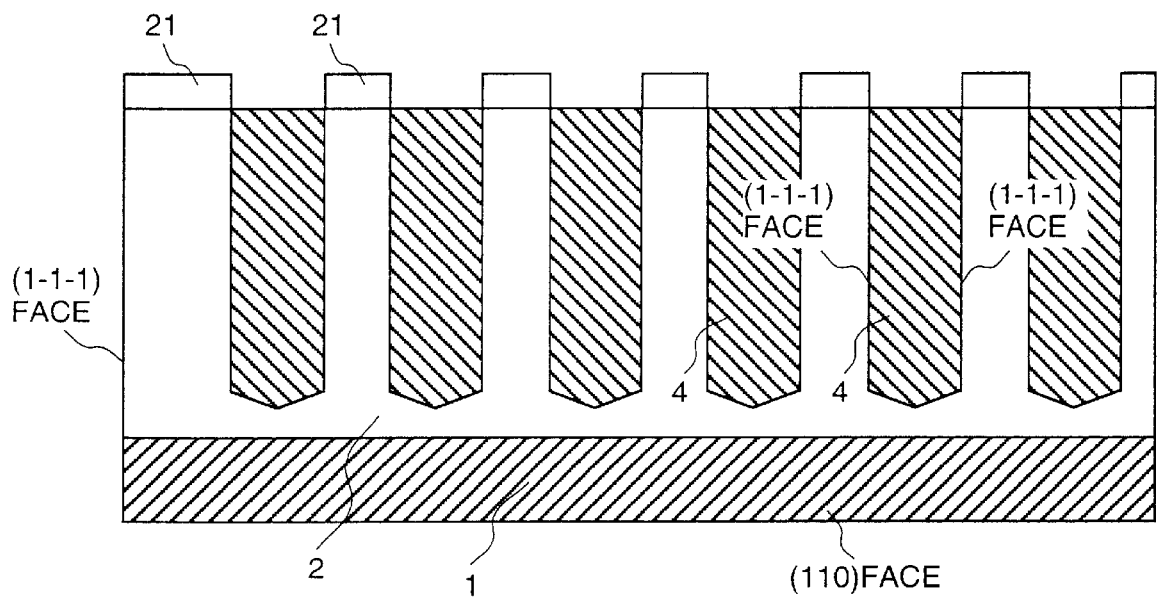

Also, although the process shown in FIG. 4(b) results to a case where the usual epitaxial growth is carried out was shown, such a process may be carried out in which a p-type epitaxial layer 4 is formed as shown in FIG. 4(i) only within the groove 3 in the monocrystalline silicon layer by using selective epitaxial growth from the state of FIG. 4a; and, thereafter, to maintain the completeness of the area formed by the selective epitaxial growth, a defect removing process using oxidation or silicon etching is carried out. Alternatively, a process may be utilized in which ion implantation is made against a selective epitaxial growth area; and, thereafter, a heat process is used to restore a defect, and then the structure of FIG. 4(c) is fabricated.

In accordance with this embodiment, since to form the repeated pattern of n-type regions 2 and p-type regions 4 necessary for a high withstanding-voltage, etching is carried out using an alkali etching liquid having a high face azimuth property, such as potassium hydroxide, etc., using as a mask the pattern of a parallelogram comprised of two sides of the (1-1-1) face and two sides of the (-11-1) face intersecting with said two sides of the (1-1-1) face at the angle of about 70.5° or about 109.5°. By using this etching face as a reference, the repeated pattern of p-type regions 4 and n-type regions 2, which become the withstanding-voltage holding area necessary for the high withstanding-voltage, is formed, whereby the side edge of silicon against the mask can be a minimum, and the pitch repetition interval of the p-type regions 4 and the n-type regions 2 constituting the voltage holding area can be made narrow and long. If the substrate (110) face is merely anisotropy etched without appropriately selecting the planar layout, as mentioned above, a face which is not perpendicular to the substrate appears. Thus, since the progress of the side edge and the etching speed reduction in the depth direction occur locally, it is impossible to make the planar pitch size of the PN junction narrow and form a deep silicon etching groove. In accordance with this embodiment, since it is possible to make the pitch repetition of the p-type regions 4 and n-type regions 2 of the voltage holding area narrow, even though the concentration of the p-type regions 4 and n-type regions 2 is increased, a complete depletion forming is possible, since as the maximum electric field of the PN junction at the time when a reverse voltage is applied to the said p-type region 4 and n-type region 2 is below the critical electric field strength. Therefore, it is possible to give the high withstanding-voltage element a low loss feature. Also, with the pitch repetition of the p-type regions 4 and n-type regions 2 of the voltage holding area and the length in the direction of the depth, by effecting correctly the angular control of the face and the silicon etching mask, even though the spacing of the pitch repetition of the p-type regions 4 and n-type regions 2 is selected to be below approximately 10 $\mu$m, it is possible to form a silicon etching groove having the depth of over 40 $\mu$m. Thus, it is possible to provide a high withstanding-voltage element having a withstanding-voltage between the first and second terminals of over 600V, and to reduce remarkably the ON resistance compared to the prior art element.

Further, in accordance with this invention, since in the process of forming the elongated repeated pattern of the p-type regions 4 and the n-type regions 2 necessary for a high withstanding-voltage, the anisotropy etching is carried out using an alkaline water solution, such as potassium hydroxide (KOH), it is possible to form the etching grooves in dozens of wafers at one time. Thus, the throughput is increased over 10 times even in a case where the etching grade of the silicon is on the same conditions, compared to the dry etching, in which usually the etching is made per one chip, and therefore the process cost is decreased.

Furthermore, in accordance with this embodiment, the main flat surface acting as the reference for the mask alignment at the time when the semiconductor chip is manufactured is on the {111} face or {112} face, which is perpendicular to the (100) face, the semiconductor chip is arranged on the semiconductor wafer so that two of the side edges of the semiconductor chip become parallel to said main flat surface, and a couple of opposed sides of four main sides of the mask pattern for forming the silicon etching grooves, acting as a reference for the boundary between the pattern of said p-type regions 4 and the n-type regions 2a, are on the (1-1-1) face or the (-11-1) face, so that they are parallel to the side edge of the semiconductor chip. Thus, although said four main sides constitute a parallelogram, a couple of opposed sides thereof can be laid out with parallelism to an xy coordinate in the layout design work. Thus, it is possible to alleviate complexity in the layout design of the silicon etching formation pattern using the anisotropic etching with potassium hydroxide (KOH), etc., thereby to decrease the design cost.

Furthermore, in accordance with this embodiment, it is possible, also when the etching groove 17 for the source contact is formed, to use anisotropic etching with potassium hydroxide (KOH) just like the formation of the etching grooves 3, thereby to reduce the process cost compared to the case using dry etching. Also, in the layout design of the etching groove forming pattern for said etching groove 17, since the same means is used as in the formation of the groove 3, it is possible to alleviate complexity in the layout design of the silicon etching formation pattern, thereby to decrease the design cost.

Furthermore, in accordance with this embodiment, the interval of the p-type impurity regions 4 used as the voltage holding area is made narrower than the channel diffusion regions 9 opposed thereto through the gate 8a. In other words, the interval of the p-type impurity regions 4 used for the voltage holding area is made narrower than the width of the trench gate, and the corners of the bottom of the trench gate are covered by the p-type impurity region 4, which is used for the voltage holding area. Therefore, since electric field centralization at the corners of the bottom of the trench gate can be avoided, an increase of the drain withstanding-voltage and an improvement of the reliability of the gate oxide film can be achieved. Also, the channel diffusion layer 9 having a concentration which is higher by more than two times with respect to that of the p-type impurity regions 4 is made narrower than the trench gate to suppress an increase of the ON resistance. Incidentally, in this case, since the impurity concentration of the p-type impurity regions 4 is sufficiently lower than that of the channel diffusion layer 9, the causes of the increase of the threshold voltage and the decrease of the mutual conductance gm can be neglected.

Although this embodiment was explained as an example of a silicon semiconductor element, it is possible to apply it to silicon carbide (SiC). In that case, since a high voltage can be held even though the extent of the depletion layer in the n-type regions 2 is short, the withstanding-voltage deterioration of the gate oxide film and the drain withstanding-voltage deterioration due to the electric field centralization at the corner of the bottom of the trench gate become strict problems. Thus, the fact that the interval of the p-type impurity regions 4 is wider than the interval of the trench gates and the corners of the bottom of the trench gate are covered by the p-type impurity region 4, which is used for the voltage holding area, as mentioned above, becomes more important.

Furthermore, in this embodiment, a strip structure is formed in which the n-type regions 2 used for the voltage holding area are located right under the polycrystalline silicon gates 8a and the p-type regions 4 used for the voltage holding area are located between the polycrystalline silicon gates 8a and below them. Thus, since the channel length functioning effectively can be shortened, it is possible to reduce the ON resistance and improve the gm (mutual conductance).

Furthermore, in this embodiment, the p-type impurity regions 4x, which are formed during the same process as the formation of the p-type impurity regions 4, acting as the voltage holding area, are used as the field limiting area for assuring the withstanding-voltage at the periphery. Thus, there is no increase of the processing cost. This is because the p-type impurity regions 4x for the field limiting area can be formed at a depth of over ¾ of the thickness of the n-type epitaxial layer 2 (the boundary between the n-type epitaxial layer 2 and the high concentration n-type substrate 1 is defined as being at the position where the impurity concentration is $5 \times 10^{17}/cm^3$), whereby the electric field centralization at the periphery area can be alleviated; and, even though the concentration of the n-type regions 2, which form the drain area at the periphery, is high, it is possible to provide a high withstanding-voltage.

Furthermore, the p-type impurity regions 4 and 4x are formed so that they are shallower than the thickness of the n-type epitaxial layer 2; and, between the p-type impurity region 4, 4x and the high concentration n-type substrate 1, the area (area in which the impurity concentration is under $5 \times 100/cm^3$) of the n-type epitaxial layer 2 is left. Thus, there is no withstanding-voltage deterioration at the bottom of the p-type impurity regions 4, 4x. That is, the n-type regions used for the voltage holding area, which is the active area, the n-type regions formed to prevent the withstanding-voltage deterioration, which are positioned at the outside of the active area, and the n-type area formed to prevent the withstanding-voltage deterioration, which is positioned under the p-type impurity regions 4, 4x, are all of the same n-type epitaxial layer 2, and, therefore, they are formed by the same process. Thus, it is possible to provide a high withstanding-voltage function without any complexity of the processes.

Also, the amount of net impurity of the n-type regions in the interval L2 between the p-type impurity region 4 and the p-type impurity region 4x, and in the interval L3 between the p-type impurity regions 4x, is made smaller by over 20% than the amount of net impurity of the n-type regions in the interval L1 between the p-type impurity regions 4. Thus, when a backward voltage is applied between the terminal 101 and the terminal 102, it is necessary that the depletion layer reach the p-type region 4x, which is the field limiting area. This is because, when a voltage is applied to the terminal 102 the depletion layer starts immediately to extend from the p-type regions connected to the terminal 101, whereas from the p-type regions 4x, which represent the field limiting area that is not directly connected to the terminal 101, the depletion layer does not extend until the depletion layer from the adjacent p-type region reaches it.

In this embodiment, the impurity concentration is the same between the n-type regions of the voltage holding area and the n-type regions of the periphery area; and, thus, the interval L2 between the p-type impurity region 4 and the p-type impurity region 4x, and the interval L3 between the p-type impurity regions 4x, are formed to be shorter by over 20% than the interval L1 between the p-type impurity regions 4, so that when a backward voltage was applied between the terminal 101 and the terminal 102, the depletion layer can reach the p-type regions 4x, which is the field limiting area separated from the p-type impurity region 4 through the n-type region 2. Thus, electric field centralization at the periphery can be alleviated and a high withstanding-voltage can be achieved. Incidentally, in FIG. 2, the spacing L2 between the p-type impurity region 4 and the p-type impurity region 4x is shortened effectively by the p-type diffusion layer 5. In this case, the effective interval between the p-type impurity region 4 and the p-type impurity region 4x is replaced from L2 to L4. Also, in this embodiment, the impurity concentration may be the same between the spaces L1, L2 and L3. Thus, the n-type regions 2 can be made up with an epitaxial layer having a uniform concentration which can be formed by one process, thereby to provide the advantage that the cost can be reduced. Incidentally, in the case of this embodiment, it is preferable that, by making substantially equal the net impurity amount of the p-type impurity region 4x and the net impurity amount of the adjacent p-type impurity region 4, a complete depletion can be easily achieved. Thus, the net impurity amount of the p-type region 4x is made smaller by over 20% than the net impurity amount of the p-type impurity region 4. Therefore, in a case where the p-type impurity regions 4, 4x are equal to each other in net impurity amount, it is preferable that the width of the p-type impurity region 4x is made shorter by over 20% than the width of the p-type impurity region 4.

Incidentally, in FIG. 1, the periphery portions separated from each other in the vertical direction are shaped so that they are made up by the extensions of the p-type regions 4 and n-type regions 2 which constitute the voltage holding area. With this shape, it is possible to assure a desired withstanding-voltage at these periphery portions for the same reasons as the case in which the n-type regions 2 and p-type regions 4 constituting the voltage holding area attain a high withstanding-voltage function in the depth direction. Thus, by utilizing the p-type diffusion regions 4, 4x and n-type region 2 in the form of a stripe arrangement, it is possible to increase the withstanding-voltage in the voltage holding area, which is the active area, as well as at the periphery, without additional processes.

Incidentally, in a case where the p-type regions 4 are formed by dry etching, or the n-type regions 2 and p-type regions 4 for the voltage holding area are formed as embedded layers, the n-type regions 2 and p-type regions 4 for the voltage holding area are extended to the periphery of the semiconductor chip, thereby to assure a desired withstanding-voltage at the periphery and to assure the withstanding-voltage in the horizontal direction.

Furthermore, in this embodiment, after the p-type regions 4 for the voltage holding area are buried within the silicon etching grooves 3, a flattening process is performed. In this case, at least a part of an oxide film 20a shown in FIG. 4(a) is left as an etching mask guide, thereby to carry out the etching of the p-type epitaxial layer 4. Thus, it is possible to control the amount of etching by using said mask guide as a reference. This makes it possible to effect a high-precision alignment of the pattern of the n-type regions 2 and p-type regions 4 for the voltage holding area with the mask pattern in the process thereafter.

Incidentally, in the description of this embodiment, an example utilizing wet etching by means of a material having a high anisotropic etching characteristic, such as potassium hydroxide (KOH), etc. was mainly explained. However, it is also possible to form the etching grooves 3 by means of an anisotropic etching of the dry process type. In this case, although the throughput is inferior compared to the dry type anisotropic etching, since there is no limitation on the semiconductor face azimuth and no restriction relating to the angle of the planar pattern, easy element design can be provided.

Embodiment 2

Figure 5:
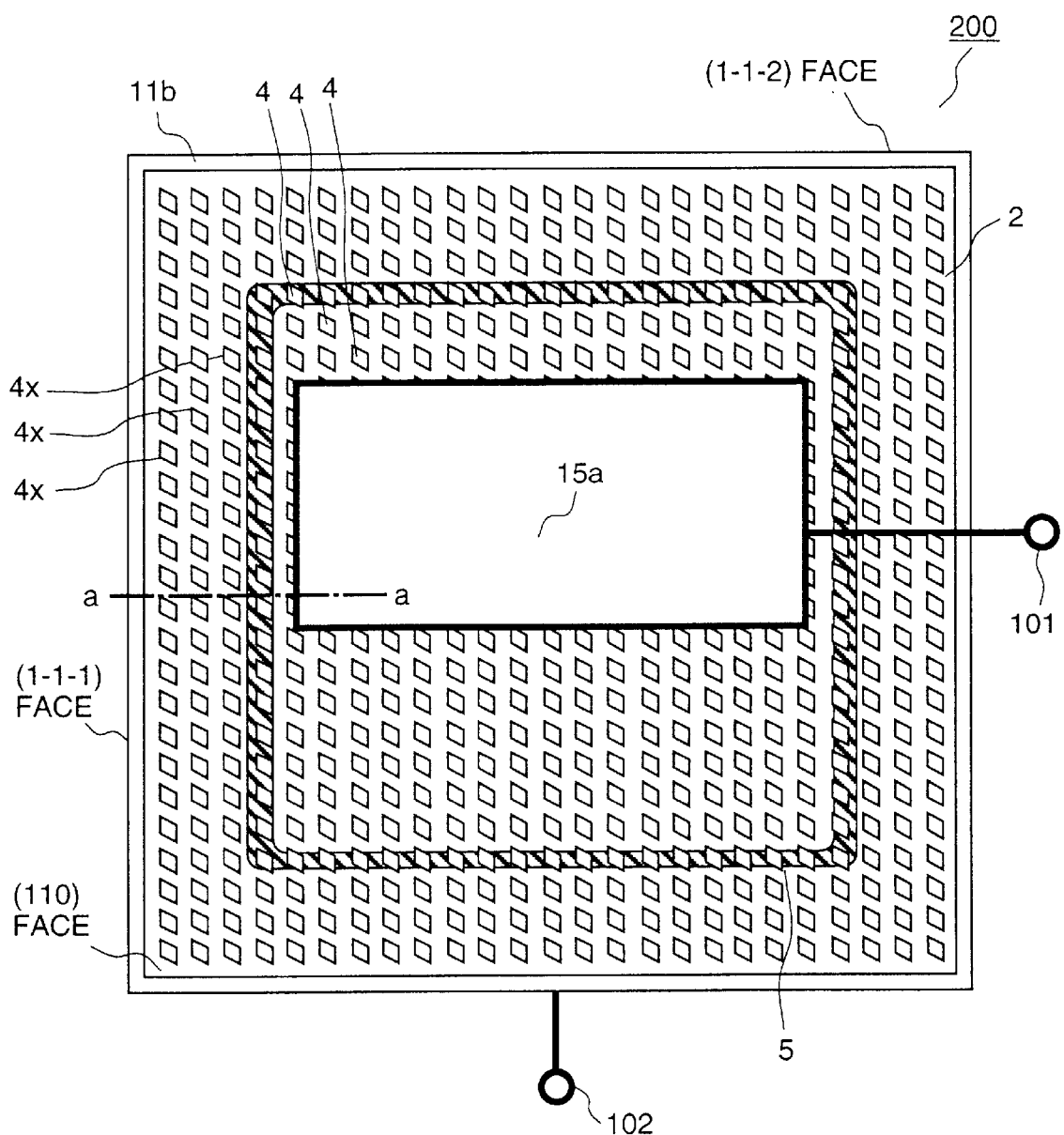
FIG. 5 is a plan view of a semiconductor device of Embodiment 2.

FIG. 5 is a plan view of the semiconductor device according to this embodiment. In this embodiment, the (1-1-1) face is selected as a couple of opposed sides of the semiconductor chip just like the case in FIG. 1, and the sectional structure taken along line a—a is the same as shown in FIG. 2. In this embodiment, the p-type regions 4 and the n-type regions 2, which constitute the voltage holding area, are a mesh structure and are formed as a repeated pattern. Just like the embodiment in FIG. 1, also in this embodiment, to obtain the characteristic feature of both of a high withstanding-voltage and a low loss, the amount of impurity of the space to which the repeated pattern of the n-type regions 2 and p-type regions 4, making up the adjacent voltage holding area, is set between $5 \times 10^{11}/cm^2$ and $2 \times 10^{13}/cm^2$.

This embodiment is directed to a mesh gate type power MOS FET in which a polycrystalline silicon gate 8a is formed on an n-type region 2, acting as the voltage holding area, and a p-type diffusion layer 9 for the channel of the power MOS FET on a p-type region 4, acting as the voltage holding area. In this case, just like the case of the embodiment 1, by making the width of the p-type impurity regions 4, which represent the voltage holding area wider than the interval of the trench gates, and by covering the corners of the bottom of the trench gate with the p-type impurity region 4, which is used for the voltage holding area, the electric field centralization at the corners of the bottom of the trench gate can be avoided. In this way, the drain withstanding-voltage is increased and the reliability of the gate oxide film is improved.

Because wet antistrophic etching utilizing potassium hydroxide, etc. is applied just like the embodiment 1, and the p-type regions 4 of the voltage holding area are shaped as a parallelogram pattern, the main side face at the boundary between the p-type region 4 and the n-type region 2 is on the {111 } face perpendicular to the substrate. Thus, in this embodiment, like the embodiment 1, since the p-type regions 4 and the n-type regions 2, acting as the voltage holding area, can be formed at a deep and narrow pitch, it is possible to effectuate a high withstanding-voltage and a low loss with a cheap process cost. Also, in this embodiment, since the etching groove pattern of the mesh type makes the shape immediately after the etching (the structure in FIG. 4(a)) strong compared to the one of the stripe type, an improved product yield ratio is attained.

Also, in this embodiment, to secure the withstanding-voltage at the periphery of the p-type diffusion layer, which is formed at the same process as the p-type diffusion layer 4 used for the voltage holding area, the mesh arrangement operatesas the field limiting area. The optimum condition pertaining to the interval of this arrangement is the same as the condition of the dimensions L1, L2 and L3 as explained with reference to FIG. 2 in the embodiment 1, and the interval of the p-type impurity regions 4x is made narrower than the interval L1 of the p-type impurity regions 4 to provide for an easy connection of the depletion layer. In this embodiment, since the voltage holding area and peripheral structure are of a mesh construction, it is possible to elongate the channel width compared to the stripe type gate structure, whereby the ON resistance component at the channel part becomes low. This provides for a low loss.

Embodiment 3

Figure 6:
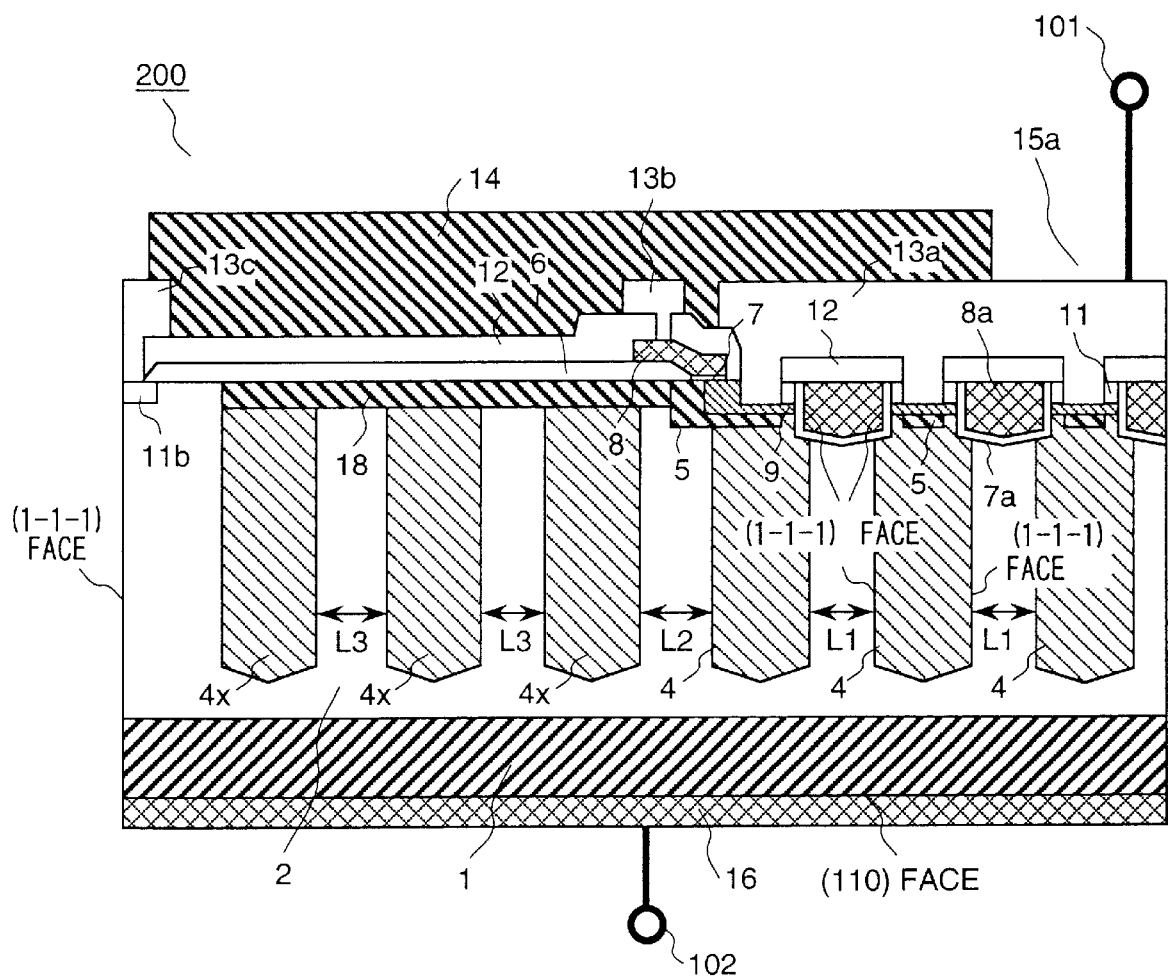
FIG. 6 is a sectional view of a semiconductor device of Embodiment 3.

FIG. 6 is a sectional view of the semiconductor device according to this embodiment. In this embodiment, a shallow p-type impurity area 18 of low concentration is formed over the p-type impurity regions 4x, used to provide the withstanding-voltage at the periphery. In this embodiment, since the depletion layer can easily spread toward the periphery of the semiconductor chip through the p-type impurity region 18, even though the interval L2 between the p-type region 4 of the voltage holding area and the p-type diffusion layer 4x formed to increase the withstanding-voltage at the periphery, as well as the interval L3 between the adjacent p-type diffusion regions 4x for increasing the withstanding-voltage at the periphery are the same as the spacing L1 between the adjacent p-type regions 4 of the voltage holding area, the withstanding-voltage at the periphery can be easily obtained. Thus, this can provide an easy planer design of the element for a high withstanding-voltage. Since it is not necessary to make the dimensions L2 and L3 smaller than the dimension L1, it is possible to design the dimension L1 to a minimum value within the range allowed by the process conditions. Thus, it is possible to provide easy optimization for a high withstanding-voltage and low loss of the element.

Embodiment 4

Figure 7:
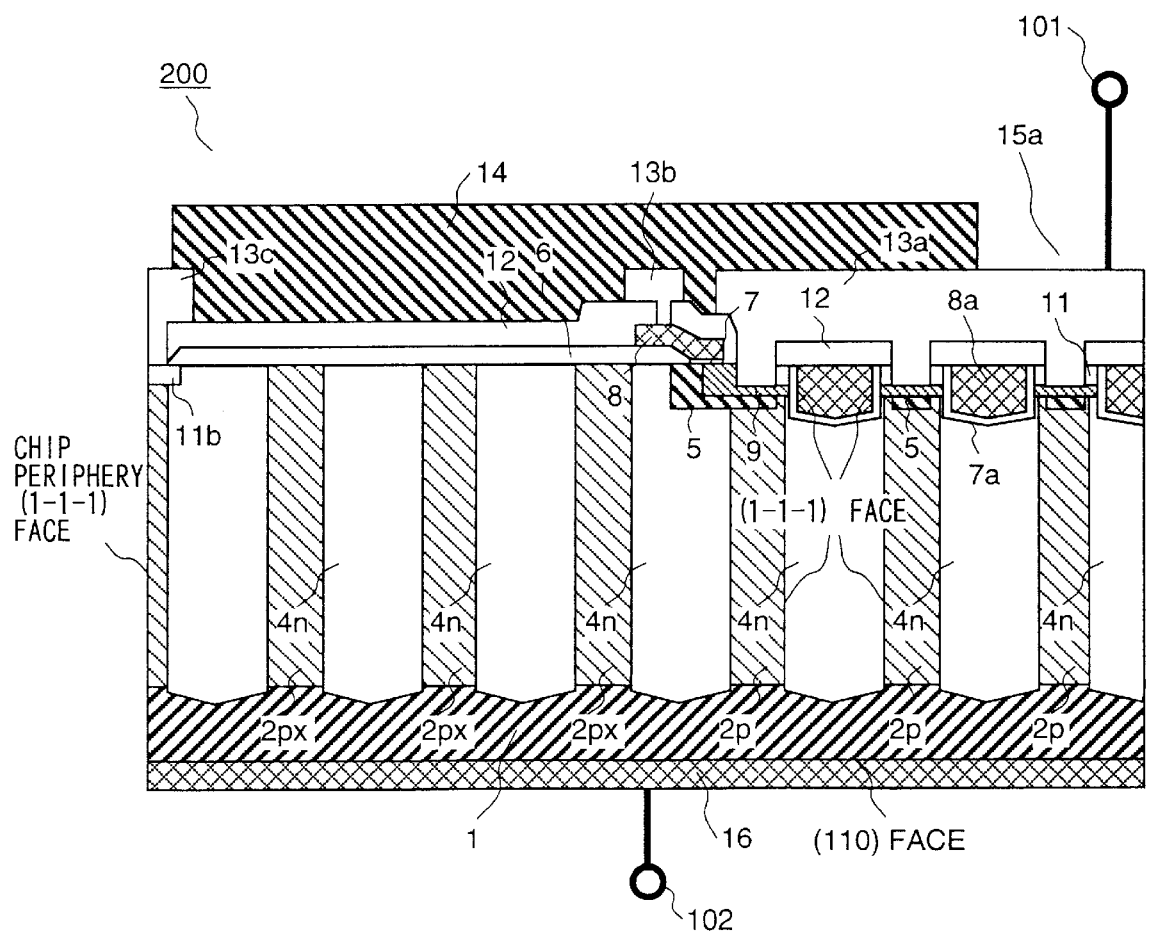
FIG. 7 is a sectional view of a semiconductor device of Embodiment 4.
Figure 8:
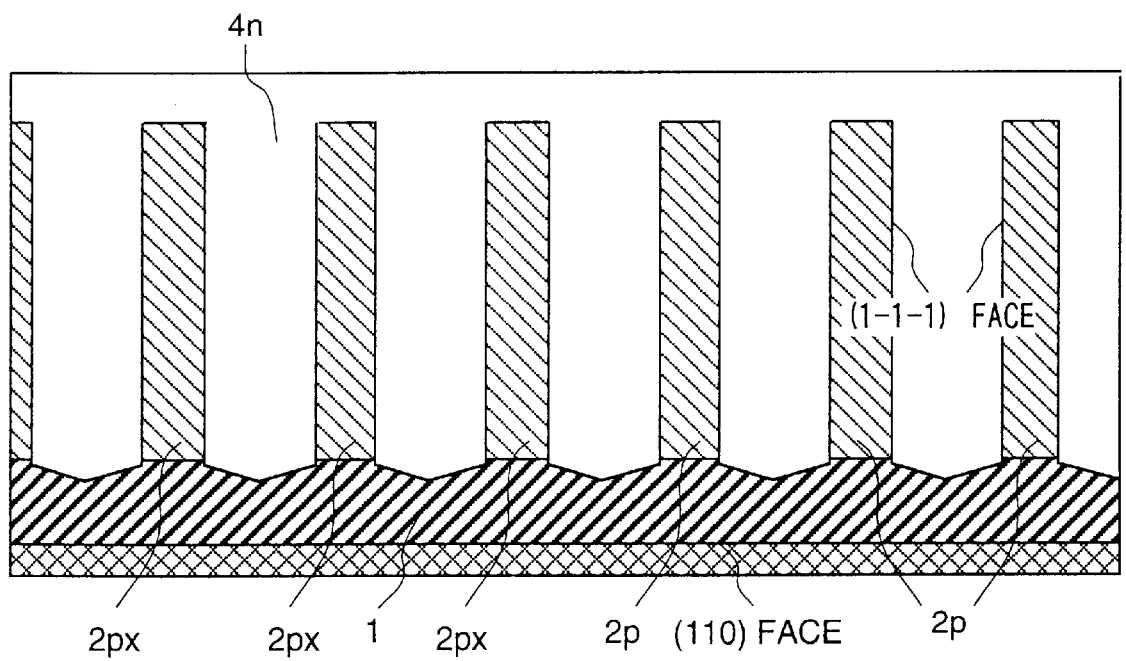
FIG. 8 is a sectional view illustrating a method of manufacture of the semiconductor device of Embodiment 4.

FIG. 7 is a sectional view of the semiconductor device according to this embodiment. In this embodiment, a first epitaxial layer 2p is formed as a p-type layer, and a second epitaxial layer 4n is formed as an n-type layer. In this embodiment, as shown in FIG. 8, after an etching groove 3 reaching a high concentration n-type region 1 was formed in the first epitaxial layer 2p, 2px, the second epitaxial layer 4n is formed and its surface is flattened, and, thereafter, etch back is carried out until the first epitaxial layer 2 appears. In this case, the n-type region 4n and p-type region 2p in the vicinity of the active area portion, through which current flows, correspond to the n-type region 2 and p-type region 4 in the embodiment in FIG. 1, respectively, and act as the voltage holding area. Also, the p-type region 2px corresponds to the p-type area 4x in FIG. 1, and acts as the field limiting area.

In this embodiment, the etching grooves need to be formed deeply to form the current path of the drain, but the other structure is the same as that shown in FIG. 2.

Embodiment 5

Figure 9:
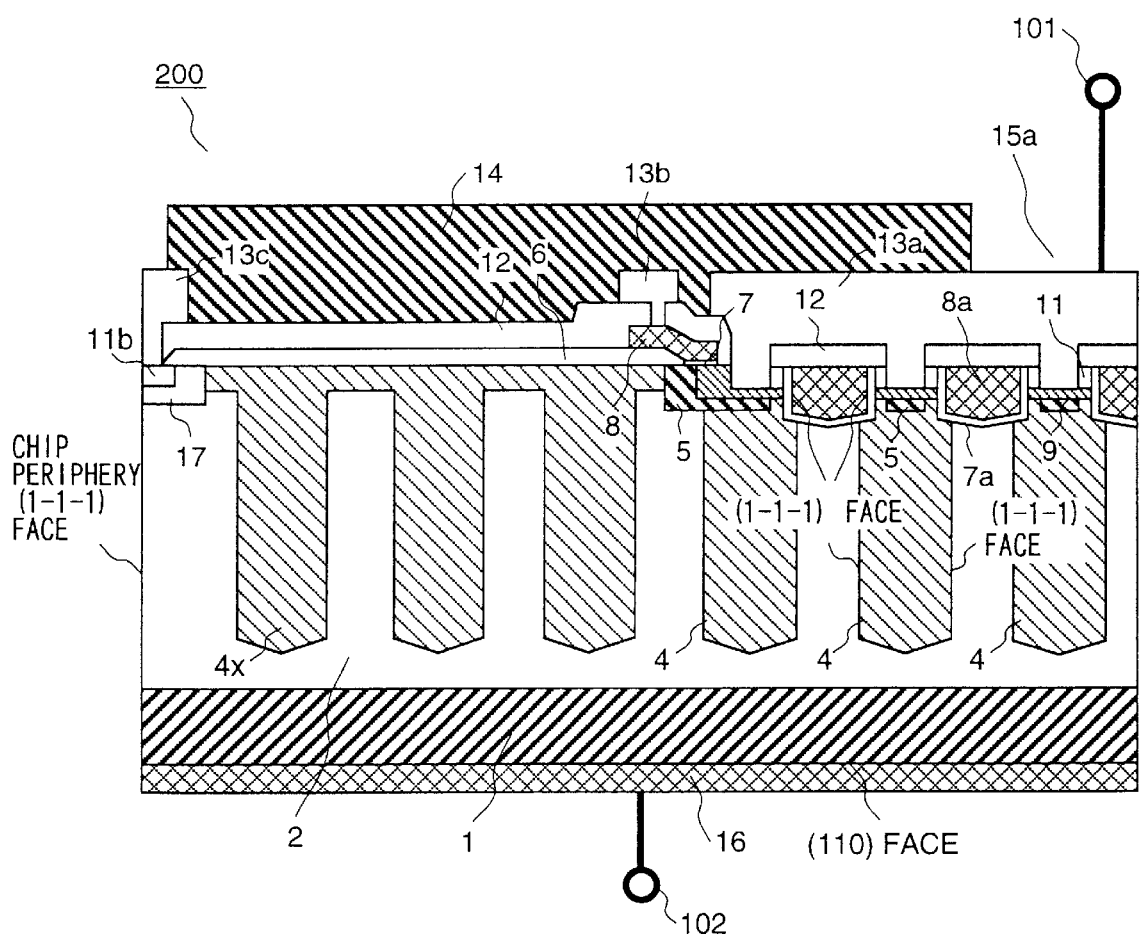
FIG. 9 is a sectional view of a semiconductor device of Embodiment 5.

FIG. 9 is a sectional view of the semiconductor device according to this embodiment. In this embodiment, in order to connect p-type regions 4, 4x to the first electrode 101, a second epitaxial layer 4 of the p-type is formed during the production process in the embodiment 1. Then, after the structure shown in FIG. 4(b) was obtained, the second epitaxial layer 4, 4b is etched. At that time, in order to provide the same structure as that shown in FIG. 6, it is intended that, by shortening the etching time of the p-type epitaxial layer 4, 4b, the p-type regions 4x are formed also on the surface of the semiconductor chip periphery.

In this embodiment, there is no need for forming the p-type diffusion layer 18. However, in order to eliminate a p-type region at the semiconductor chip end, it is necessary that the depth of the p-type regions 4x on the semiconductor surface be made shallower than that of the n-type diffusion layer 11b, or that the n-type diffusion layer 17 is formed.

Embodiment 6

Figure 10:
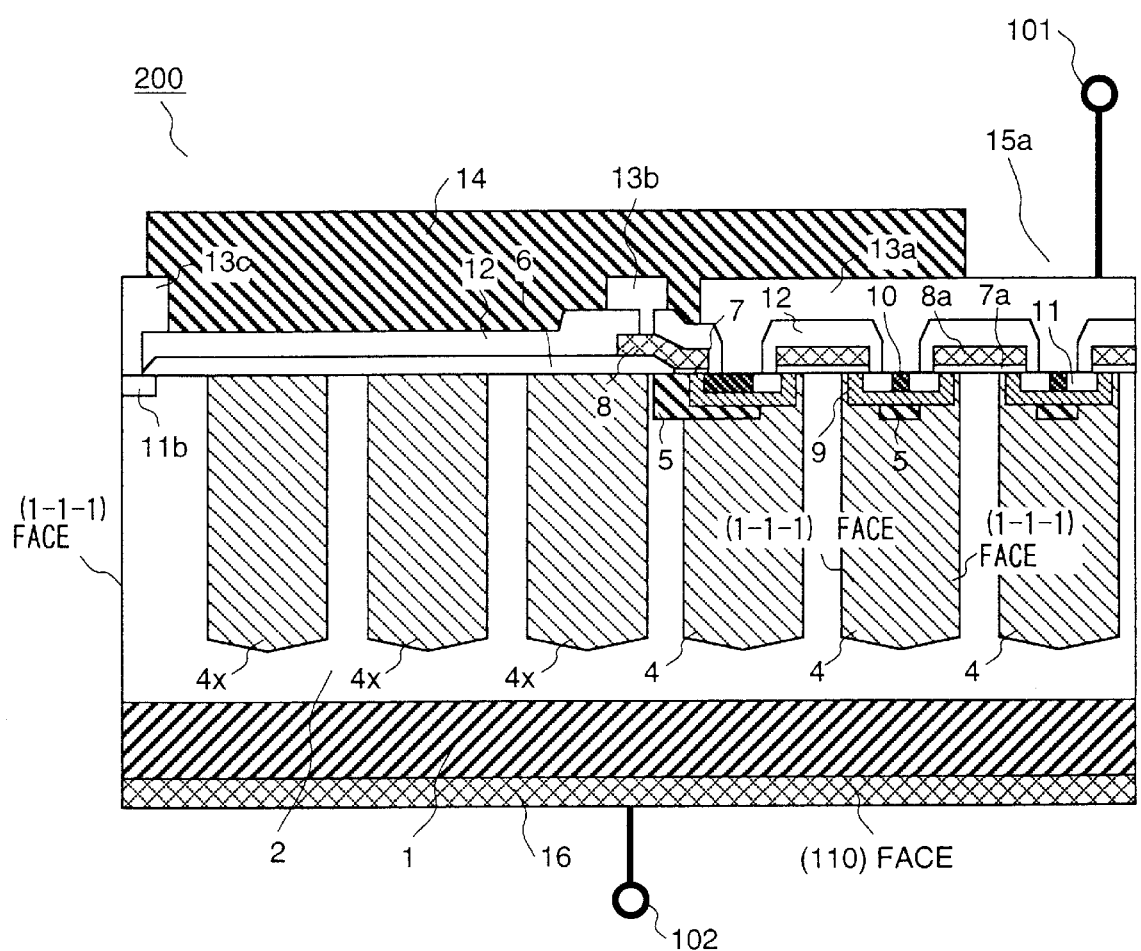
FIG. 10 is a sectional view of a semiconductor device of Embodiment 6.

FIG. 10 is a sectional view of the semiconductor device according to this invention. This embodiment substantially differs from the embodiment in FIG. 2 having the gate of the trench structure, in that the gate has a planar structure. In this embodiment, in which the gate has a planar structure, the loss component in the channel diffusion area of the MOS FET becomes high compared to the case of the trench structure provided in the embodiment 2 (FIG. 2); however, if the resistance component in this area is low, the planar structure in this embodiment will provide a decreased process cost. In this case, by making the width of the p-type regions 4 used for the voltage holding area wider than the spacing of the channel diffusion layers 9, and by covering the comers of the bottoms of the channel diffusion layers 9 by the p-type regions 4, which the voltage holding area uses, electric field centralization at the comers of the bottoms of the channel diffusion layer 9 can be prevented. Thus, elevation of the drain withstanding-voltage is provided, and the reliability of the gate oxide film is improved. Although this effect is effective in the case of silicon semiconductor element, it is especially effective in the case of silicon carbide (SiC). Incidentally, since the impurity concentration of the p-type impurity regions 4 is sufficiently lower than that of the channel diffusion regions 9, it is possible to neglect the causes of the increase of the threshold voltage and the decrease of the mutual conductance gm.

Embodiment 7

Figure 11:
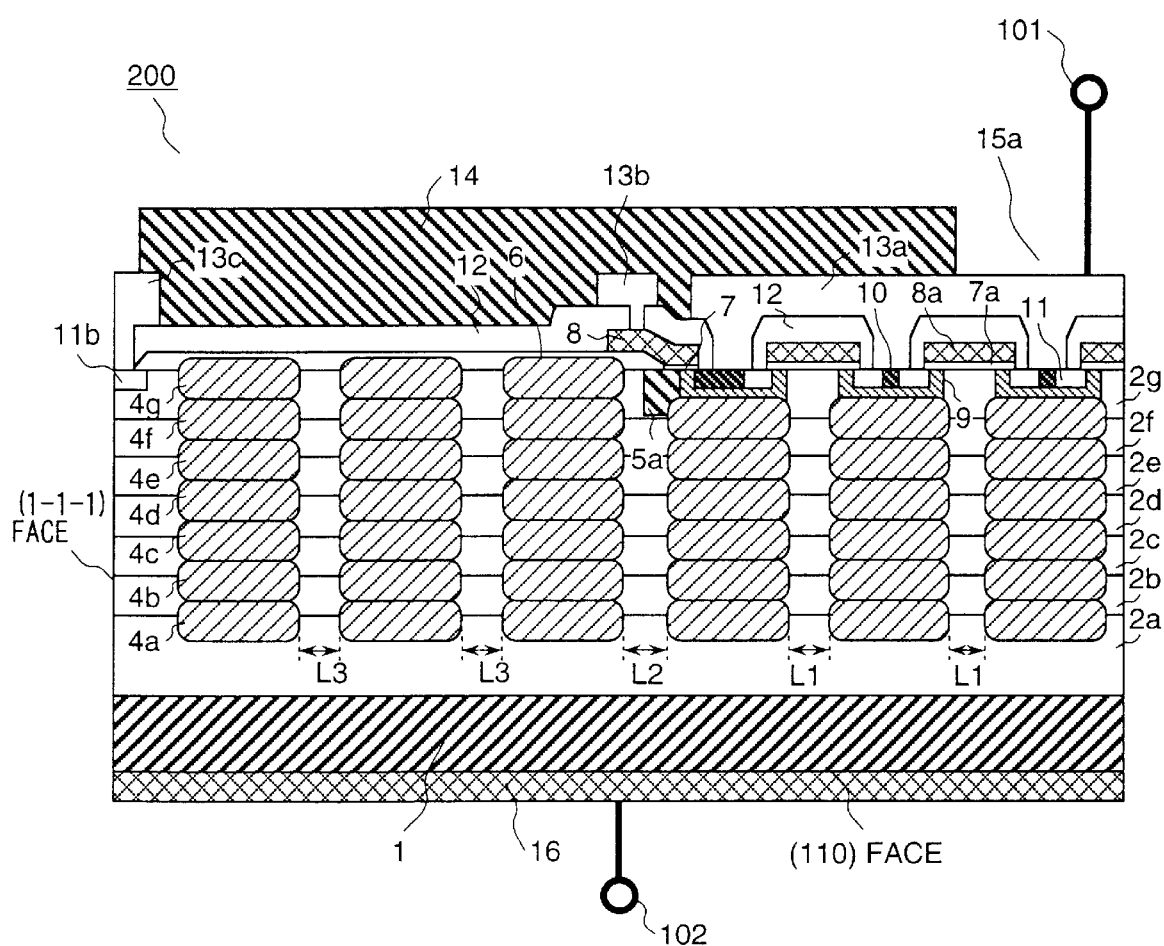
FIG. 11 is a sectional view of a semiconductor device of Embodiment 7.
Figure 12A:
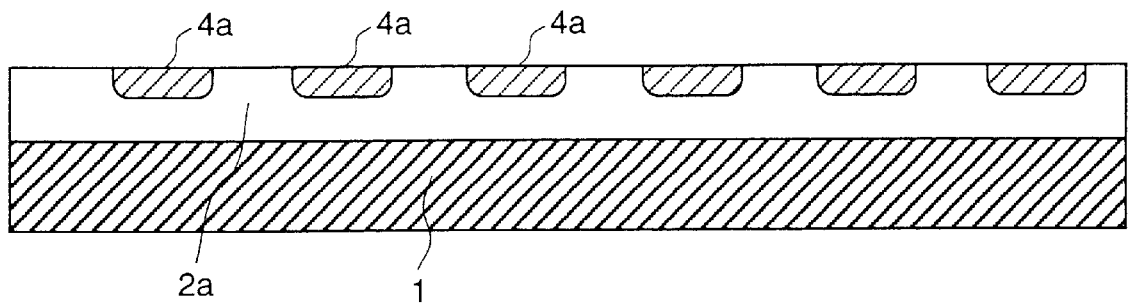
FIG. 12(a) through FIG. 12(c) are sectional views showing steps in a method of manufacture of the semiconductor device of Embodiment 7.
Figure 12B:
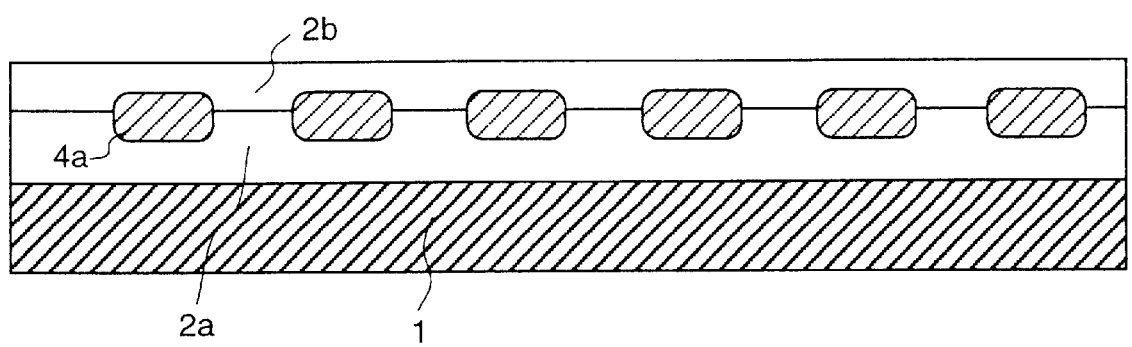
Figure 12C:
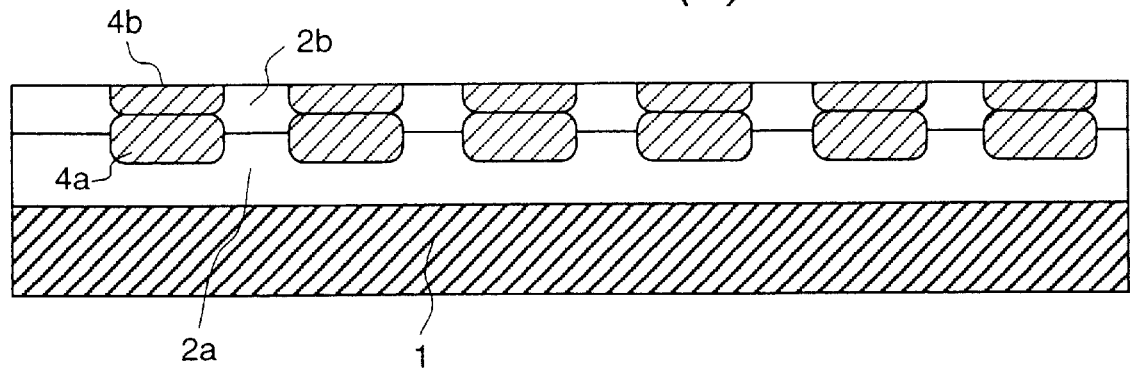

FIG. 11 is a sectional view of the semiconductor device according to this embodiment. In this embodiment, the p-type regions 4 and p-type regions 4x and the n-type regions 2 are formed by repeating the buried layer formation and the epitaxial layer formation. As shown in FIG. 12(a), an n-type epitaxial layer 2a is formed on a high concentration n-type substrate 1, and, thereafter, a p-type buried layer 4a is formed. Then, as shown in FIG. 12(b), an n-type epitaxial layer 2b is formed, and then as shown in FIG. 12(c), a p-type buried layer 4b is formed. Further, by carrying out these processes repeatedly, the structure shown in FIG. 11 is obtained. In this embodiment, the n-type epitaxial layers 2a through 2g, the p-type regions 4a through 4b and the p-type regions 4a through 4f correspond to the n-type epitaxial layer 2, the p-type regions 4 and the p-type regions 4x, respectively.

In this embodiment, the p-type diffusion layer 4g making up the p-type diffusion layer 4 of the voltage holding area is not formed in the portions in which there are p-type diffusion layers 9 for the channel. That is, the p-type diffusion layer 4 at the voltage holding area does not reach the gate oxide film. Incidentally, also in this embodiment, there is the advantage that the p-type regions of the voltage holding area and the field limiting regions are obtainable using the same process. Also, in this embodiment, by making the spacing of the p-type regions 4 used for the voltage holding area narrower than the spacing of the channel diffusion layers 9, and by covering the comers of the bottoms of the channel diffusion layers 9 by the p-type regions 4, which the voltage holding area uses, electric field centralization at the comers of the bottoms of the channel diffusion layer 9 can be prevented. Thus, elevation of the drain withstanding-voltage is provided, and the reliability of the gate oxide film is improved.

Incidentally, in this embodiment, although the voltage holding area is formed by using only the p-type buried layer, it is also possible To form an n-type buried layer between the n-type regions 2 at the voltage holding area during the production processes shown in FIGS. 12(a) to 12(c), and the impurity concentration of the n-type regions 2 at the voltage holding area is made higher than the concentration of the n-type regions 2 surrounded by the p-type regions 4x acting as the field limiting area at the periphery. In this case, an additional production process is needed, but since the condition of the voltage holding area for achieving high withstanding-voltage and low loss and the condition for maintaining the withstanding-voltage of the periphery can be determined independently, a simple design is provided. Incidentally, also in this case, the conditions relating to the impurity concentration and dimensions of the L1, L2 and L3 portions are the same as stated in association with the embodiment 1.

Embodiment 8

Figure 13:
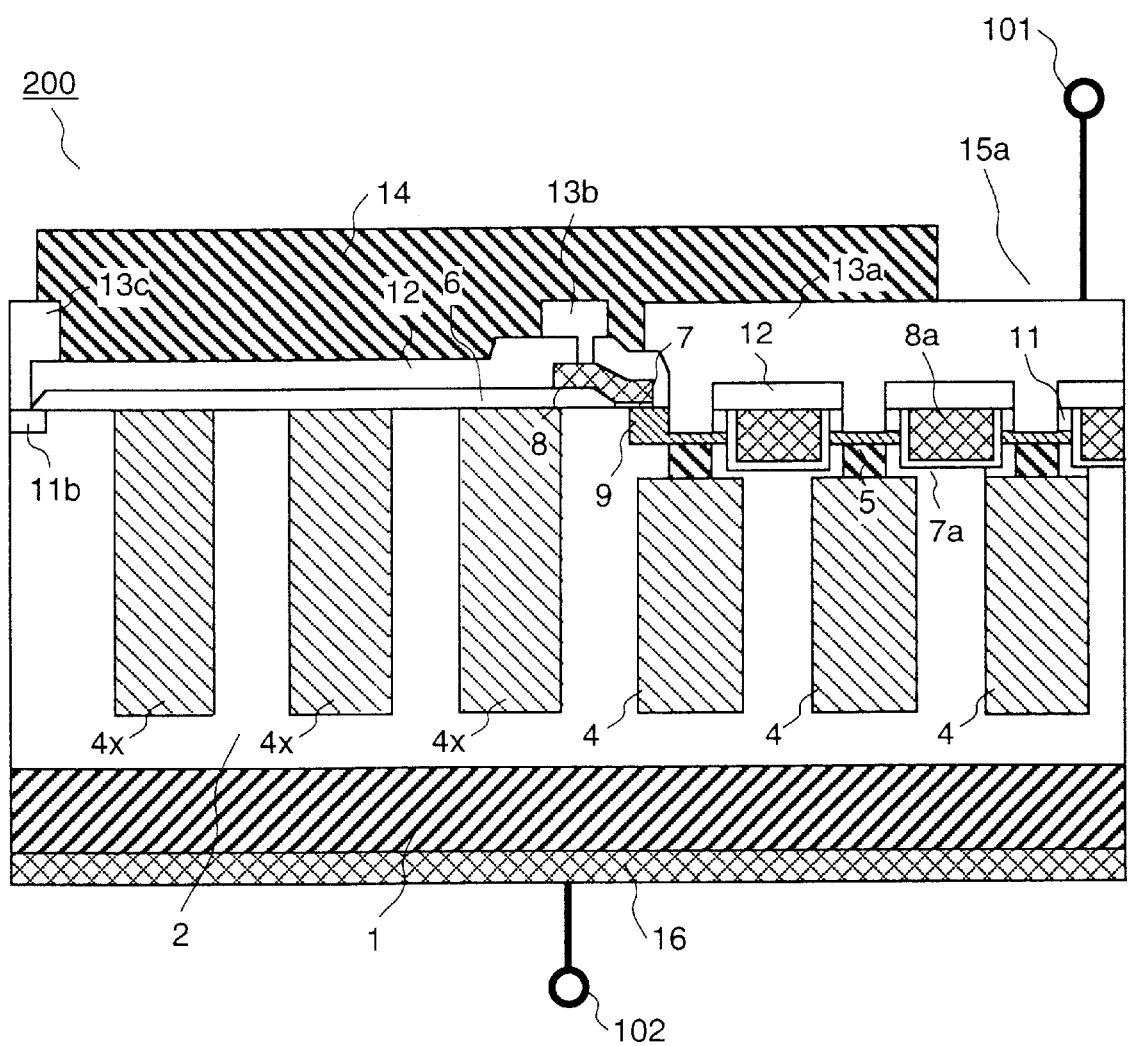
FIG. 13 is a sectional view of a semiconductor device of Embodiment 8.

FIG. 13 is a sectional view of the semiconductor device according to this embodiment. This embodiment differs from the embodiment 1 in that, in this embodiment, the width of the p-type regions 4 used for the voltage holding area is made wider than the spacing of trench gates 8a, and, in addition a p-type region 5 connects between a channel diffusion layer 9 and a p-type region 4. In this embodiment, the p-type regions 5 can be formed either by ion implantation from the semiconductor main face or by a production method using a buried layer, as shown in FIGS. 12(a) to 2(c). In this embodiment, although a gate oxide film 7a at the comer of the bottom of a trench gate is contacted to the n-type region 2, since the width of the n-type region at this portion is narrow, a shape is provided such that depletion is easily obtained by the application of a voltage between the p-type region 4 and the gate electrode. Thus, a structure in which a strong electric field is not applied at the comer of the bottom of the trench gate is provided. Therefore, in this embodiment, it is possible to avoid the reduction of the reliability of the gate oxide film and the deterioration of the drain withstanding-voltage without causing an increase in the threshold voltage and a decrease in the gm due to the p-type regions 4.

Embodiment 9

Figure 14:
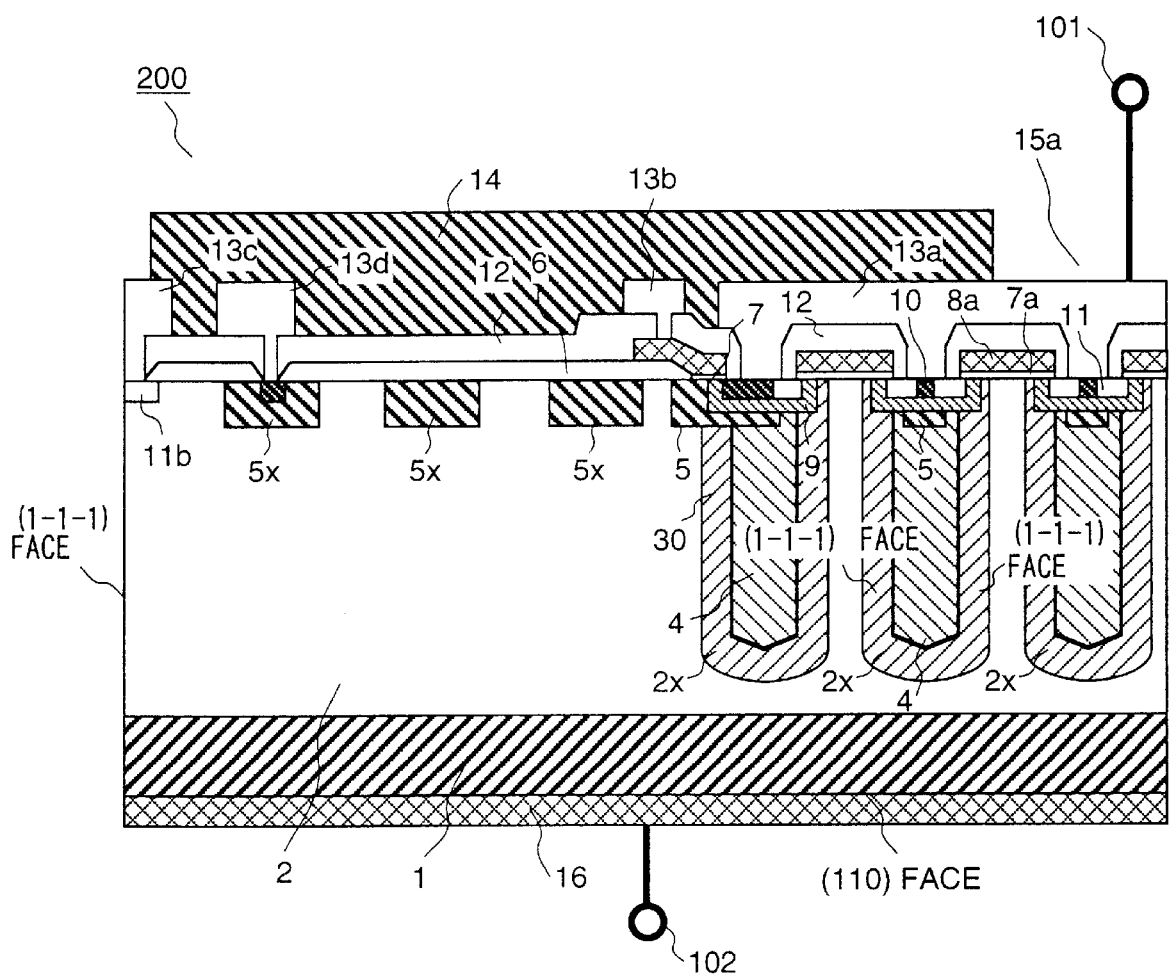
FIG. 14 is a sectional view of a semiconductor device of Embodiment 9.
Figure 15:
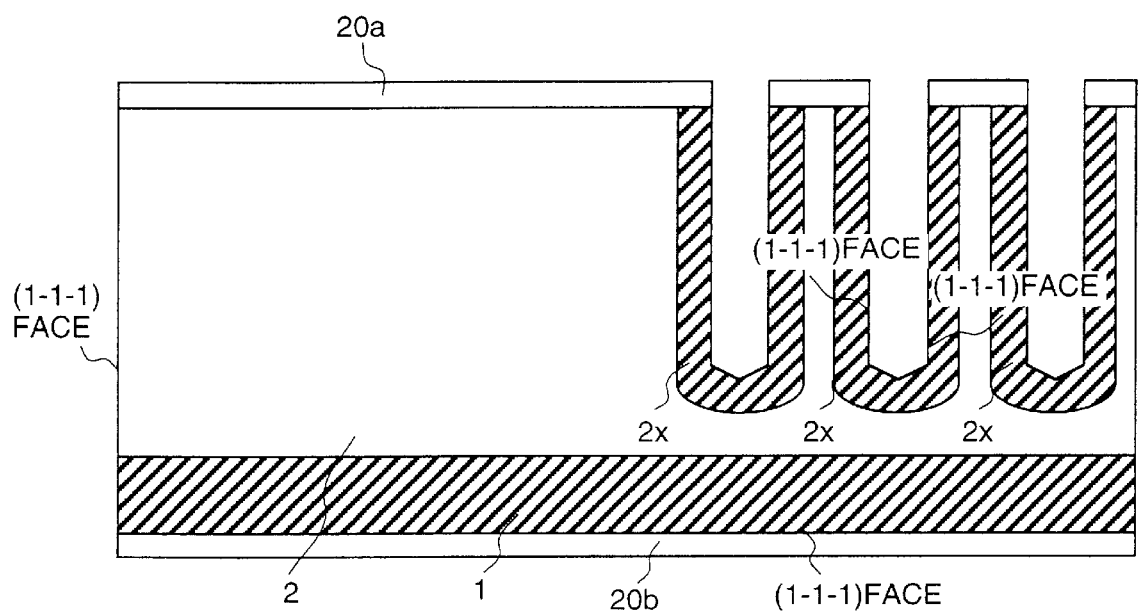
FIG. 15 is a sectional view showing a step in the method of manufacture of the semiconductor device of Embodiment 8.

FIG. 14 is a sectional view of the semiconductor device according to this embodiment. In this embodiment, after the etching process is carried out, as explained with reference to FIG. 4(a), phosphate glass is piled up, and by means of impurity diffusion from this phosphate glass, ion implantation from an oblique direction or the like is used to form an n-type diffusion layer 2x of higher concentration than that of the n-type epitaxial layer 2 in the vicinity of a p-type region. That is, this structure is so formed that the net impurity concentration of the main part within an n-type region 2, 2x acting as the voltage holding area, sandwiched between the p-type regions acting as the voltage holding area, becomes low as it goes away from said p-type region.

In this embodiment, the amount of dose of the n-type regions of the voltage holding area is determined by the total AREA of the n-type regions 2x, 2 surrounded by the p-type regions. Therefore, by making the concentration of the p-type regions 2x sufficiently higher than that of the n-type regions, it is possible to correctly CONTROL the amount of n-type impurity necessary for the n-type regions of the voltage holding area mainly by the amount of impurity of the n-type regions 2x. Also, since to secure the withstanding-voltage of the periphery the concentration of the n-type regions can be reduced, even though the conventional field plate using a shallow diffusion layer such as the p-type diffusion layer 5a is used, it is possible to prevent withstanding-voltage deterioration of the periphery. Thus, it is possible to easily achieve the conditions necessary for a high withstanding-voltage and low loss functions of the active area (voltage holding area), as well as the withstanding-voltage maintenance of the periphery. To this end, it is necessary that the concentration of the n-type regions 2 of the outside of the voltage holding area be made lower by over 20% than the mean impurity concentration of the n-type regions 2, 2x acting as the voltage holding area. The other processes are the same as the production processes shown in FIGS. 4(a) to 4(c).

Figure 16:
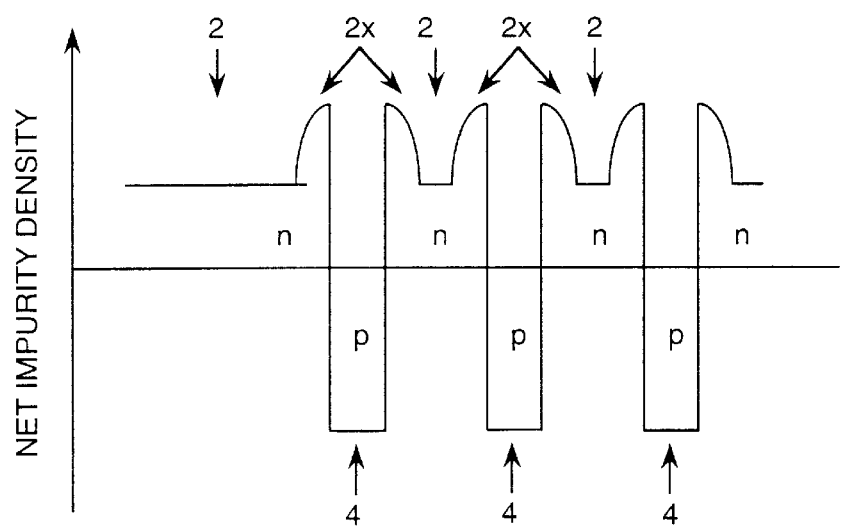
FIG. 16 is a diagram showing an impurity distribution profile of the semiconductor device of Embodiment 9.

FIG. 16 shows a net impurity distribution in this embodiment. In this embodiment, since the inside of an n-type region sandwiched by said p-type regions 4 is an n-type region 2x, the mean impurity concentration of the n-type regions 2, 2x of the voltage holding area is higher than that of the n-type regions 2 of the periphery. Stated more in detail, the impurity concentration of the n-type region, which is far from the p-type region, is lower than the impurity concentration of the vicinity of the p-type region. Incidentally, in FIG. 16, in the case where the diffusion time of the n-type diffusion layer 2x is long, or in the case where the spacing of the p-type regions is small from the beginning, the high concentration n-type diffusion layer 2x is diffused and a shape is created such that there is no n-type region of low concentration between the p-type regions, but the effect is the same.

Therefore, in this embodiment, even though there is no concentration control process for the n-type regions 2 and the n-type regions 2a, as explained with reference to FIGS. 4(a) to 4(i), by reducing the resistance so that the p-type regions 2a and n-type regions 2b as used for the voltage holding area right under the active area are in the order of approximately $1\times10^{12}/cm^2$, and by setting the resistance of the p-type regions 2 of the periphery of the semiconductor chip to a value over the degree of 20 ohms, which is equivalent to the resistance of the prior element, it is possible to prevent withstanding-voltage deterioration at the periphery. Also, even though a silicon etching groove for forming the voltage holding area of the structure of this embodiment has acute angles immediately after its formation, since due to the diffusion process thereafter the diffusion layer extends in the direction from the n-type diffusion 2b to the n-type diffusion 2a, as well as in the direction of the p-type regions 4, the comers of the junction contact face become round. As a result, electric field centralization at the corners of the etching groove is alleviated, and it is possible to easily provide a high withstanding-voltage action. Incidentally, in this embodiment, the impurity diffusion is carried out from the etching groove, and this impurity region is utilized as a part of the voltage holding area. In this embodiment, the substrate is not limited to the use on the (110) face, but even granting that it is applied to an etching groove formed by dry etching, the same effect is obtainable.

Embodiment 10

Figure 17:
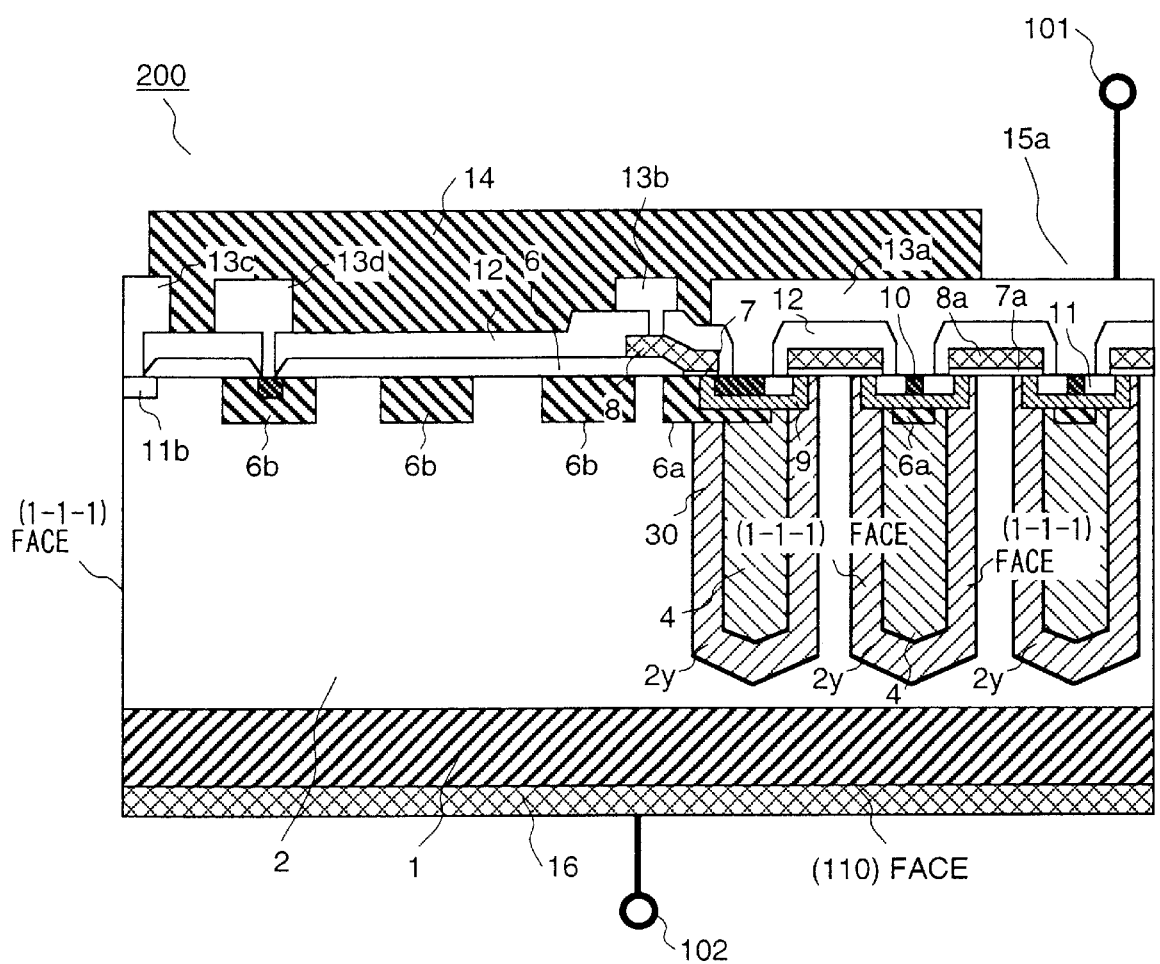
FIG. 17 is a sectional view of a semiconductor device of Embodiment 10.
Figure 18:
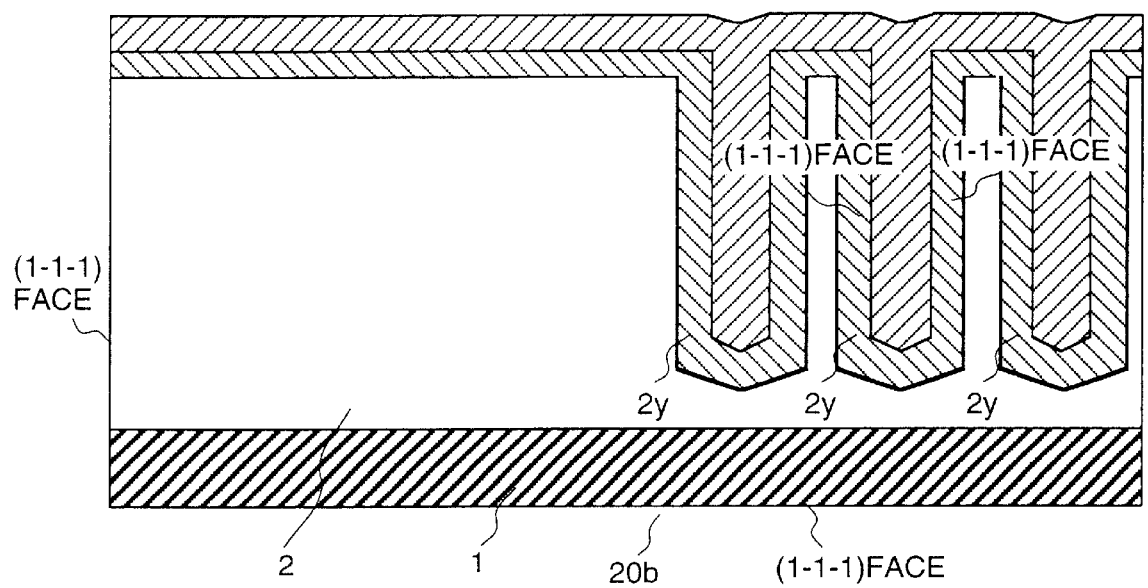
FIG. 18 is a sectional view showing a step in the method of manufacture of the semiconductor device of Embodiment 10.

FIG. 17 shows a longitudinal sectional view of the semiconductor according to this embodiment. In this embodiment, before the formation of the p-type epitaxial layer 4 as explained with reference to FIG. 4(b), as shown in FIG. 18, a p-type epitaxial layer 2y having a lower resistance than that of the p-type regions 2 is formed, and, thereafter, the p-type epitaxial layer 2y is formed.

Figure 19:
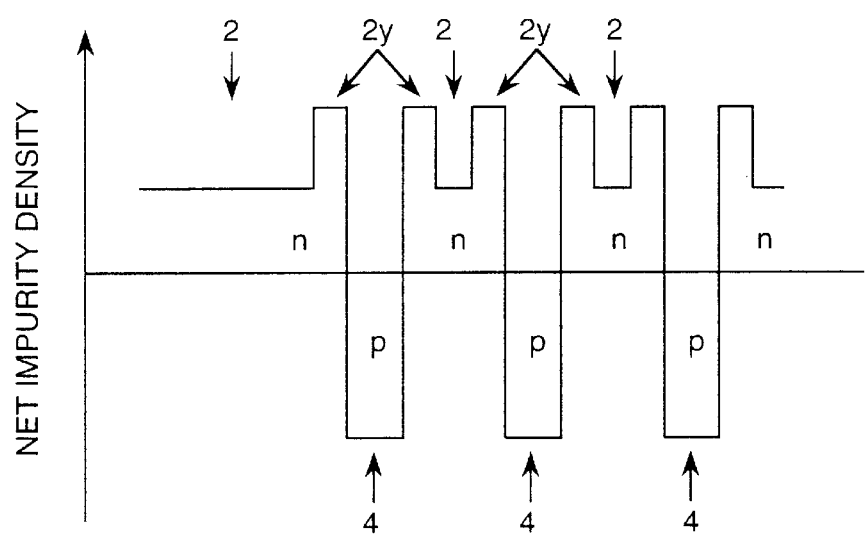
FIG. 19 is a diagram showing an impurity distribution profile of the semiconductor device of Embodiment 10.

FIG. 19 is a net impurity distribution view of this embodiment. Also in this embodiment, just like Embodiment 9, within an n-type region sandwiched by the p-type regions 4, the impurity concentration of the n-type region at the position far from the p-type region 4 is lower than the impurity concentration at the position adjacent to the p-type region.

In this embodiment, within an n-type region sandwiched by the p-type regions, the impurity concentration of the n-type region at the position far from the p-type regions 4 is equal to that of the n-type regions 2 at the periphery of the semiconductor chip, and at the position adjacent to the p-type regions 4, there is the n-type region 2 having a higher impurity concentration than that of the n-type regions 2 at the periphery of the semiconductor chip. That is, the n-type regions 2, 2x used for the voltage holding area just under the active area are adapted to have a low resistance, so that the net impurity amount thereof becomes approximately in the order of $1 \times 10^2/cm^2$, and the n-type regions 2 at the periphery of the semiconductor chip are adapted to be on the order of 20 Ω, which is the value of that of the conventional element, thereby to prevent withstanding-voltage deterioration at the periphery. Thus, also in this embodiment, it is possible to easily satisfy simultaneously the optimization of the ON resistance and withstanding-voltage conditions of the active area, as well as the condition of the security at the periphery, like Embodiment 9 shown in FIG. 14.

Incidentally, also in this embodiment, two kinds of epitaxial layers are formed within the silicon etching grooves, and these areas are utilized as a part of the voltage holding area, but in the case of this embodiment, the substrate as used is not limited to the (110) face, but it may be executed in etching grooves formed by dry etching.

Embodiment 11

Figure 20:
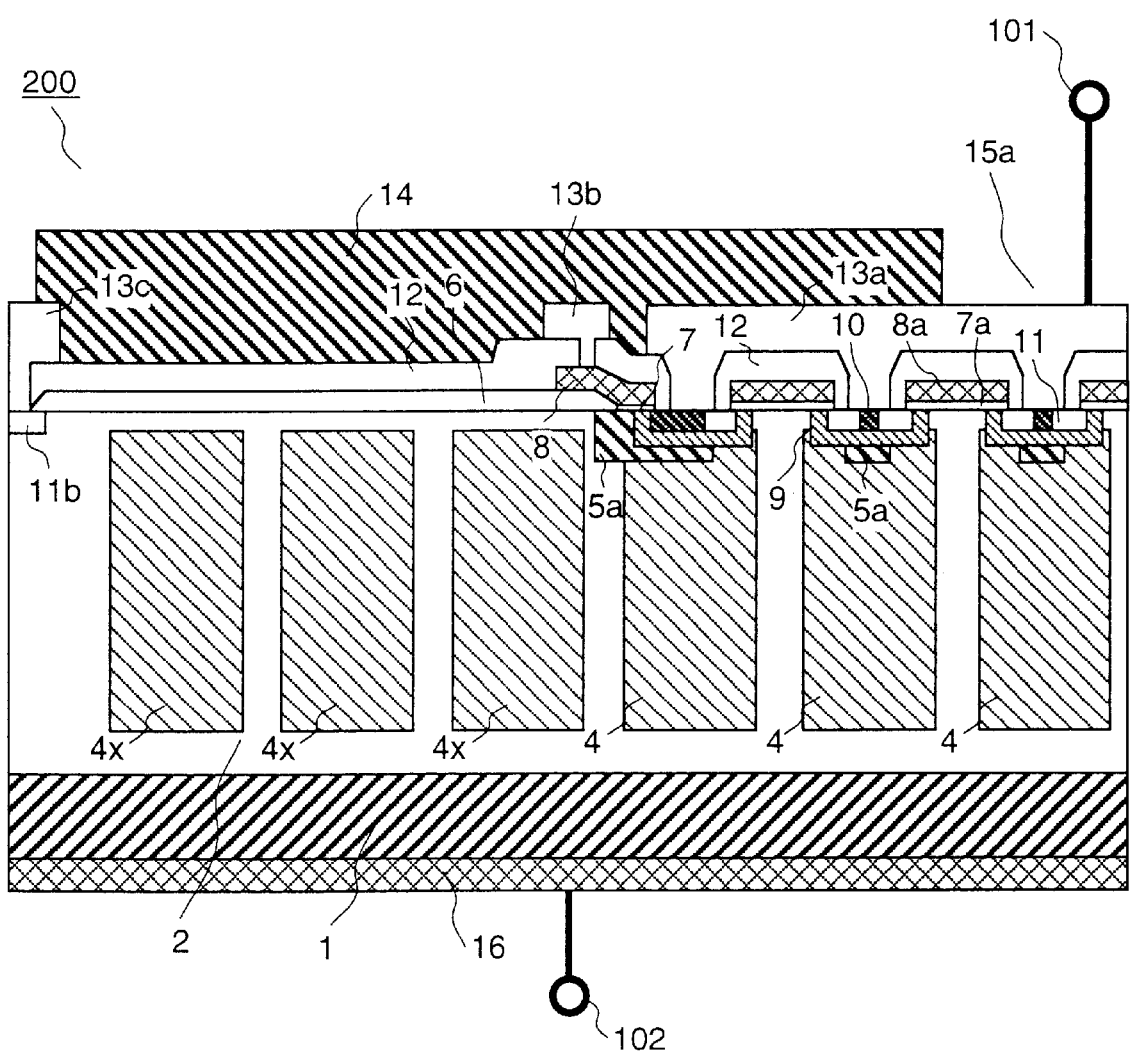
FIG. 20 is a sectional view of a semiconductor device of Embodiment 11.

FIG. 20 is a longitudinal sectional view of the semiconductor device according to this embodiment. Also, in this embodiment, just like the embodiment shown in FIG. 11, the interval of the p-type regions 4 used for the voltage holding area is made narrower than the interval of the channel diffusion layers 9, and they are formed to note reach the gate oxide film.

Further, in this embodiment, the p-type regions 4x for increasing the withstanding-voltage at the periphery are formed so that they do not contact the oxide film 6. The structure of this embodiment can be achieved in such a manner that, after the structure of FIG. 4(c) was formed by the method using etching grooves, the whole surface is doped with an n-type impurity, an additional n-type epitaxial layer is formed or the p-type buried layer shown in FIG. 11 is adapted not to be formed.

With the structure of this embodiment, since the p-type regions 4x do not receive easily the influence of a semiconductor surface charge, the withstanding-voltage at the periphery stabilizes.

Embodiment 12

Figure 21:
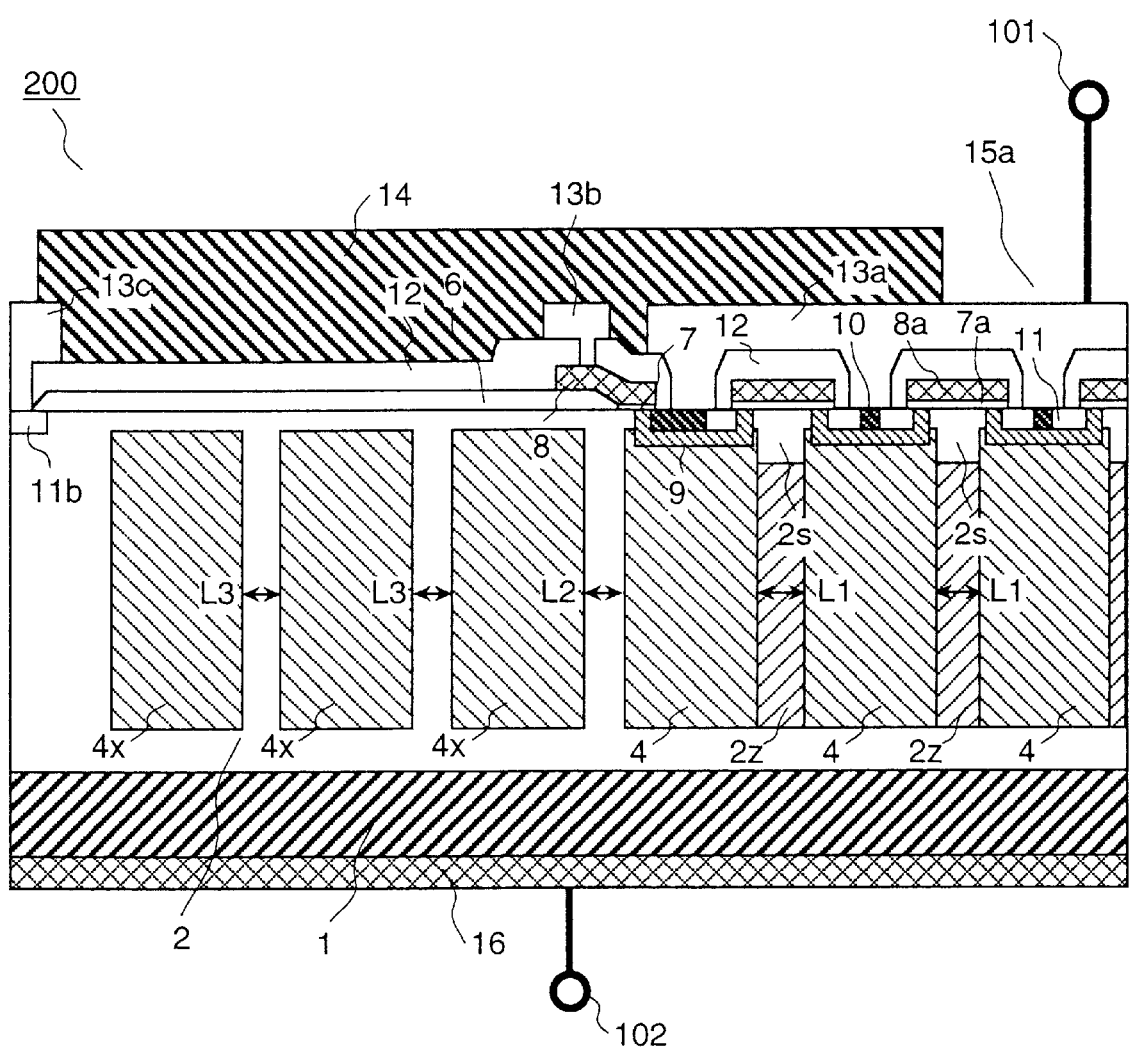
FIG. 21 is a sectional view of a semiconductor device of Embodiment 12.

FIG. 21 shows a longitudinal sectional view of the semiconductor device of the present invention. In this embodiment, the density of the n-type region 2z in the voltage holding area in the embodiment shown by FIG. 20 is made higher than the density of the n-type region 2s in between the channel diffusion layers 5. In other words, the electric field intensity is reduced by making the density of the n-type region 2s in between that of the channel diffusion layer 5 and by making the depletion layer more diffusive; and, the ON resistance and withstanding-voltage is optimized by making the density of the n-type region 2z of the voltage holding area higher. In addition, the depletion layer at the n-type region 2 between the p-type diffusion layers 4x can be extensible without forming the n-type region 2z between the p-type regions 4x on the fringe at the p-type diffusion layer 4x so defined as to establish the withstanding-voltage on the fringe when a voltage is applied to the drain terminal 102. With this configuration, in this embodiment, the pitch with which the p-type diffusion layers 4 are arranged can be made equal to the pitch with which the p-type diffusion layers 4x are arranged.

As for the implementation of the structure of this embodiment, there are several methods, for example, including the method in which the buried layers shown in FIG. 11 are used, the method in which the density of the n-type region 2z is reduced substantially by diffusing p-type impurities, such as Boron, on the principal surface of the semiconductor, and the method in which the density is made lower in advance when forming the epitaxial layer 2. In the case of this embodiment, in which there are n-type regions 2s with lower density, the pitch with which the p-type diffusion layers 4 are arranged can be made wider than the pitch with which the channel diffusion regions 9 are arranged. Accordingly, since the width of the region 2z used as the voltage holding area can be made wider, low-loss devices can be established easily. Furthermore, in case there are n-type regions 2a with lower density, what can be used is a planar structure in which the gate pattern and the pattern of the voltage holding area are formed in a striped structure and are made to cross each other. This has the object of reducing the electric field concentration between the channel diffusion regions 9 themselves.

Embodiment 13

Figure 22:
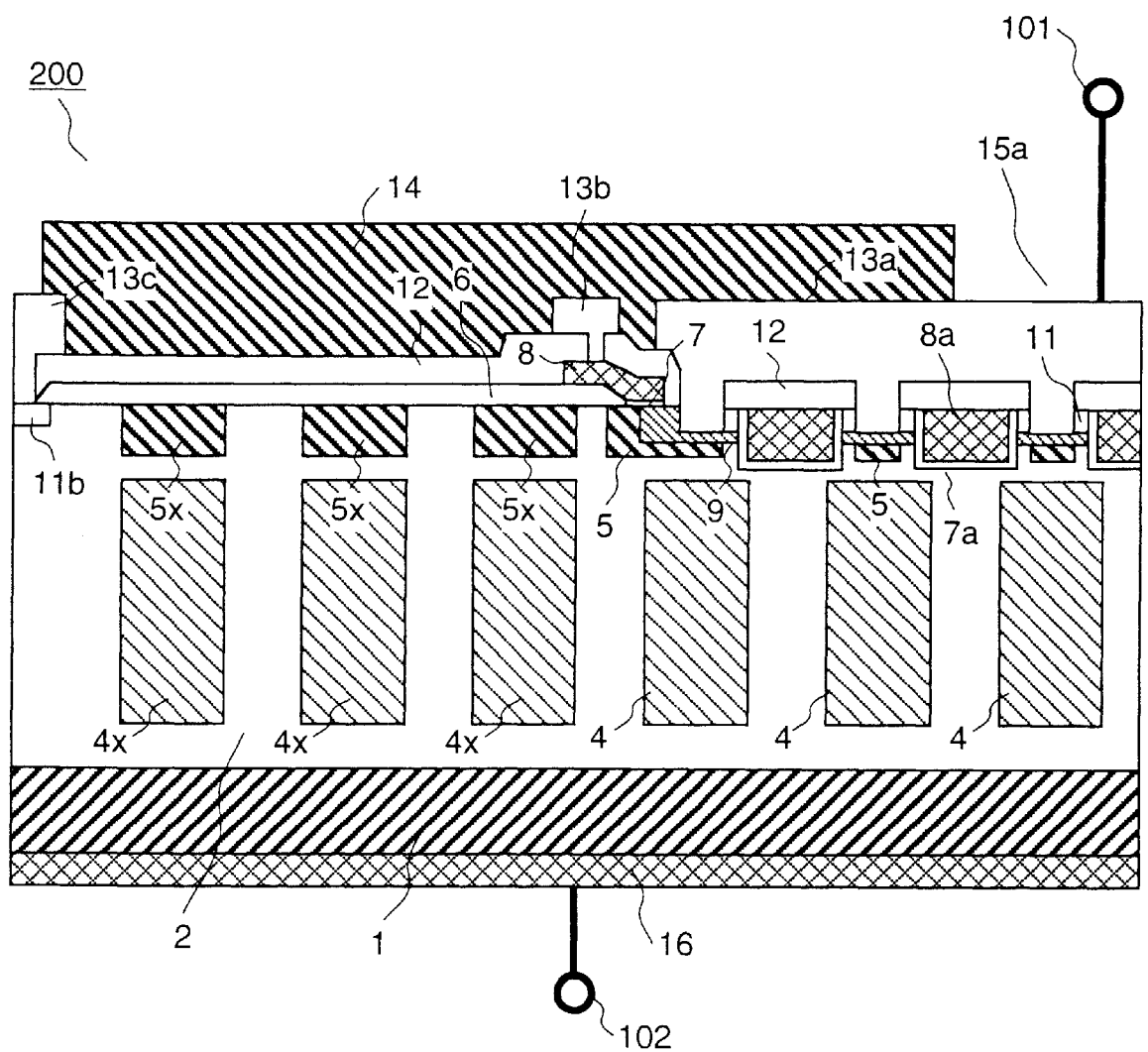
FIG. 22 is a sectional view of a semiconductor device of Embodiment 13.

FIG. 22 shows a longitudinal sectional view of the semiconductor device of the present invention. In this embodiment, in order to reduce the capacitance between the drain and the source, the p-type region 4 of the voltage holding area is spaced from the p-type diffusion layers 5 and 9 serving as the body region by 0.0 to 5 μm. With this configuration, the capacity between the drain and the source can be reduced when the electric potential difference between the drain and the source is reduced. In this embodiment, the width of the floating p-type region 4 used as the voltage holding area is made wider than the pitch with which the trench gates are arranged in order to reduce the electric field concentration at the corner of the bottom part of the trench gate, and the n-type region 2 used as the voltage holding area is formed at the area occupying more than half of the region below the trench gate, that is, the area occupying more than half of the region below the n-type region in between the channel diffusion region 9, and thus, the above described p-type region 4 is made to occupy less than half of the designated region in order to reduce the ON resistance.

Furthermore, in this embodiment, the p-type regions 4x and 5x operating as the field limiting region in order to prevent the deterioration of the withstanding-voltage at the fringe are formed separately, and thus, those regions are separated in the longitudinal direction (that is, the vertical direction in relation to the principal surface of the semiconductor) so as to couple to each other at the depletion layer when the reverse bias is applied.

The p-type regions 5x formed coincidently with the p-type regions 5 are arranged above the p-type regions 4x formed at the fringe in order to increase the withstanding-voltage in order to increase also the withstanding-voltage at the fringe itself. Depending on the distance between the n-type region 2 and the p-type region 4 above the p-type region 4x, the p-type region 5x may not be formed, or the p-type region 5x may be arranged so that the p-type 4x may reach the oxide film 6.

Embodiment 14

Figure 23:
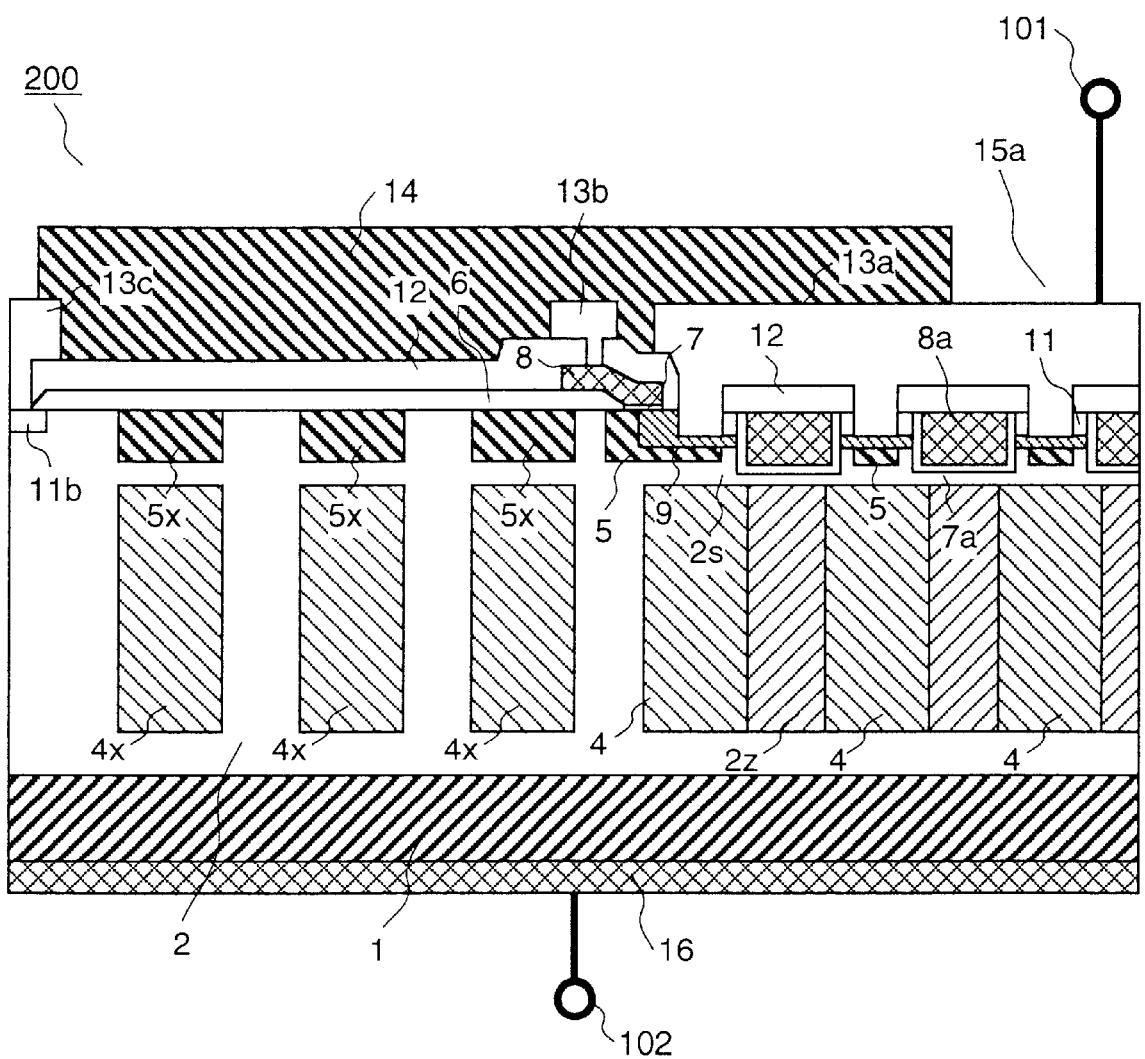
FIG. 23 is a sectional view of a semiconductor device of Embodiment 14.

FIG. 23 shows a longitudinal sectional view of the semiconductor device of the present invention. In this embodiment, the gate is a trench gate which is formed so as to be embedded through the gate oxide film formed in the trench ditch formed on the principal surface of the semiconductor, in which the impurity density of the n-type region 2z of the voltage holding area is made higher than that of the n-type region 2s (identical to the n-type region in this embodiment) contacting the corner of the bottom of the trench gate 8a. In this embodiment, the electric field concentration at the corner of the trench gate which causes the deterioration of the drain withstanding-voltage and reduces the reliability of the gate oxide film can be prevented, and the ON resistance can be reduced as well.

Embodiment 15

Figure 24:
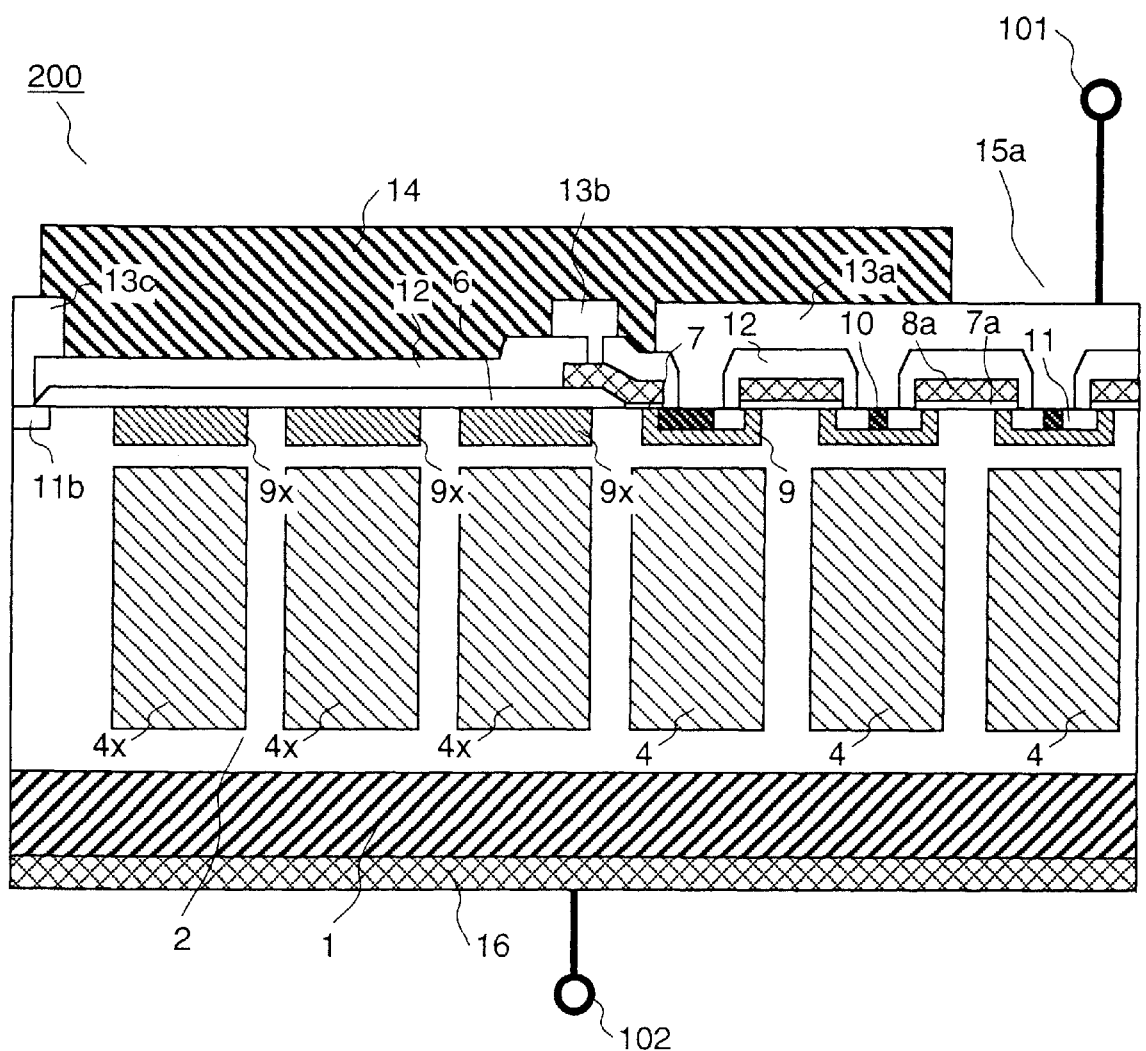
FIG. 24 is a sectional view of a semiconductor device of Embodiment 15.

FIG. 24 shows a longitudinal sectional view of the semiconductor device of the present invention. The difference between this embodiment and the embodiment shown in FIG. 22 is that the gate is in the form of a trench structure or a planar structure. Though the loss component in the channel diffusion region of the MOS FET in this embodiment is higher than the case shown in FIG. 2 in the embodiment 1, the processing cost is advantageously lower in the planar structure of this embodiment in case the resistance component contributed by the channel diffusion region is lower. In this embodiment, by making the pitch of the floating n-type region 4 used as the voltage holding area narrower than the pitch of the channel diffusion layers 9, the electric field concentration at the corner of the bottom of the channel diffusion layer 9 can be prevented. With this configuration, the withstanding-voltage and the reliability of the gate oxide film can be increased. Though this effect is also valid for silicon semiconductor devices, this effect is especially larger for silicon carbide (SiC) in which the depletion layer is less diffusive into the semiconductor layer than it is in a silicon semiconductor. In addition, the half or larger portion of the n-type region surrounded by the p-type channel diffusion region 9 is the n-type region 2. With this configuration, the reduction of the ON resistance is not sacrificed by the p-type region 4. Furthermore, the half or larger portion of the p-type region surrounded by the p-type channel diffusion region 9 is the p-type region 4. With this configuration, the cross zone between the p-type channel diffusion region 9 and the p-type region 4 is larger, so that the withstanding-voltage will not be reduced even if the p-type region 4 is floating.

Embodiment 16

Figure 25:
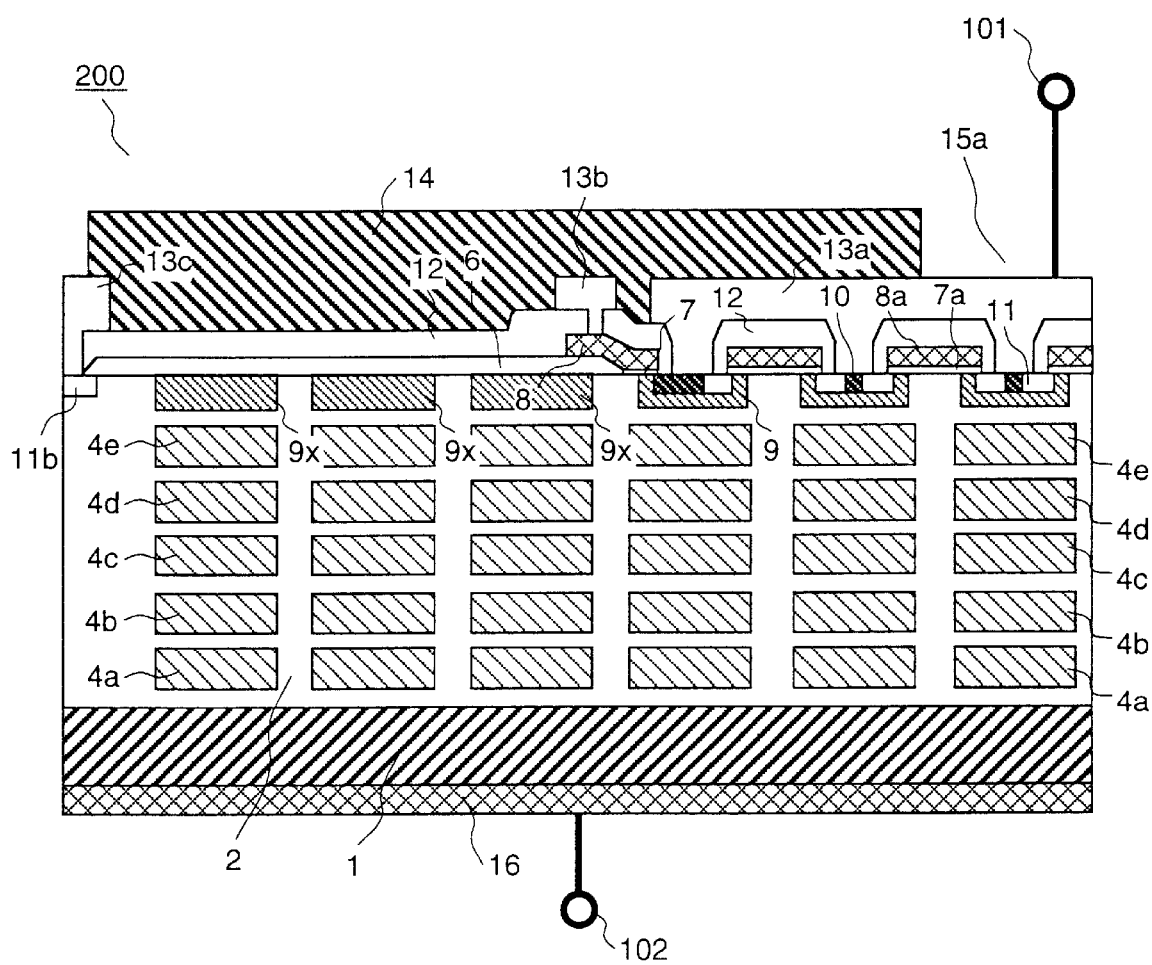
FIG. 25 is a sectional view of a semiconductor device of Embodiment 16.

FIG. 25 shows a longitudinal sectional view of the semiconductor device of the present invention. This embodiment provides a field plate effect in the longitudinal direction by means such that the p-type regions 4a to 4e to be used as the voltage holding areas are decomposed into pieces. The higher withstanding-voltage is established also in this embodiment even without forming the p-type regions 4a to 4e as depletion regions. Even if the number of p-type regions 4a to 4e which are buried layers is small, the thickness of the n-type epitaxial layer 2 can be made larger. Owing to this configuration, a higher withstanding-voltage can be obtained with a smaller number of p-type formations of the epitaxial layer.

Embodiment 17

Figure 26:
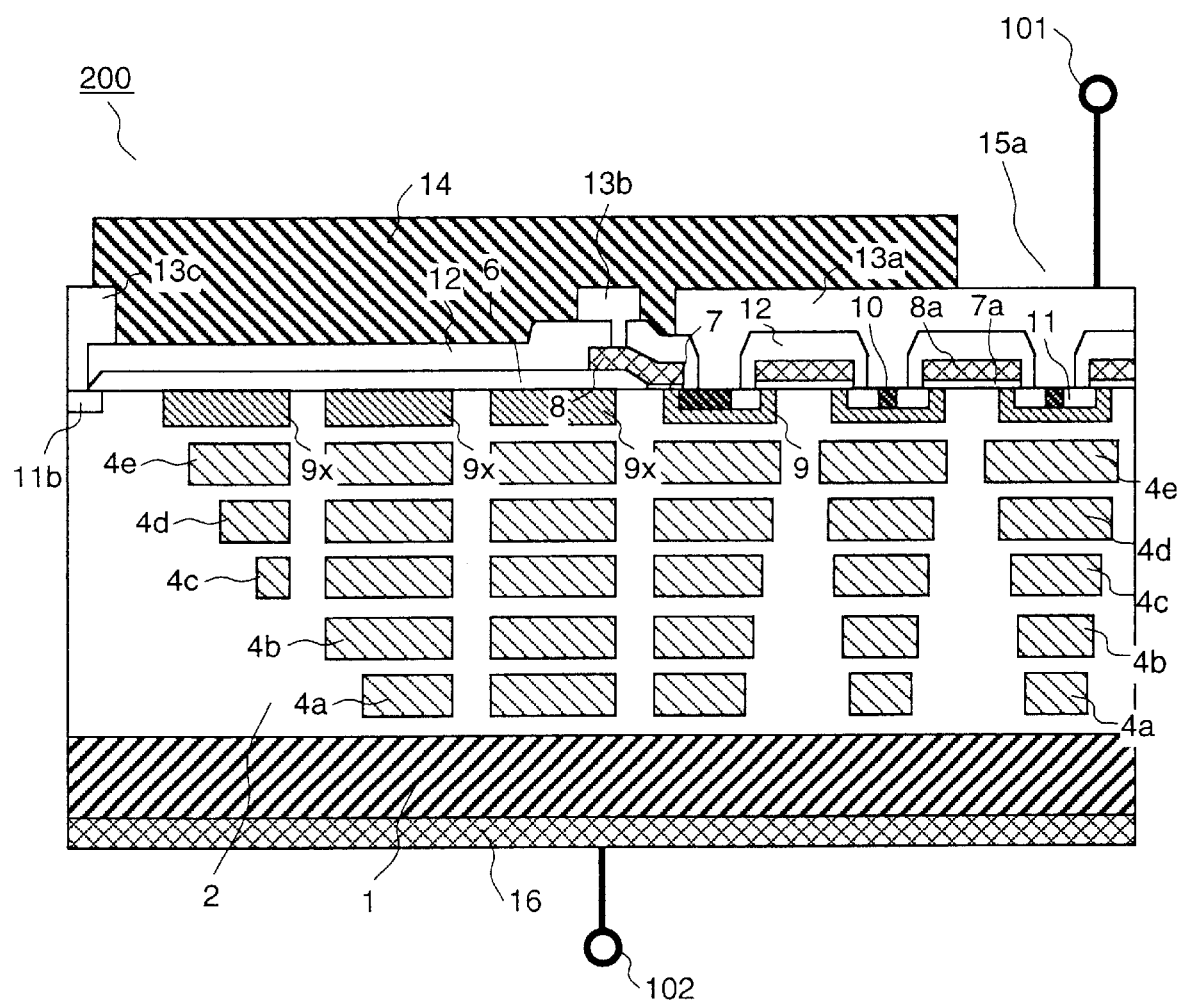
FIG. 26 is a sectional view of a semiconductor device of Embodiment 17.

FIG. 26 shows a sectional view of the semiconductor device of the present invention. In this embodiment, a higher withstanding-voltage and a reduced loss can be obtained by altering the arrangement of the p-type regions 4a to 4e used as the voltage holding areas. In other words, the ON resistance is reduced by increasing the area of the n-type region of the active region toward the drain terminal, and the p-type regions 4a to 4e are moved behind into the inside of the device toward the bottom of the regions so that the curvature of the depletion layer may be larger in the fringe.

The reduced loss is obtained by forming the n-type region 2 below the gate so that its width may increase toward its bottom. In addition, The reduced loss and reduced ON resistance can be established by means such that the p-region in the fringe are not formed below toward the fringe so that the curvature of the depletion layer formed between the n-type region 2 and the p-type regions 4a to 4e may be larger.

Embodiment 18

Figure 27:
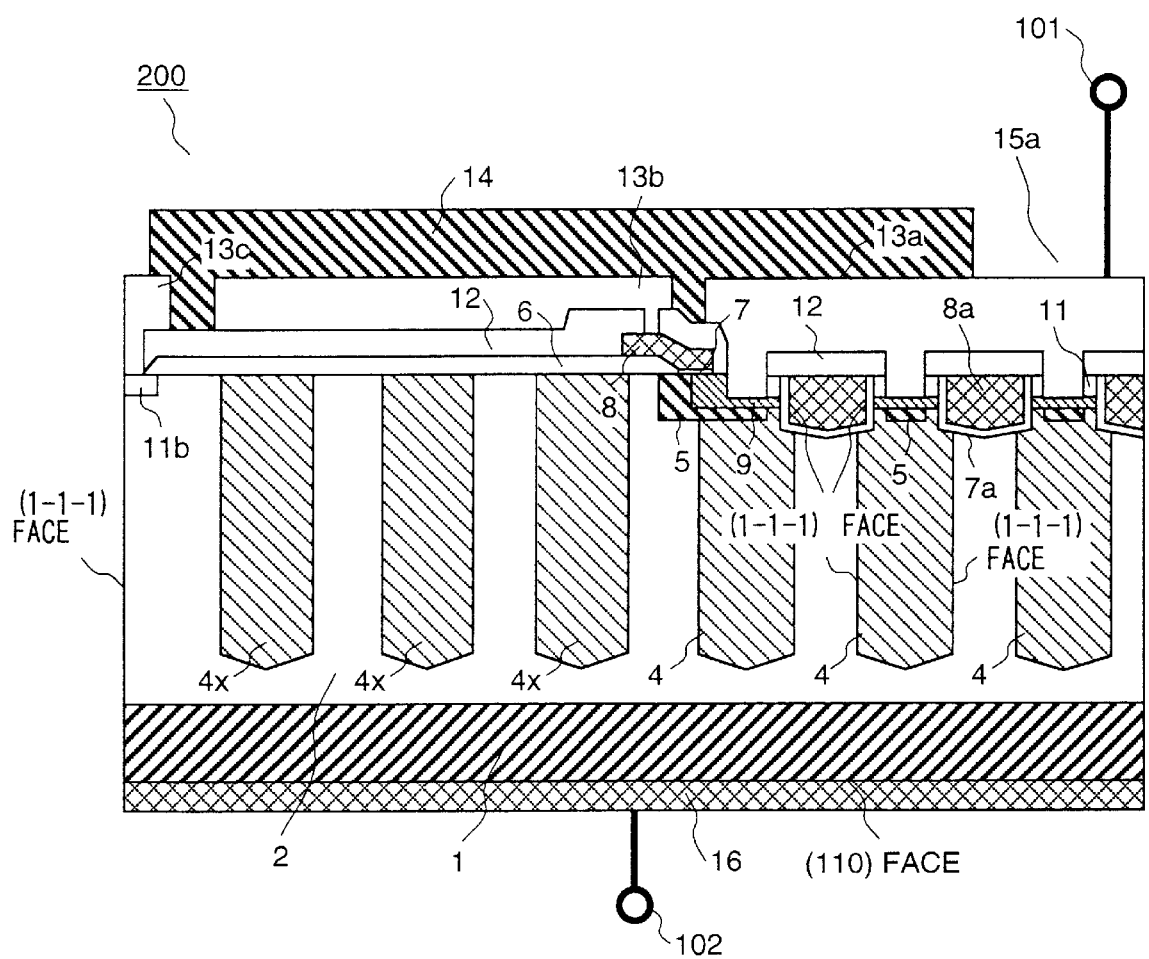
FIG. 27 is a sectional view of a semiconductor device of Embodiment 18.

FIG. 27 shows a longitudinal sectional view of the semiconductor device of the present invention. In this embodiment, the electric potential of the gate electrode is made to extend to the fringe with the aluminum electrode 13b. In this case, since the aluminum electrode 13b shields the electrode, formed at the upper layers above the field limiting region 4x, and its electric potential, it can be appreciated that the electric field at the interface between the semiconductor region and the oxide film region is stabilized and that a higher withstanding-voltage is obtained more easily. Though the aluminum electrode 3 is connected to the gate electrode and is used as the gate field plate, similar effect can be obtained by connecting the aluminum electrode 13b to the source electrode and forming the source field plate with it.

Embodiment 19

Figure 28:
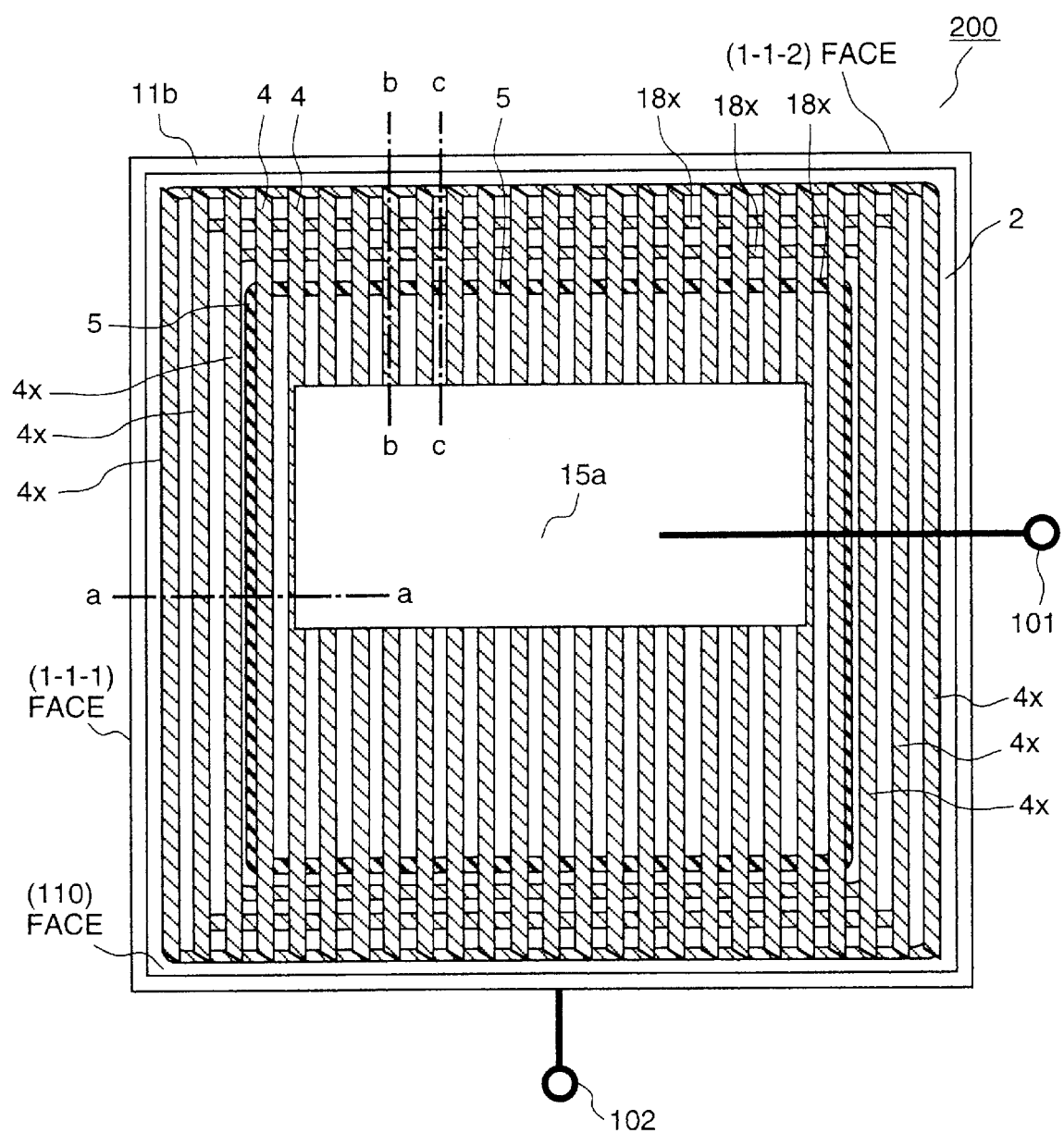
FIG. 28 is a plan view of a semiconductor device of Embodiment 19.
Figure 29:
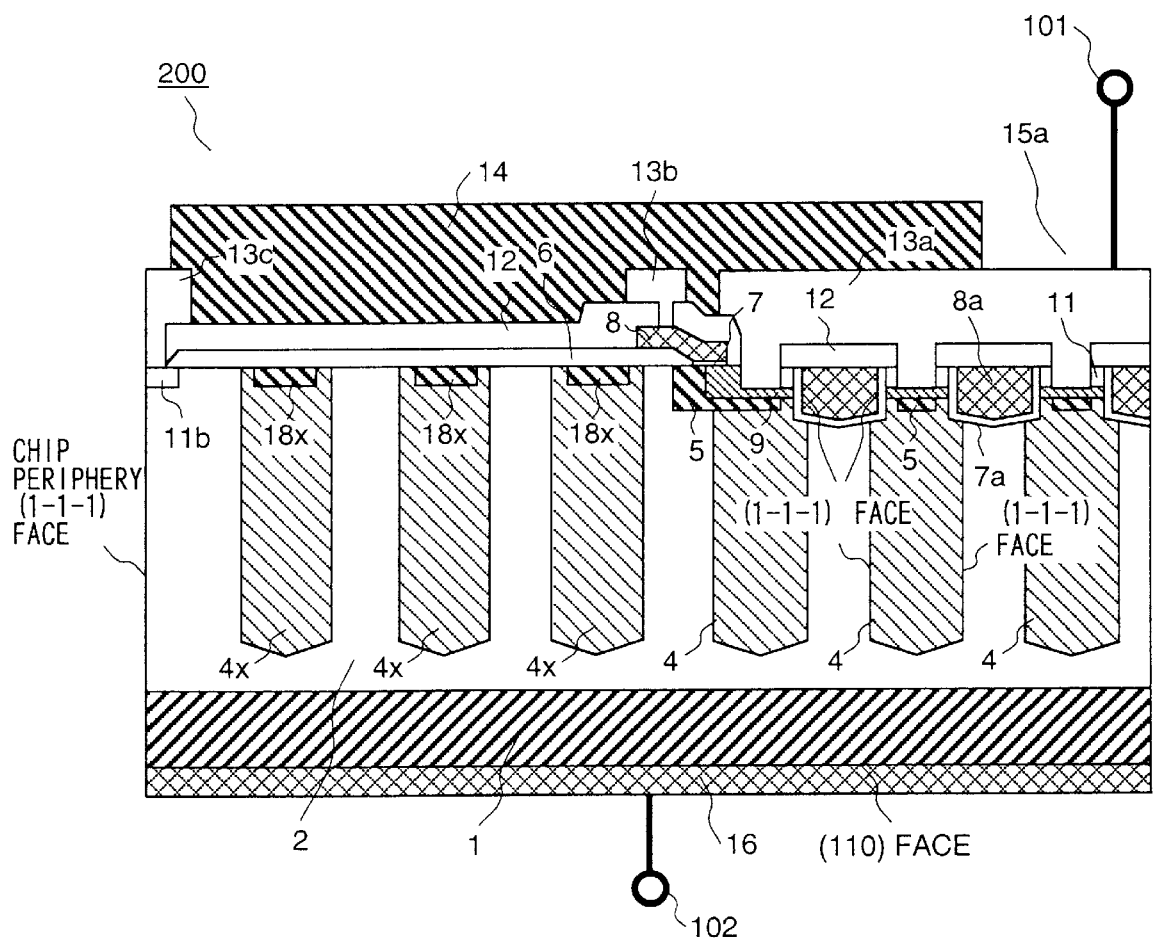
FIG. 29 is a sectional view of a semiconductor device of Embodiment 19.
Figure 30:
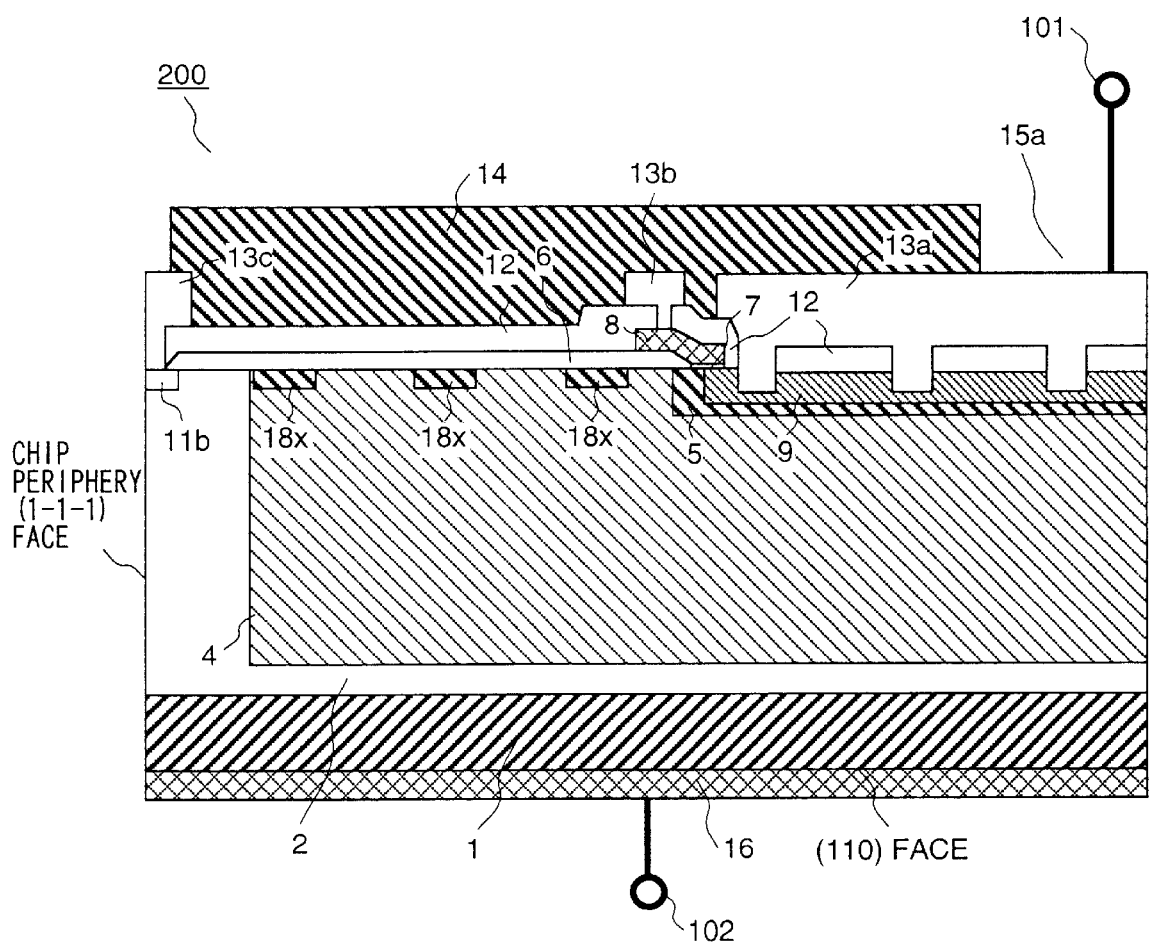
FIG. 30 is a sectional view of a semiconductor device of Embodiment 19.
Figure 31:
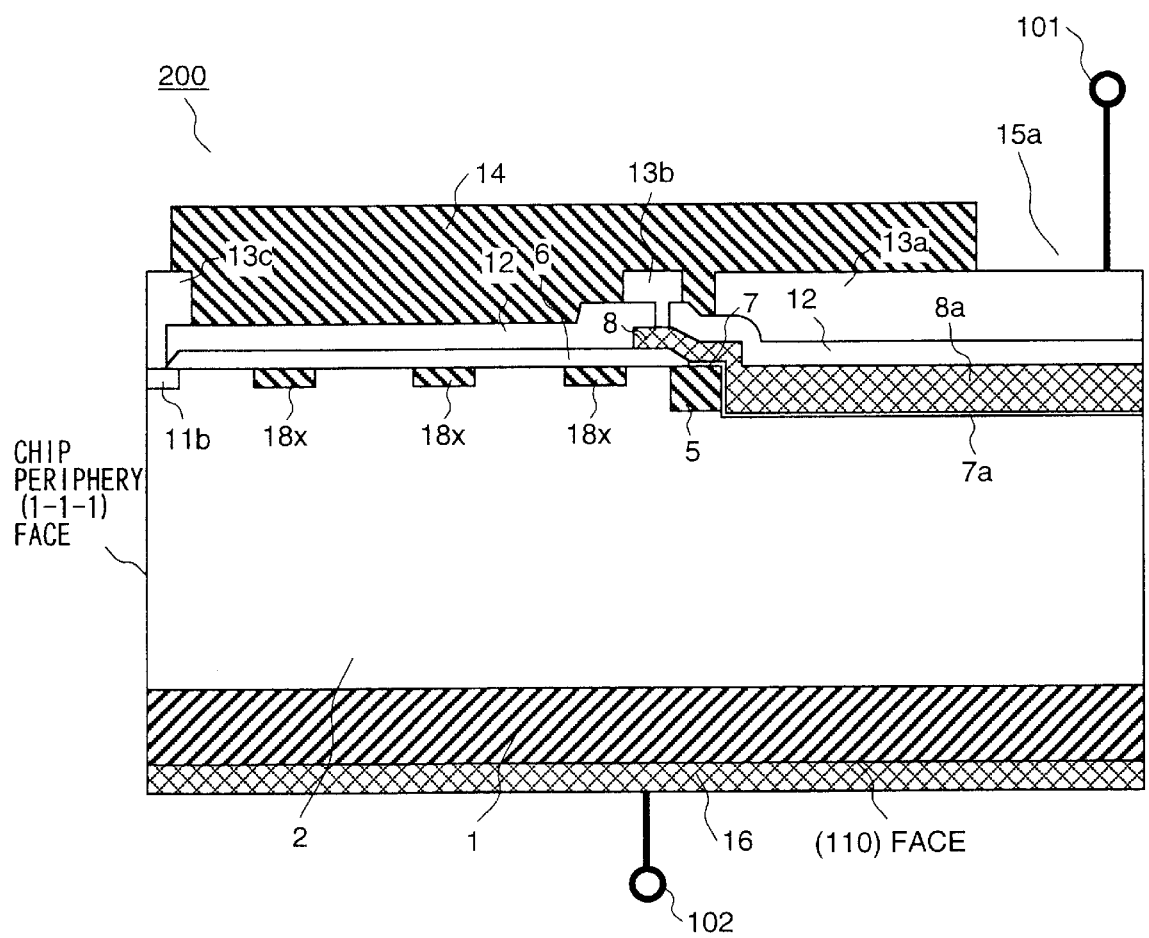
FIG. 31 is a sectional view of a semiconductor device of Embodiment 19.

FIG. 28 shows a plan view of the semiconductor device of the present invention. FIGS. 29 to 31 are sectional views taken along lines a—a, b—b and c—c, respectively, in FIG. 28. In this embodiment, the p-type regions 18x are formed with a circular geometry on the surface of the semiconductor at the fringe of the active region so as to contact the p-type regions 4 and 4x at the fringe. Thus, though the relative position between the p-type regions 4x themselves and the sizes of the p-type region 4x and the p-type region 4 should be considered in the embodiment shown in FIG. 1, in which the p-type regions 4x are formed as floating field limiting regions, the depletion layers are more extensible in the n-type region 2 enclosed by the p-type region 4x in this embodiment because the electric potential of the p-type region 4 is applied directly to the p-type region 4x through the p-type region 18x. Accordingly, a higher withstanding-voltage is obtained even if the pitch with which the p-type regions 4 are arranged is equal to the pitch with which the p-type regions 4 are arranged.

Though the p-type regions 18x are formed with a circular geometry enclosing the active area so that the equipotential lines formed between the terminal 101 and the terminal 102 may be developed uniformly, the p-type regions 18x may be arranged at necessary positions in order to connect the p-type region 4 and the p-type region 4x. And furthermore, a higher withstanding-voltage can be obtained more easily by making the density of the p-type regions 18x smaller, which will cause the depletion layers to be more likely to develop extensively.

Embodiment 20

Figure 32:
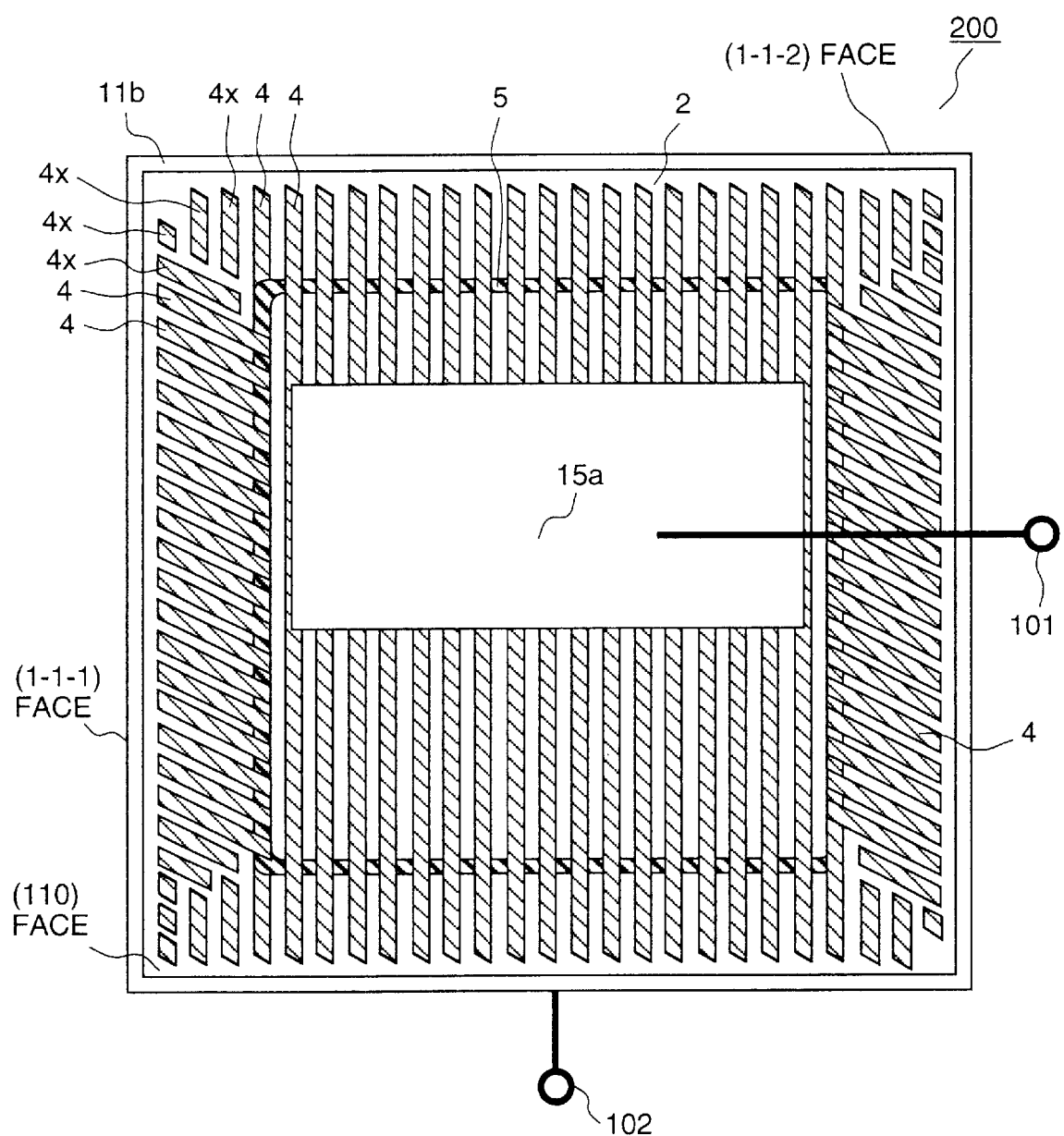
FIG. 32 is a plan view of a semiconductor device of Embodiment 20.

FIG. 32 shows a plan view of the semiconductor device of the present invention. Though the p-type diffusion layers 4x formed in a floating structure are used at the left and right sides of the fringe in order to establish enough withstanding-voltage at the fringe in the embodiment shown by FIG. 1, the terminal 101 is made to connect to the p-type region 4 extending in the left and right directions by the p-type diffusion layer 5, which can be formed without silicon etching ditches, and the stripe patterns for the p-type region 4 and the n-type region are also developed from the voltage holding area for the left and right sides of the fringe in a similar manner to the upper and lower sides of the fringe, which leads to a higher withstanding-voltage. In this embodiment, the p-type diffusion layers 4x formed in a floating structure are used at the corners of the semiconductor chips.

In a case in which a dry etching processing is used for forming the p-type region 4, as the constraints for the arrangement of the p-type regions 4 are relaxed, the p-type regions 4 can be formed so that their lines extending in the vertical direction may be orthogonal to their lines extending in the horizontal direction. As the electric potential distribution at the fringe is uniformized, a higher withstanding-voltage can be established easily by combining the p-type diffusion layers 18x arranged with a circular geometry as shown in the embodiment 19 with this embodiment.

Embodiment 21

Figure 33:
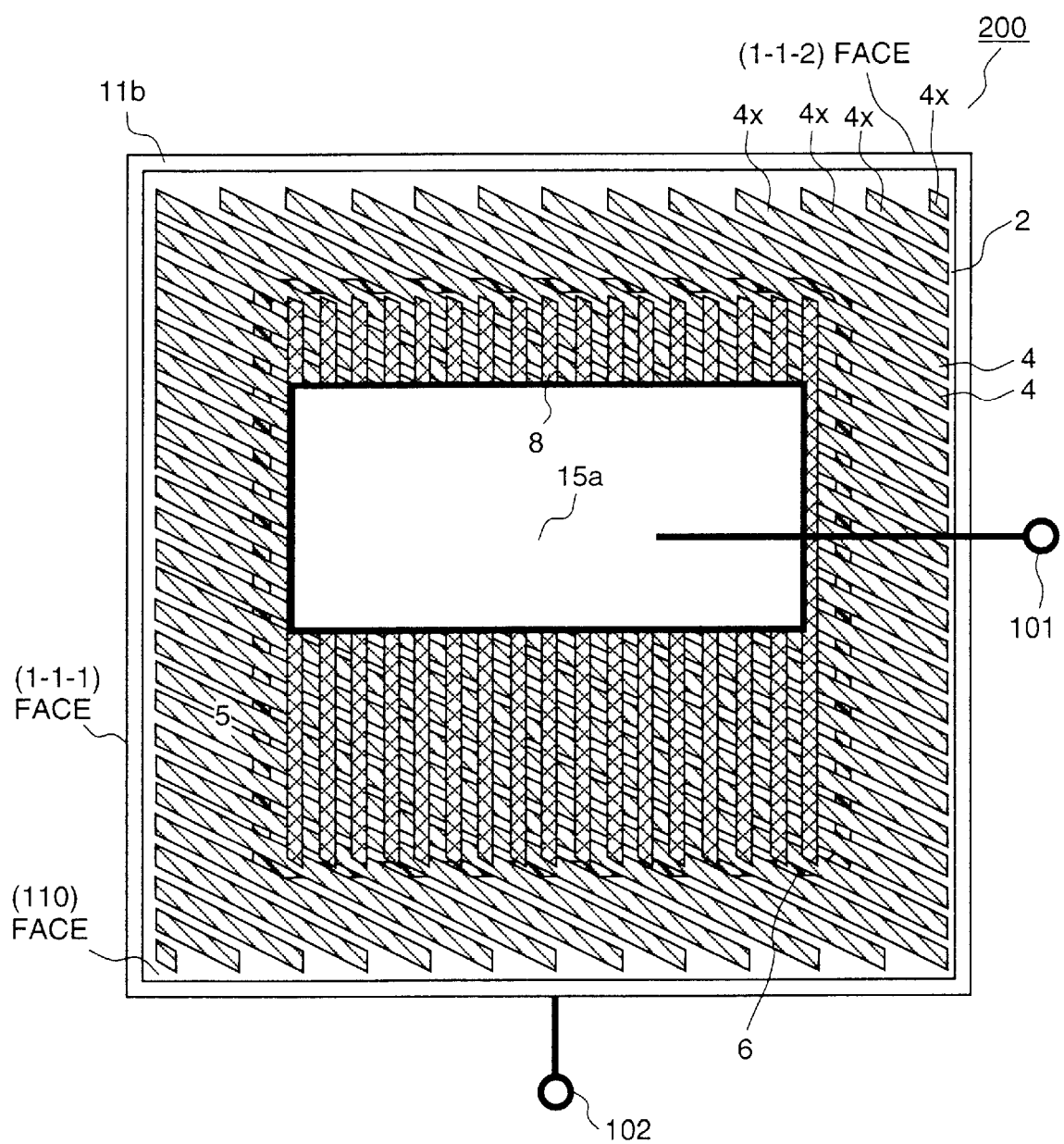
FIG. 33 is a plan view of a semiconductor device of Embodiment 21.

FIG. 33 shows a plan view of the semiconductor device of the present invention. In this embodiment, the stripe pattern of the p-type region 4 and the n-type region 2 forming the voltage holding area are made to intersect with the trench gate pattern formed with polycrystalline silicon by approximately 0.5°. With this configuration, the pitch of the trench gate pattern of the p-type region 4 and the n-type region 2 forming the voltage holding area and the pitch of the trench gate pattern can be determined independently. Since the p-type region 4 forming the voltage holding area and the trench gate pattern made of polycrystalline silicon are formed by an anisotropic etching process in this embodiment, the angle of their crossed axes becomes approximately 70.5°, that is, a slant angle other than 90°±5°. The (111) surface perpendicular to the (110) surface is defined as a principal contact surface for the wide wall of the trench ditch of the gate. Other aspects are similar to those in the embodiment 1. Since the electric potential distribution at the fringe is uniformized, a higher withstanding-voltage can be established easily by combining the p-type diffusion layers 18x arranged with a circular geometry shown in the embodiment 19 with this embodiment.

Embodiment 22

Figure 34:
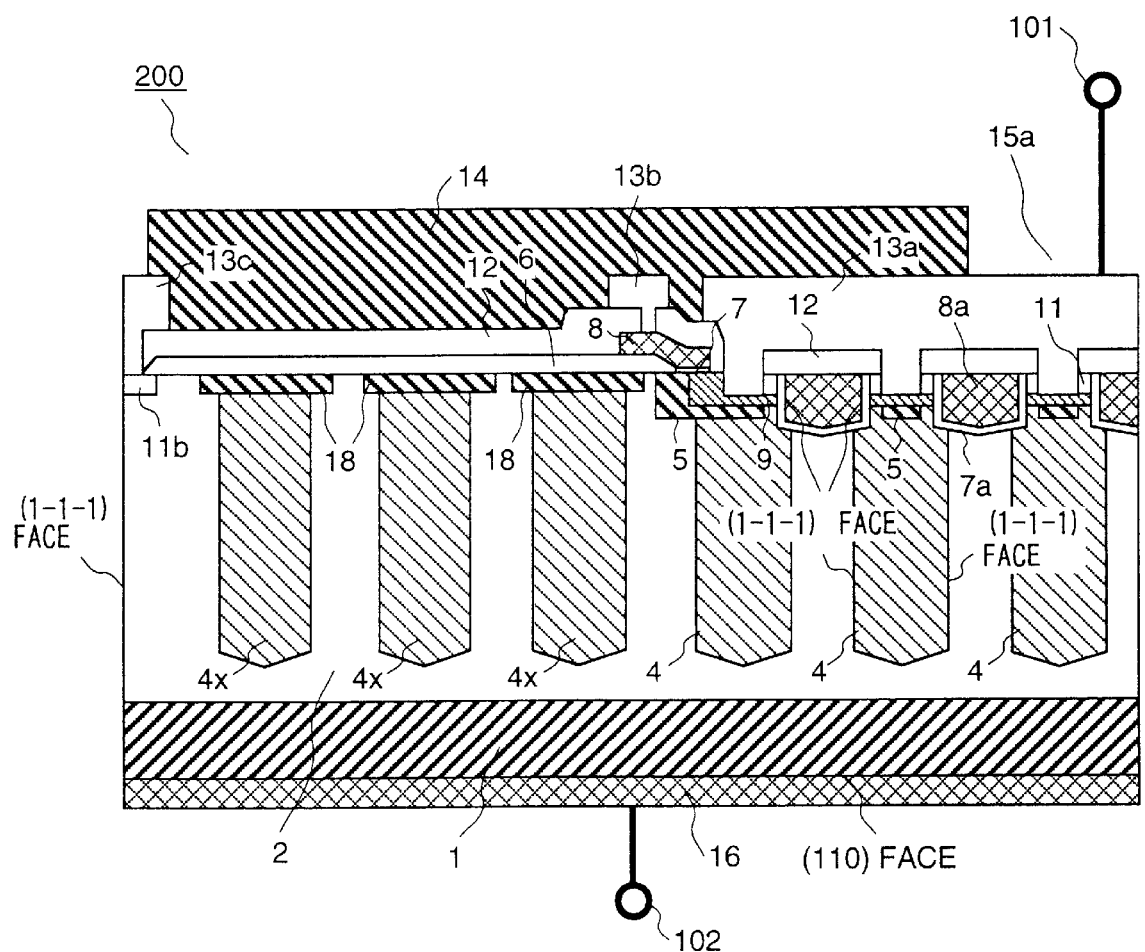
FIG. 34 is a sectional view of a semiconductor device of Embodiment 22.

FIG. 34 shows a plan view of the semiconductor device of the present invention. In this embodiment, the p-type diffusion layer 18 is added on the semiconductor surfaces between the p-type regions 4x themselves operating as the field limiting regions without direct electrical connection to the terminal 101, or between the p-type region 4x operating as the field limiting region and the p-type region 4x operating as the field limiting region and the p-type region 4 operating as the voltage holding area with direct electric connection to the terminal 101, and thus the effective distance between them is made shorter.

In this embodiment, as the transmission of voltage through the depletion layer from the p-type region 4 to the p-type region 4x is even so long as the pitch for the p-type regions 4 and the pitch for the p-type regions 4x, both formed by etching process, are made identical to each other and the density of the n-type region 2 formed between them is made uniform, the n-type region 2 and the p-type regions 4 and 4x tend to be depleted easily, and thus, a higher withstanding-voltage can be achieved. Therefore, to the extent the process conditions allow, the pitch with which the p-type regions 4 are arranged can be minimized. Accordingly, since the ON resistance can be reduced with a designated withstanding-voltage condition, the layout design work can be made easier. In this embodiment, the lower the density of the p-type diffusion layer 18, the more the p-type diffusion layer 18 tends to be easily depleted, and hence, a higher withstanding-voltage can be achieved more easily. In addition, as the p-type diffusion layer 18 is formed in the semiconductor, the effective distance between the p-type regions themselves can be easily made shorter. The same effect as brought about by the p-type diffusion layer 18 can be provided by ion implantation at the areas spaced from the surface of the semiconductor or by forming embedding layers.

Other aspects are similar to those in the embodiment 1. As the electric potential distribution at the fringe is uniformized, a higher withstanding-voltage can be established easily by combining the p-type diffusion layers 18x arranged with a circular geometry, as provided in the embodiment 19, with this embodiment. The p-type diffusion layers 18x and 18 may be formed by an identical process.

Embodiment 23

Figure 35:
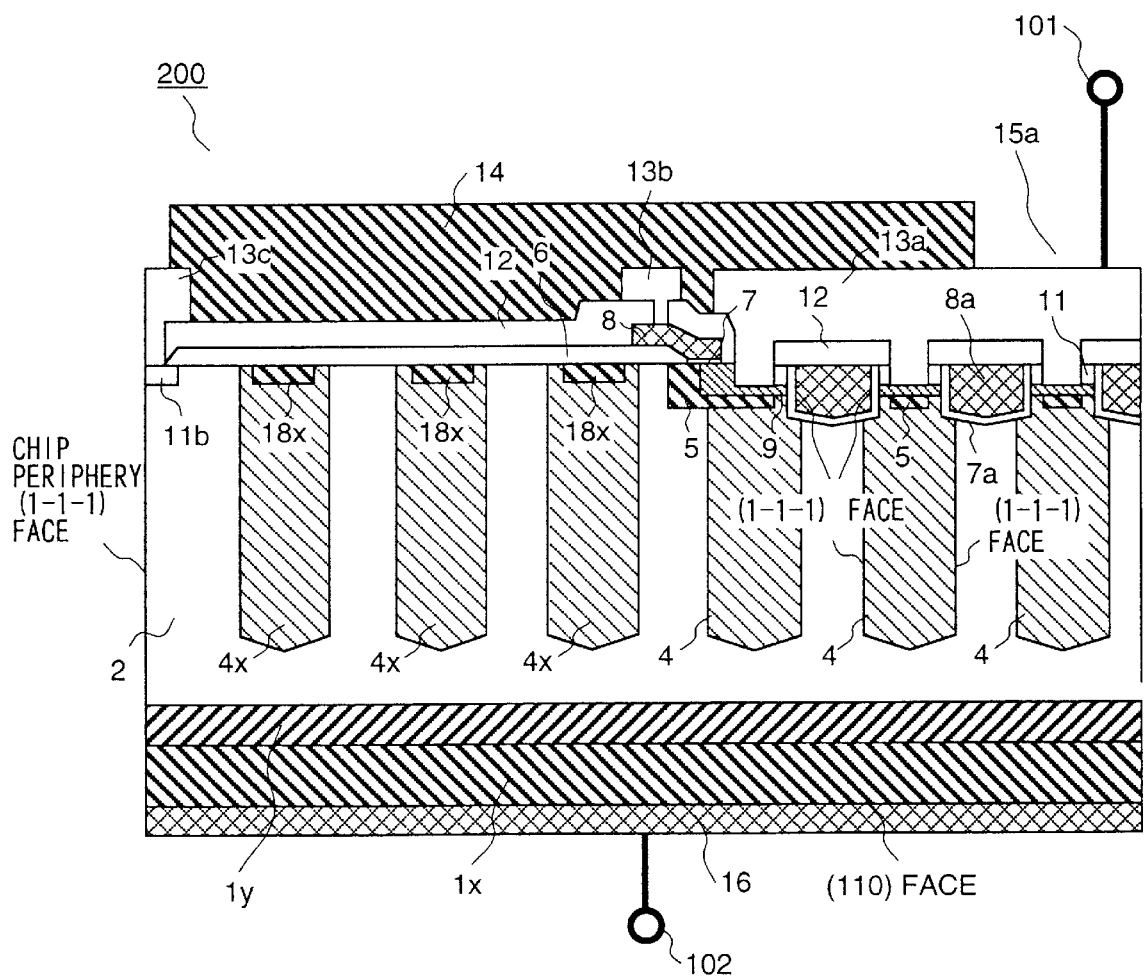
FIG. 35 is a sectional view of a semiconductor device of Embodiment 23.

FIG. 35 shows a sectional view of the semiconductor device of the present invention. In this embodiment, the n-type region 1y is formed for limiting the injection of the minority carriers from the high-density p-type substrate 1x to the n-type region 2. The planar structure of the semiconductor device in this embodiment is the same as that shown in FIG. 28, and its sectional view corresponds to FIG. 29. For the case of an IGBT, the first terminal 101 for the source terminal of the power MOS FET and the second terminal for the drain terminal of the power MOS FET are treated as the emitter terminal and the collector terminal, both of the IGBT, respectively. It is required to increase the withstanding-voltage between the n-type base region 3 and the p-type base region 4 in order to increase the collector-emitter withstanding-voltage for the IGBT, and it is required to reduce the resistance of the n-type base (n-type region 2) in order to make the loss of the IGBT lower. Thus, in order to increase the collector-emitter withstanding-voltage of the IGBT, as well as make the IGBT low-loss, it is preferable to form the n-type base region 2 and the p-type base regions 4 as voltage holding areas as in the case of a power MOS FET. Accordingly, by applying the structure of the present invention disclosed in the embodiments 1 to 23 to an IGBT, a higher withstanding-voltage, a low loss, a low cost and a low capacitance can be established.

In this embodiment, the net impurities per unit area on the n-type regions 2 and 1y between the high-density p-type substrate 1x and the p-type region 4 is made half or more of the net impurities per unit area on the n-type region 2 enclosed by the p-type region 4. Since it is required to design the distance between the high density p-type substrate 1x and the p-type region 4 to be extremely shorter than the distance between the p-type base region and the p-type collector region, the withstanding-voltage characteristics tend to fluctuate in a case that the overall device withstanding-voltage is determined by the punch-through withstanding-voltage between the high density p-type substrate 1x and the p-type region 4, which leads to undesirable characteristics.

In this embodiment, since the collector withstanding-voltage of this semiconductor device is not determined by the punch-through withstanding-voltage between the high density p-type substrate 1x and the p-type region 4, the variance in the collector withstanding-voltage gets smaller. In case the uniform density n-type region 2 is used for the n-type base without forming the above described n-type region y, the distance between the p-type region 4 and the p-type region 1x is made half or more of the pitch with which the p-type regions 4 are arranged.

Embodiment 24

Figure 36:
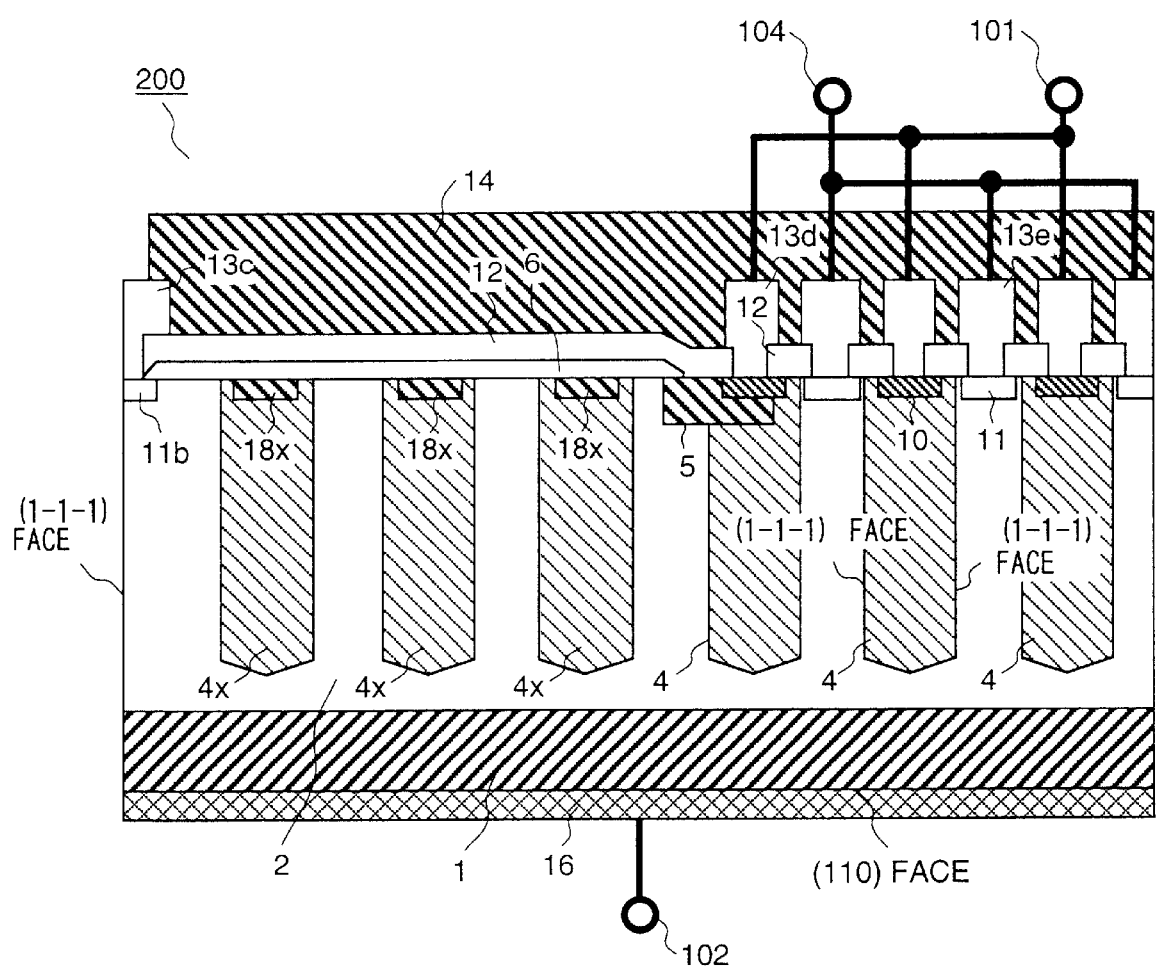
FIG. 36 is a sectional view of a semiconductor device of Embodiment 24.

FIG. 36 shows a sectional view of the semiconductor device of the present invention. This embodiment is an example suitable especially for a SIT. The planar structure of the semiconductor device in this embodiment is the same as that shown in FIG. 28. For the case of a SIT, the first terminal 101 for the source terminal of the power MOS FET and the second terminal for the drain terminal of the power MOS FET are treated as the gate terminal and the drain terminal, both of the SIT, respectively. It is required to increase the drain-gate withstanding-voltage in order to increase the drain-gate withstanding-voltage for the SIT, and it is required to reduce the resistance of the n-region 2 in order to make the loss of the SIT lower. In order to increase the drain-gate withstanding-voltage of the SIT, as well as to make the SIT low-loss, it is preferable to form the repetitive pattern of the n-type base region 2 and the p-type base regions 4 as voltage holding areas with lower resistance and narrower pitch, as in the case with a power MOS FET. Accordingly, by applying the structure of the present invention disclosed in the embodiments 1 to 23 to a SIT, a higher withstanding-voltage, a low loss, a low cost and a low capacitance can be established.

Embodiment 25

Figure 37:
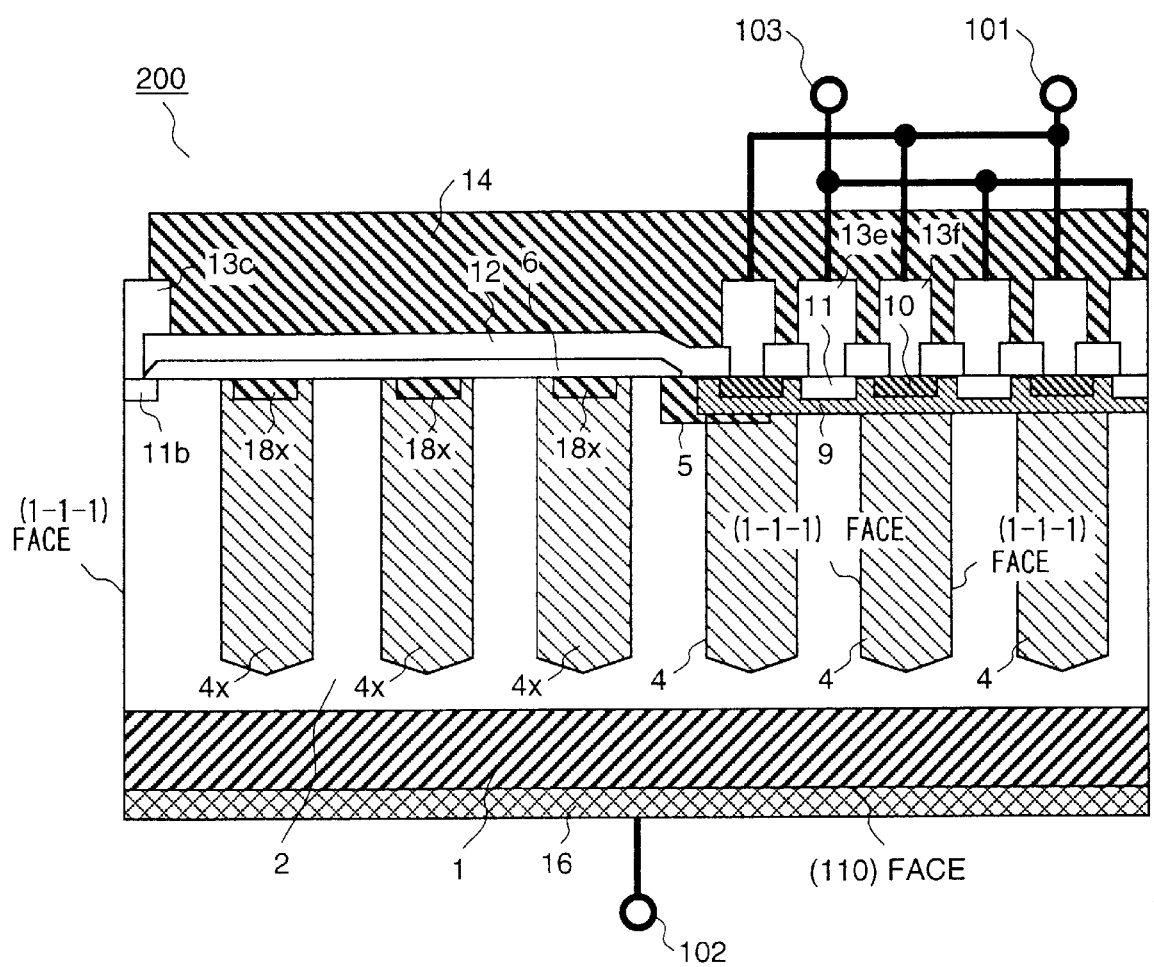
FIG. 37 is a sectional view of a semiconductor device of Embodiment 25.

FIG. 37 shows a sectional view of the semiconductor device of the present invention. This embodiment is an example of a bipolar transistor in which the n-type region 11 is used for the emitter region, the p-type region 9 is used for the base region and the n-type region 2 is used for the collector region. For the case of bipolar transistors, the first terminal 101 used as the source terminal in the embodiment for the power MOS FET is treated as the base terminal, and its second terminal 102 used as the drain terminal is treated as the collector terminal. The terminal 103 is the emitter terminal. The components 13f and 13e are aluminum electrodes for the base terminal and the emitter terminal. The higher withstanding-voltage for the overall device is achieved by the extensive development of the depletion regions in the base region 4 and the collector region 2 serving as the voltage holding areas when the voltage is applied between the base terminal and the collector terminal. Since the density of the n-type region 2 can be made higher than that of the conventional devices in a manner similar to the case for a power MOS FET, low loss devices can be established. Since the withstanding-voltage between the collector and the base can be made higher, the withstanding-voltage between the emitter and the collector can be increased at the same time. Accordingly, in this embodiment, the structures of the semiconductor device described in the previous embodiments related to the power MOS FET and the effects brought about by those structures can be applied to the case for bipolar transistors.

Alternately, in case that there is not an n-type diffusion layer 11 and a terminal 103, which corresponds to the case of a high withstanding-voltage PN junction diode, by translating the first terminal 1 as the anode terminal and the second terminal as the cathode terminal, the structures of the semiconductor device described in the previous embodiments related to the power MOS FET and the effects brought by those structures can be applied to the case for PN junction diodes.

Embodiment 26

Figure 38:
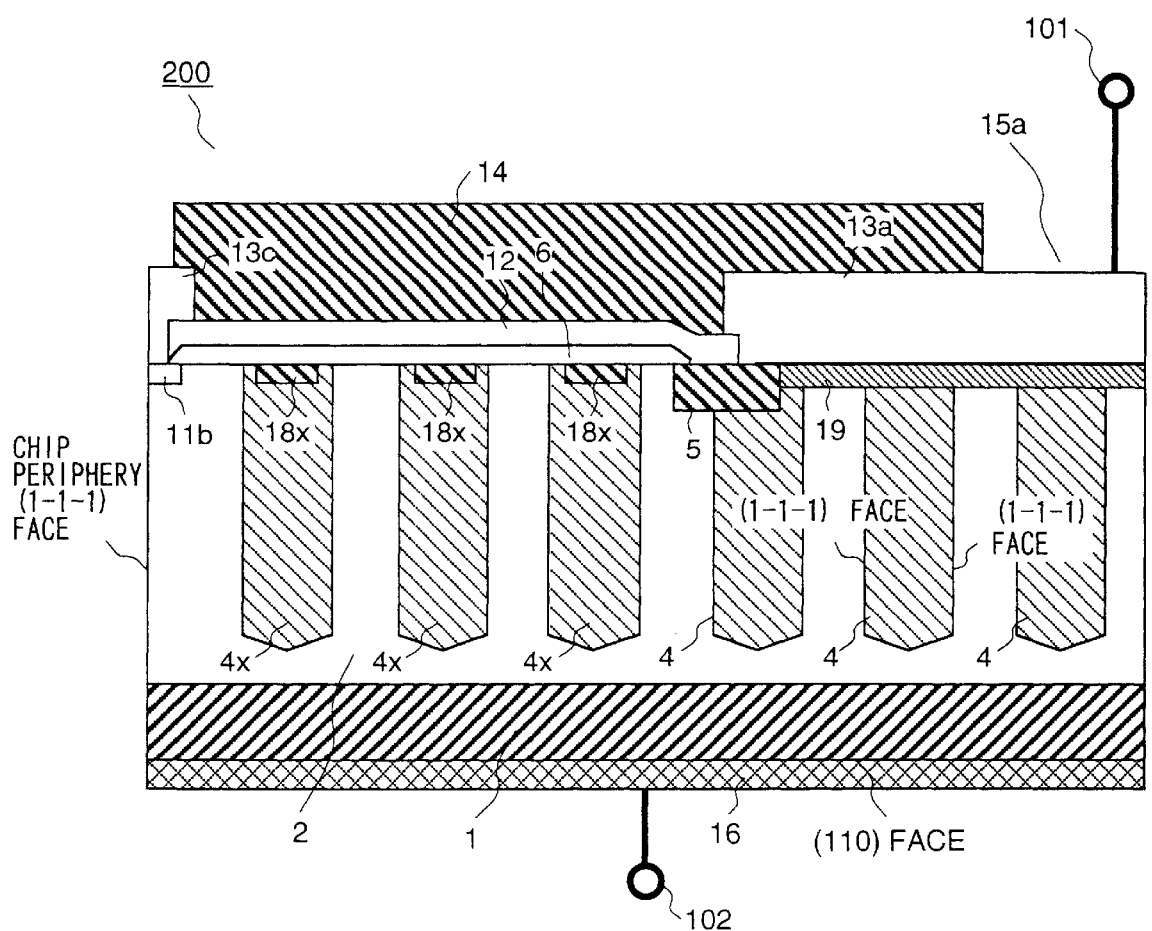
FIG. 38 is a sectional view of a semiconductor device of Embodiment 26.

FIG. 38 shows a sectional view of the semiconductor device of the present invention. This embodiment is an example suitable especially for a Schottky diode. In this embodiment, the terminal 101 is employed as the anode terminal and the terminal 102 is employed as the cathode terminal, in which a Schottky junction with the electrode for the anode terminal is defined, and the p-type region 4 operating as the voltage holding area is defined within a 5 $\mu$m range from the Schottky junction and the n-type diffusion layer 19. The components 13d and 18e are aluminum electrodes for the gate terminal and the source terminal, respectively. When a reverse bias is applied between the anode terminal of the terminal 101 and the cathode terminal of the terminal 102, since the p-type region 4 operating as the voltage holding area and the Schottky junction are coupled electrically to each other, a high withstanding-voltage is provided for the voltage applied between those terminals owing to the p-type region 4 and the n-type region 2, both operating as voltage holding areas. The Schottky junction operates when the forward bias is applied between the anode terminal of the terminal 101 and the cathode terminal of the terminal 102, in which the overall device loss is reduced owing to the diode current flowing into the n-type region 2 with lower resistance and operating as the voltage holding area. Alternately, in case the p-type region 4 serving as the voltage holding area is implemented by using embedding layers as described with reference to the embodiment shown by FIG. 11, the epitaxial layer 2 can be used for the above described n-type diffusion layer 11.

Accordingly, in a manner similar to the embodiments for the case of a power MOS FET shown by FIGS. 22, 23 and 24, in which the floating p-type region 4 operates as the voltage holding area, a higher withstanding-voltage, a low loss, a low cost and a low capacitance for the semiconductor device can be also established in this embodiment.

What is claimed is:

1. A semiconductor device which obstructs current flow between a first terminal and a second terminal by forming a space-charge area extending through a part of a semiconductor chip when a voltage is impressed between said first terminal and said second terminal:

wherein the substrate main face of said semiconductor chip is positioned on the (110) face, a couple of opposed side edges out of four side edges of said semiconductor chip are positioned on the {111} face perpendicular to the (110) face, and a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein the boundary between said first regions of the first conduction type and said second regions of the second conduction type has the shape extending in the [110] axis direction; and wherein positive and negative space-charge regions are formed arranged alternately in said voltage holding area comprised of said first regions of the first conduction type and said second regions of the second conduction type when the current flow between said first terminal and said second terminal is obstructed.

2. A semiconductor device which obstructs current flow between a first terminal and a second terminal by forming a space-charge area extending through a part of a semiconductor chip when a voltage is impressed between said first terminal and said second terminal:

wherein the substrate main face of said semiconductor chip is positioned on the (110) face, and a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein the boundary between said first regions of the first conduction type and said second regions of the second conduction type has the shape extending in the [110] axis direction with the main contact face of the {111} face perpendicular to the (110) face; and wherein positive and negative space-charge regions are formed arranged alternately in said voltage holding area comprised of said first regions of the first conduction type and said second regions of the second conduction type when the current flow between said first terminal and said second terminal is obstructed.

3. A semiconductor device which obstructs current flow between a first terminal and a second terminal by forming a space-charge area extending through a part of a semiconductor chip when a voltage is impressed between the first terminal and the second terminal:

wherein a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein third region of the first conduction type is formed in the external of said voltage holding area, said third regions of the first conduction type having the mean impurity concentration which is lower above 20% than the mean net impurity concentration of said first regions of the first conduction type;

wherein at least one fourth region of the second conduction type is formed within said third region of the first conduction type, and means is included for providing high withstanding-voltage by reducing electric field centralization at the external of said voltage holding area for the space-charge area extending from said second regions of the second conduction type reaching said fourth region of the second conduction type in case where reverse bias is applied between said first terminal and said second terminal; and wherein positive and negative space-charge regions are formed arranged alternately in said voltage holding area comprised of said first regions of the first conduction type and said second regions of the second conduction type when the current flow between said first terminal and said second terminal is obstructed.

4. A semiconductor device which obstructs current flow between a first terminal and a second terminal by forming a space-charge area extending through a part of a semiconductor chip when a voltage is impressed between the first terminal and the second terminal:

wherein a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein the main parts within said first regions of the first conduction type sandwiched by said second regions of the second conduction type are formed so that the impurity concentration becomes low as they back away from said second regions of the second conduction type; and wherein positive and negative space-charge regions are formed arranged alternately in said voltage holding area comprised of said first regions of the first conduction type and said second regions of the second conduction type when the current flow between said first terminal and said second terminal is obstructed.

5. A semiconductor device which obstructs current flow between a first terminal and a second terminal by forming a space-charge area extending through a part of a semiconductor chip when a voltage is impressed between the first terminal and the second terminal:

wherein a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein third region of the first conduction type is formed in the external of said voltage holding area;

wherein at least one fourth region of the second conduction type is formed within said third region of the first conduction type;

said third regions of the first conduction type having the mean impurity concentration which is lower above 20% than the mean net impurity concentration of said first regions of the first conduction type;

wherein means is included for providing high withstanding-voltage by reducing electric field centralization at the external of said voltage holding area for the space-charge area extending from said second regions of the second conduction type reaching said fourth region of the second conduction type in case where reverse bias is applied between said first terminal and said second terminal;

wherein the amount of net impurity per a unit area of said third region of the first conduction type surrounded by said fourth regions of the second conduction type is made lower over 20% than the amount of net impurity per the unit area of the first region of the first conduction type surrounded by said second regions of the second conduction type; and wherein positive and negative space-charge regions are formed arranged alternately in said voltage holding area comprised of said first regions of the first conduction type and said second regions of the second conduction type when the current flow between said first terminal and said second terminal is obstructed.

6. A semiconductor device which obstructs current flow between a first terminal and a second terminal by forming a space-charge area extending through a part of a semiconductor chip when a voltage is impressed between the first terminal and the second terminal:

wherein a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein third region of the first conduction type is formed in the external of said voltage holding area;

wherein at least one fourth region of the second conduction type is formed within said third region of the first conduction type;

wherein the spacing between two adjacent fourth regions of the second conduction type is made narrower over 20% than the spacing between two adjacent second regions of the second conduction type;

wherein means is included for providing high withstanding-voltage by reducing electric field centralization at the external of said voltage holding area for the space-charge area extending from said second regions of the second conduction type reaching said fourth region of the second conduction type in case where reverse bias is applied between said first terminal and said second terminal; and wherein positive and negative space-charge regions are formed arranged alternately in said voltage holding area comprised of said first regions of the first conduction type and said second regions of the second conduction type when the current flow between said first terminal and said second terminal is obstructed.

7. A semiconductor device which obstructs current flow between a first terminal and a second terminal by forming a space-charge area extending through a part of a semiconductor chip when a voltage is impressed between the first terminal and the second terminal:

wherein a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein third region of the first conduction type is formed in the external of said voltage holding area;

wherein a fourth region of the second conduction type is formed within said third region of the first conduction type, the length of said fourth region of the second conduction type is greater over ⅔ than the length of said first region of the first conduction type;

wherein the spacing between two adjacent fourth regions of the second conduction type is made narrower over 20% than the spacing between two adjacent second regions of the second conduction type;

wherein means is included for providing high withstanding-voltage by reducing electric field centralization at the external of said voltage holding area for the space-charge area extending from said second regions of the second conduction type reaching said fourth region of the second conduction type in case where reverse bias is applied between said first terminal and said second terminal; and wherein positive and negative space-charge regions are formed arranged alternately in said voltage holding area comprised of said first regions of the first conduction type and said second regions of the second conduction type when the current flow between said first terminal and said second terminal is obstructed.

8. A semiconductor device which obstructs current flow between a first terminal and a second terminal by forming a space-charge area extending through a part of a semiconductor chip when a voltage is impressed between the first terminal and the second terminal:

wherein a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein means is included for providing high withstanding-voltage by reducing electric field centralization at the external of said voltage holding area by extending a stripe-like arrangement comprised of said first regions of the first conduction type and said second regions of the second conduction type up to the proximity of the periphery of said semiconductor chip; and wherein positive and negative space-charge regions are formed arranged alternately in said voltage holding area comprised of said first regions of the first conduction type and said second regions of the second conduction type when the current flow between said first terminal and said second terminal is obstructed.

9. A semiconductor device which obstructs current flow between a first terminal and a second terminal by forming a space-charge area extending through a part of a semiconductor chip when a voltage is impressed between the first terminal and the second terminal:

wherein a voltage holding area is formed within said semiconductor chip, comprised of first regions of a first conduction type electrically connected to said second terminal and second regions of a second conduction type electrically connected to said first terminal, said first and second regions being arranged alternately and adjacently;

wherein the boundary between said first region of the first conduction type and said second region of the second conduction type is parallel to the path of current passing between said first terminal and said second terminal;

wherein positive and negative space-charge regions are formed arranged alternately in said voltage holding area comprised of said first regions of the first conduction type and said second regions of the second conduction type when the current flow between said first terminal and said second terminal is obstructed; and wherein the spacing of said second regions of the second conduction type is narrower than the spacing of channel regions opposing through the gate of an insulation type semiconductor device.

* * * * *